US008154909B2

(12) United States Patent
Azuma et al.

(10) Patent No.: US 8,154,909 B2
(45) Date of Patent: Apr. 10, 2012

(54) RESISTANCE VARIABLE MEMORY APPARATUS

(75) Inventors: Ryotaro Azuma, Osaka (JP); Kazuhiko Shimakawa, Osaka (JP); Satoru Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 13/165,551

(22) Filed: Jun. 21, 2011

(65) Prior Publication Data

US 2011/0249486 A1    Oct. 13, 2011

Related U.S. Application Data

(62) Division of application No. 12/602,414, filed as application No. PCT/JP2008/001214 on May 15, 2008, now Pat. No. 7,990,754.

(30) Foreign Application Priority Data

Jun. 1, 2007    (JP) .................................. 2007-146913

(51) Int. Cl.
G11C 11/00    (2006.01)
(52) U.S. Cl. .............. 365/148; 365/189.16; 365/189.11; 365/175
(58) Field of Classification Search .................. 365/148, 365/189.16, 189.11, 175
See application file for complete search history.

(56) References Cited

U.S. PATENT DOCUMENTS

| 6,831,854 | B2 | 12/2004 | Rinerson et al. | |
| 6,995,999 | B2 * | 2/2006 | Morimoto | 365/148 |
| 7,433,222 | B2 * | 10/2008 | Hosoi et al. | 365/148 |
| 7,567,118 | B2 | 7/2009 | Azuma et al. | |
| 7,580,278 | B2 | 8/2009 | Cho et al. | |
| 7,796,416 | B2 | 9/2010 | Ishihara et al. | |
| 2004/0257864 | A1 * | 12/2004 | Tamai et al. | 365/158 |
| 2005/0180216 | A1 | 8/2005 | Lowrey | |
| 2008/0170428 | A1 | 7/2008 | Kinoshita | |
| 2009/0052225 | A1 | 2/2009 | Morimoto | |
| 2009/0129140 | A1 | 5/2009 | Kawazoe et al. | |

FOREIGN PATENT DOCUMENTS

| JP | 2000-111876 | 4/2000 |
| JP | 2001-127263 | 5/2001 |
| JP | 2005-032401 | 2/2005 |
| JP | 2006-203098 | 8/2006 |
| JP | 2006-216109 | 8/2006 |
| JP | 2006-344349 | 12/2006 |
| JP | 2007-501519 | 1/2007 |
| WO | WO 2006/077747 A1 | 7/2006 |
| WO | WO 2006/082695 A1 | 8/2006 |
| WO | WO 2007/023569 A1 | 3/2007 |

* cited by examiner

Primary Examiner — Connie Yoha
(74) Attorney, Agent, or Firm — McDermott Will & Emery LLP

(57) ABSTRACT

A resistance variable memory apparatus (100) of the present invention includes a current suppressing element (116) which is connected in series with each resistance variable layer (114) and whose threshold voltage is VF, and is configured to apply a first voltage V1 to a first wire (WL) associated with a selected nonvolatile memory element, apply a second voltage V2 to a second wire (BL) associated with the selected nonvolatile memory element, apply a third voltage V3 to a first wire (WL) which is not associated with the selected nonvolatile memory element and apply a fourth voltage V4 to a second wire (BL) which is not associated with the selected memory element when writing data or reading data, wherein $V2 \leq V3 < V5$ and $V5 < V4 \leq V1$ are satisfied and $(V1-V4) < VF$ or $(V3-V2) < VF$ is satisfied when $V5=(V1+V2)/2$ is a fifth voltage V5.

4 Claims, 27 Drawing Sheets

RESISTANCE VARIABLE MEMORY APPARATUS

RELATED APPLICATIONS

This application is a Divisional of U.S. application Ser. No. 12/602,414, filed on Nov. 30, 2009 now U.S. Pat. No. 7,990,754, which is the U.S. National Phase under 35 U.S.C. §371 of International Application No. PCT/JP2008/001214, filed on May 15, 2008, which in turn claims the benefit of Japanese Application No. 2007-146913, filed on Jun. 1, 2007, the entire contents of each of which are hereby incorporated by reference.

TECHNICAL FIELD

The present invention relates to a resistance variable memory apparatus. More particularly, the present invention relates to a resistance variable memory apparatus using a nonvolatile memory element whose resistance state switches in response to electric signals applied.

BACKGROUND ART

In recent years, with advancement of semiconductor miniaturization process techniques, memory apparatuses (memories) have been remarkably developed to achieve higher densities and larger capacities. In the field of nonvolatile memory apparatuses, technical progresses of FLASH memories are remarkable, and its cost is being reduced. Especially, the cost of the FLASH memories has been reduced year by year. Under this background, systems using the FLASH memories are widely used in many fields including program storage devices to be built into home appliances or the like, data storage devices for storing data of music, images, motion pictures, etc. It is expected that the nonvolatile memory apparatuses are applicable to all fields, by further reducing the cost. The cost reduction of the conventional nonvolatile memory apparatuses is accomplished by the progresses of manufacture techniques of the FLASH memories. However, these days, it is said that there is a limitation on miniaturization of the FLASH memories using floating gates. Under the circumstances, novel nonvolatile memory apparatuses have attracted attention because of a prospect for achievement of further cell area reduction and further cost reduction. As typical novel nonvolatile memory apparatuses, there are FeRAM using ferroelectric, MRAM using magnetism, PRAM using phase change, ReRAM which is a resistance variable memory apparatus, etc.

In manufacture of memory elements (resistance variable elements) of the resistance variable memory apparatuses, a resistance variable material having binary based transition metal oxide or perovskite oxide is used for a resistance variable layer. The resistance variable element is adapted to store data in a nonvolatile manner based on electric resistances (e.g., high-resistance state and low-resistance state) of the resistance variable layer. The bias condition for causing the resistance variable layer to switch the resistance state is varied according to the resistance variable material. For example, there is known a bipolar type resistance variable material which causes switching between two values by changing a direction of the electric pulse applied to both sides of the resistance variable layer. Also, there is known a unipolar type resistance variable material which causes switching between two values based on difference in the magnitude (voltage) or pulse duration (time) of the electric pulse having the same polarity. For example, Patent document 1 discloses a resistance variable memory apparatus using the unipolar type resistance variable material and a unidirectional diode.

Patent document 2 discloses a cross-point resistance variable memory apparatus using the bipolar type resistance variable elements. In the resistance variable memory apparatus, when writing data, Vpp is applied to a selected bit line, Vss (0V) is applied to a selected word line, and ½Vpp is applied to a non-selected word line and to a non-selected bit line. When erasing data, Vpp is applied to a selected word line, Vss (0V) is applied to a selected bit line, and Vpp/2 is applied to a non-selected word line and to a non-selected bit line.

Patent document 1: Japanese Laid-Open Patent Application Publication No. 2001-127263
Patent document 2: Japanese Laid-Open Patent Application Publication No. 2006-203098

DISCLOSURE OF THE INVENTION

Problems to be Solved by the Invention

However, the above described conventional configuration has a problem that reliability of a write operation and a read operation is not necessarily high. The present invention has been made to solve the above described problem, and an object of the present invention is to improve reliability of the write operation and the read operation in a resistance variable memory apparatus.

Means for Solving the Problem

The inventors studied intensively to solve the above mentioned problem, and discovered the followings.

Patent document 2 discloses a cross-point resistance variable memory apparatus using a varistor as a current suppressing element. Typically, in the cross-point resistance variable memory apparatus, a diode is used as the current suppressing element. The diode has a characteristic in which a current increases exponentially with respect to a voltage. The value of a current flowing in the diode is not completely zero if the voltage applied is lower than a threshold voltage Vth. When an electric potential difference of Vpp/2 is applied to a non-selected memory cell as in the example described in Patent document 2 and a Schottky diode model is used, the current flowing in the non-selected cell is approximately one hundredth to one thousandth of the current flowing in the selected cell. In a large-scale memory array, several hundreds to several thousands memory cells are connected to one row or to one column, and therefore, the current (leak current) flowing in the non-selected cells connected to the selected bit line or to the selected word line is not always negligible as compared to the value of the current flowing in the selected cell.

When the leak current is not negligible, various problems arise. In a write operation, it is necessary to apply a write voltage to a selected memory cell so as to compensate for an electric potential drop due to the leak current flowing to the non-selected cells. If the voltage is insufficient, a problem that writing is not surely performed, for example, arises. If the voltage is made too high, a disturb to the non-selected cells or an increase in electric current consumption may occur. A problem also arises in the read operation. The current flowing in the selected bit line or the selected word line has a value obtained by adding the leak current to the current flowing in the selected cell. Due to the leak current, the difference between the current corresponding to a high-resistance state and the current corresponding to a low-resistance state which are detected in reading becomes relatively smaller, reducing reliability of the read operation.

Vpp is determined from a sum of the value of the voltage required to switch the resistance state of the resistance variable element and the voltage value determined by the resistance value (electric current capacity) of the current suppressing element. A threshold voltage Vth of the current suppressing element is primarily determined by a current-voltage characteristic of the current suppressing element. However, it is difficult to allow the conditions of the voltage or current in the write operation or the read operation to be satisfied by controlling the characteristic of the resistance variable element and the characteristic of the current suppressing element. If the leak current can be reduced using a specific method, then design of the resistance variable memory apparatus is significantly facilitated. To be specific, the voltage applied to the non-selected bit line is controlled to reach a value which is closer to the voltage (Vpp) applied to the selected word line rather than the value (Vpp/2) of patent document 2 and the voltage applied to the non-selected word line is controlled to reach a value which is closer to the voltage (Vss) applied to the selected bit line rather than the value (Vpp/2) of patent document 2. In such a configuration, the voltage applied to the memory cell connected to the selected word line and to the selected bit line is made smaller, making it possible to reduce the leak current.

Further, by performing control to satisfy the relationship (V1−V4)<VF or (V3−V2)<VF when the threshold of the current suppressing element is expressed as VF, the leak current amount can be made substantially to zero.

To solve the above describe problem, a resistance variable memory apparatus of the present invention including a memory array including plural first wires provided to extend in parallel with each other within a first plane, plural second wires provided to extend in parallel with each other within a second plane parallel to the first plane and to three-dimensionally cross the plural first wires, and nonvolatile memory elements which are provided to respectively correspond to three-dimensional cross points between the plural first wires and the plural second wires and have resistance variable layers, a resistance value of each of the resistance variable layers being switchable reversibly in response to an electric signal applied between an associated first wire and an associated second wire, and current suppressing elements which are provided to respectively correspond to the three-dimensional cross points and are connected in series with the resistance variable layers, respectively; a first voltage source for applying a first voltage to the first wires or to the second wires; a second voltage source for applying a second voltage to the first wires or to the second wires; a third voltage source for applying a third voltage to the first wires or to the second wires; and a fourth voltage source for applying a fourth voltage to the first wires or to the second wires; wherein each of the resistance variable layers has a characteristic in which the resistance variable layer switches from a high-resistance state to a low-resistance state in response to a low-resistance state attaining voltage which is a predetermined voltage applied to both ends thereof, when the resistance variable layer is in the high-resistance state, while the resistance variable layer switches from the low-resistance state to the high-resistance state in response to a high-resistance state attaining voltage which is a predetermined voltage applied to both ends thereof, the high-resistance state attaining voltage having a polarity different from a polarity of the low-resistance state attaining voltage, when the resistance variable layer is in the low-resistance state; wherein each of the current suppressing elements has a non-linear and bidirectional current characteristic in which a resistance value thereof rapidly decreases when an absolute value of the voltage applied to both ends thereof exceeds a threshold VF and a current flows therein bidirectionally according to a polarity of the applied voltage; wherein when the first to fourth voltages are expressed as V1 to V4 and V5=(V1+V2)/2 is a fifth voltage, $V2 \leq V3 < V5 < V4 \leq V1$ is satisfied and (V1−V4)<VF or (V3−V2)<VF is satisfied; the resistance variable memory apparatus comprising: a controller configured to execute operation A and operation B for a selected nonvolatile memory element which is a nonvolatile memory element to which data is to be written or from which data is to be read:

A: the first voltage source is connected to a first wire associated with the selected nonvolatile memory element, the second voltage source is connected to a second wire associated with the selected nonvolatile memory element, the third voltage source is connected to a first wire which is not associated with the selected nonvolatile memory element, and the fourth voltage source is connected to a second wire which is not associated with the selected nonvolatile memory element; and B: the first voltage source is connected to a second wire associated with a selected nonvolatile memory element, the second voltage source is connected to a first wire associated with the selected nonvolatile memory element, the third voltage source is connected to a second wire which is not associated with the selected nonvolatile memory element, and the fourth voltage source is connected to a first wire which is not associated with the selected nonvolatile memory element.

In such a configuration, in the resistance variable memory apparatus, it is possible to suppress a current flowing into a non-selected nonvolatile memory element through a wire which is connected to the selected nonvolatile memory element. As a result, reliability of a write operation and a read operation can be improved.

The resistance variable memory apparatus may further comprise a pulse generating circuit for outputting an electric pulse in accordance with control of the controller. The controller may be configured to execute the operation A or the operation B in a period in which the pulse generating circuit is outputting the electric pulse. The controller may be configured to connect the third voltage source to all of the first wires and connect the fourth voltage source to all of the second wires in a period in which the pulse generating circuit is not outputting the electric pulse when the controller executes the operation A in the period in which the pulse generating circuit is outputting the electric pulse. The controller may be configured to connect the fourth voltage source to all of the first wires and connect the third voltage source to all of the second wires in the period in which the pulse generating circuit is not outputting the electric pulse when the controller executes the operation B in the period in which the pulse generating circuit is outputting the electric pulse.

In such a configuration, reliability of the write operation and the read operation can be improved, using a simple circuit in the resistance variable memory apparatus.

The resistance variable memory apparatus may further comprise a pulse generating circuit for outputting an electric pulse in accordance with control of the controller; and a fifth voltage source for applying the fifth voltage. The controller may be configured to execute the operation A or the operation B in a period in which the pulse generating circuit is outputting the electric pulse. The controller may be configured to connect the fifth voltage source to all of the first wires and to all of the second wires in a period in which the pulse generating circuit is not outputting the electric pulse.

In such a configuration, reliability of the write operation and the read operation can be improved, and electric power consumption can be suppressed in the resistance variable memory apparatus.

The resistance variable memory apparatus may further comprise a pulse generating circuit for outputting an electric pulse in accordance with control of the controller; first non-select switch elements for selectively connecting the first wires to the third voltage source or to the fourth voltage source; and second non-select switch elements for selectively connecting the second wires to the third voltage source or to the fourth voltage source. The controller may be configured to execute the operation A or the operation B and to execute control to place in a high-impedance state, a first non-select switch element which is not associated with the selected nonvolatile memory element and a second non-select switch element which is not associated with the selected nonvolatile memory element in the period in which the pulse generating circuit is outputting the electric pulse. The controller may be configured to control the first non-select switch elements to connect the third voltage source to all of the first wires and to control the second non-select switch elements to connect the fourth voltage source to all of the second wires in a period in which the pulse generating circuit is not outputting the electric pulse when the controller executes the operation A in the period in which the pulse generating circuit is outputting the electric pulse; and the controller may be configured to control the first non-select switch elements to connect the fourth voltage source to all of the first wires and to control the second non-select switch elements to connect the third voltage source to all of the second wires in the period in which the pulse generating circuit is not outputting the electric pulse when the controller executes the operation B in the period in which the pulse generating circuit is outputting the electric pulse.

In such a configuration, reliability of the write operation and the read operation can be improved, and electric power consumption can be suppressed in the resistance variable memory apparatus.

In the resistance variable memory apparatus, an absolute value of a voltage difference between V1 and V2 may be larger than an absolute value of a voltage required to switch the nonvolatile memory element from the high-resistance state to the low-resistance state and an absolute value of a voltage required to switch the nonvolatile memory element from the low-resistance state to the high-resistance state. The controller may be configured to execute one of the operation A and the operation B for all of nonvolatile memory elements to which data is to be written, in an erase mode.

In such a configuration, data is erased in the first place when writing data, and therefore it is not necessary to switch a write voltage in the program mode.

In the resistance variable memory apparatus, an absolute value of a voltage difference between V1 and V2 may be larger than an absolute value of a voltage required to switch the nonvolatile memory element from the high-resistance state to the low-resistance state and an absolute value of a voltage required to switch the nonvolatile memory element from the low-resistance state to the high-resistance state. The controller may be configured to execute one of the operation A and the operation B for all of nonvolatile memory elements to which data is to be written, in a program mode.

In such a configuration, switching between the erase mode and the program mode can be easily accomplished merely by switching the voltage source to be connected.

In the resistance variable memory apparatus, an absolute value of a voltage difference between V1 and V2 may be smaller than an absolute value of a voltage required to switch the nonvolatile memory element from the high-resistance state to the low-resistance state and an absolute value of a voltage required to switch the nonvolatile memory element from the low-resistance state to the high-resistance state. The controller may be configured to execute one of the operation A and the operation B for all of nonvolatile memory elements from which data is to be read, in a read mode.

In such a configuration, since the voltage difference between V1 and V2 is controlled so as to prevent switching of the resistance state of the nonvolatile memory element, the written value can be read without being destroyed.

In the resistance variable memory apparatus, the first voltage source, the second voltage source, the third voltage source and the fourth voltage source may be each configured to selectively output one of plural voltages.

In such a configuration, each voltage source is able to output plural voltages. For example, the write operation and the read operation can be surely carried out by switching the voltage in writing and the voltage in reading.

In the resistance variable memory apparatus, each of the first voltage source, the second voltage source, the third voltage source and the fourth voltage source may include plural voltage generators.

In such a configuration, each voltage source is able to output plural voltages. For example, the write operation and the read operation can be surely carried out by switching the voltage in writing and the voltage in reading.

In the resistance variable memory apparatus, the second voltage source may be a voltage source for outputting 0V.

In such a configuration, a circuit configuration can be simplified using a ground point as one voltage source.

In the resistance variable memory apparatus, the controller may be configured to execute control so that the first voltage V1, the second voltage V2, the third voltage V3, and the fourth voltage V4 are equal values in a stand-by mode.

In such a configuration, the electric power consumption in the stand-by mode can be reduced.

In the resistance variable memory apparatus, V1 and V2 may be set so that an absolute value of the voltage applied to the resistance variable layer is larger when the resistance variable layer is switched from the low-resistance state to the high-resistance state than when the resistance variable layer is switched from the high-resistance state to the low-resistance state. Also, V1 and V2 may be set so that an absolute value of (V1−V2) is larger when the resistance variable layer is switched from the low-resistance state to the high-resistance state than when the resistance variable layer is switched from the high-resistance state to the low-resistance state.

Since the absolute value of the voltage applied to cause the resistance variable layer to switch the resistance state is required to be larger when the resistance variable layer is switched from the low-resistance state to the high-resistance state than when the resistance variable layer is switched from the high-resistance state to the low-resistance state, sure and sufficient resistance switching from the low-resistance state to the high-resistance state is achieved by setting V1 and V2 as described above. Thus, stable write operation is achieved.

In the resistance variable memory apparatus, the volatile memory element may include the resistance variable layer, and the resistance variable layer may include at least tantalum oxide, and may be configured to satisfy $0.8 \leq x \leq 1.9$ when the tantalum oxide is expressed as TaOx.

In such a configuration, since the tantalum oxide has a good characteristic as a resistance variable material, reliability of the operation is further improved.

In the resistance variable memory apparatus, each of the current suppressing elements may include a current suppressing layer, and the current suppressing layer may comprise SiNx ($0.2 \leq x \leq 0.7$).

In such a configuration, since a good ON-OFF ratio of the current suppressing element is achieved, the write operation and the read operation can be performed stably.

In the resistance variable memory apparatus, plural layers of the memory array are stacked.

In such a configuration, a super-large-capacity memory array is attainable.

In the resistance variable memory apparatus, each of the first voltage source, the second voltage source, the third voltage source and the fourth voltage source may include a voltage control circuit for mask-controlling an output voltage thereof In such a configuration, plural voltages can be easily output by mask-control.

In the resistance variable memory apparatus, each of the first voltage source, the second voltage source, the third voltage source and the fourth voltage source may include a voltage control circuit for fuse-controlling an output voltage thereof. In such a configuration, plural voltages can be easily output by fuse-control.

A method of controlling a resistance variable memory apparatus of the present invention, including: a memory array including plural first wires provided to extend in parallel with each other within a first plane, plural second wires provided to extend in parallel with each other within a second plane parallel to the first plane and to three-dimensionally cross the plural first wires, and nonvolatile memory elements which are provided to respectively correspond to three-dimensional cross points between the plural first wires and the plural second wires, the method comprising: when a nonvolatile memory element to which data is to be written or from which data is to be read is expressed as a selected nonvolatile memory element; applying a first voltage to a first wire associated with the selected nonvolatile memory element; applying a second voltage to a second wire associated with the selected nonvolatile memory element; applying a third voltage to a first wire which is not associated with the selected nonvolatile memory element; and applying a fourth voltage to a second wire which is not associated with the selected nonvolatile memory element; wherein when the first to fourth voltages are expressed as V1 to V4 and V5=(V1+V2)/2 is a fifth voltage, $V2 \leq V3 < V5$ and $V5 < V4 \leq V1$ are satisfied.

In such a configuration, in the resistance variable memory apparatus, it is possible to suppress a current flowing into a non-selected nonvolatile memory element through a wire which is connected to the selected nonvolatile memory element. As a result, reliability of a write operation and a read operation can be improved.

The above object, other object, features, and advantages of the present invention will be apparent from the following detailed description of the preferred embodiments with reference to accompanying drawings.

Effect of the Invention

The present invention has the above described configuration and achieves an advantage that reliability of a write operation and a read operation can be improved in a resistance variable memory apparatus.

BRIEF DESCRIPTION OF THE DRAWINGS

FIG. 9 is a view showing a resistance variable characteristic in a case where the oxygen content rate of the resistance variable layer is 45 to 65 atm %, in which FIG. 9(a) is a view showing the relationship between the oxygen content rate and the resistivity, FIG. 9(b) is a view showing the relationship between the number of pulse applications and a resistance value in the case where the oxygen content rate is 45 atm % and FIG. 9(c) is a view showing the relationship between the number of pulse applications and a resistance value in the case where the oxygen content rate is 65 atm %.

FIGS. 20(a) to 20(d) show operation modes in which FIG. 20(a) shows an erase mode, FIG. 20(b) shows a program mode, FIG. 20(c) shows a read mode, and FIG. 20(d) shows a stand-by mode.

FIG. 22 is a timing chart showing an example of voltages applied to word lines and to bit lines in a case where an intermediate voltage is applied to a non-selected bit line and to a non-selected word line in the configuration of FIGS. 1, and 22(a) to 22(d) show operation modes in which FIG. 22(a) shows an erase mode, FIG. 22(b) shows a program mode, FIG. 22(c) shows a read mode, and FIG. 22(d) shows a stand-by mode.

FIG. 29 is a timing chart showing an example of voltages applied to word lines and to bit lines according to Embodiment 2 of the present invention, and 29(a) to 29(d) show operation modes in which FIG. 29(a) shows an erase mode, FIG. 29(b) shows a program mode, FIG. 29(c) shows a read mode, and FIG. 29(d) shows a stand-by mode.

FIG. 30 is a timing chart showing an example of voltages applied to word lines and to bit lines according to Embodiment 3 of the present invention, and 30(a) to 30(d) show operation modes in which FIG. 30(a) shows an erase mode, FIG. 30(b) shows a program mode, FIG. 30(c) shows a read mode, and FIG. 30(d) shows a stand-by mode.

Figure 1:
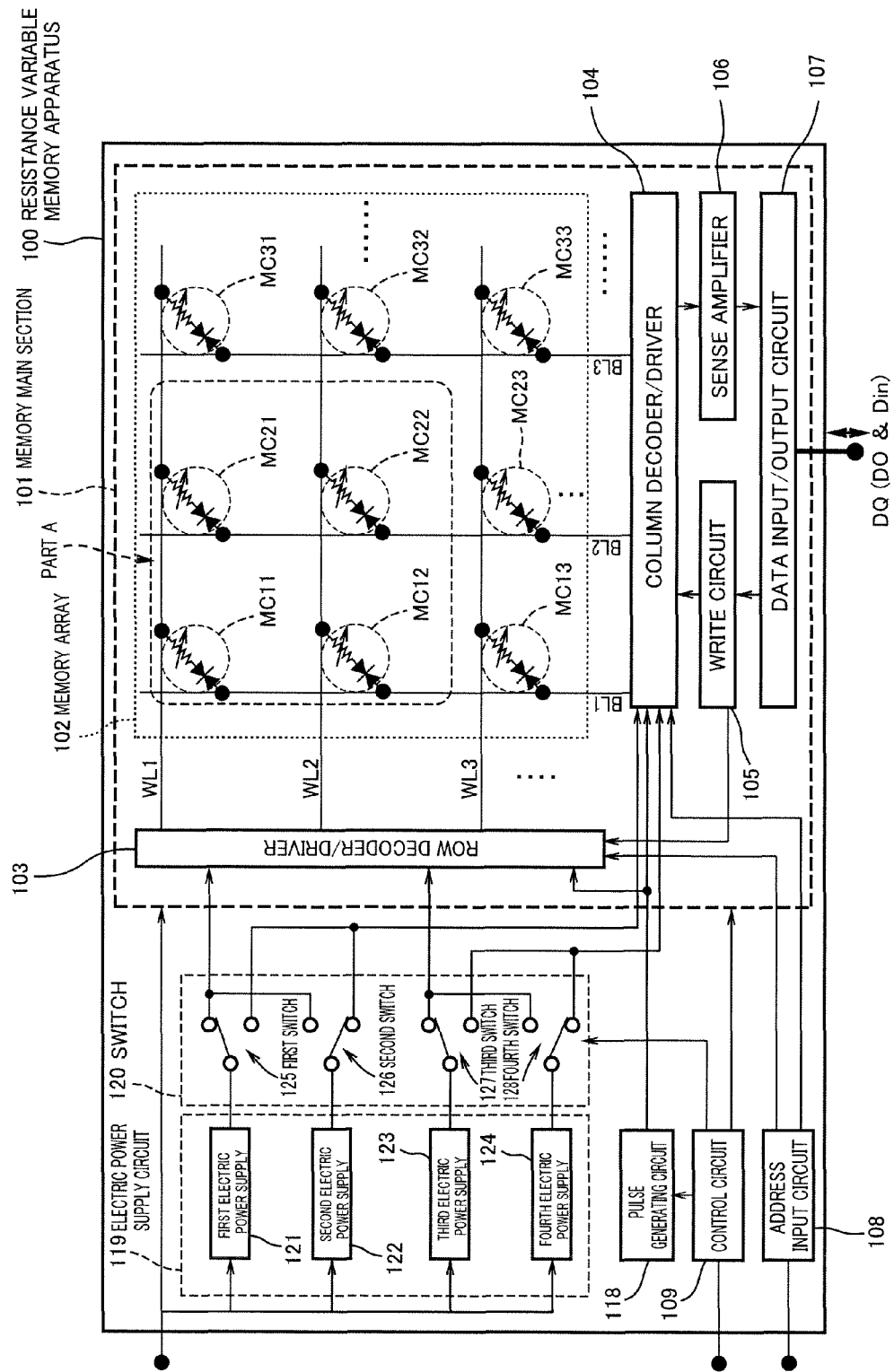
FIG. 1 is a block diagram showing an example of a schematic configuration of a resistance variable memory apparatus according to Embodiment 1 of the present invention.

EXPLANATION OF REFERENCE NUMERALS 100 resistance variable memory apparatus
101 memory main section
102 memory array
103 row select circuit/driver
104 column select circuit/driver
105 write circuit
106 sense amplifier
107 data input/output circuit
108 address input circuit
109 control circuit
110 memory cell
111 upper wire
112 lower wire
113 upper electrode
114 resistance variable layer
115 inner electrode
116 current suppressing element
117 lower electrode
118 pulse generating circuit
119 electric power circuit
120 switch
121 first electric power supply
122 second electric power supply
122' grounded voltage source
123 third electric power supply
124 fourth electric power supply
125 first switch
126 second switch
127 third switch
128 fourth switch
129 nonvolatile memory element
130 operational amplifier
131 reference voltage generator
132 P-channel transistor
133 N-channel transistor
134 P-channel transistor
135 N-channel transistor
136 P-channel transistor
137 N-channel transistor
138 P-channel transistor
139 N-channel transistor
140 fifth electric power supply
141 row decoder/driver
142 column decoder/driver
143 P-channel transistor
144 N-channel transistor
145 P-channel transistor
146 N-channel transistor
150 first non-selected memory cell group
151 node corresponding to non-selected word line
152 second non-selected memory cell group
153 node corresponding to non-selected bit line
154 third non-selected memory cell group
200 resistance variable memory apparatus
211 upper wire
212 lower wire
213 upper electrode
214 resistance variable layer
215 inner electrode
216 current suppressing element
217 lower electrode
218 ohmic resistance layer
219 second resistance variable layer
MC11, MC12, ... MCnm memory cells
BL1, BL2, ..., BLn bit lines
BVD non-select voltage supply line
BVS select voltage supply line
BLD1, BLD2, ..., BLDn non-select signal input lines
BLS1, BLS2, ..., BLSn select signal input lines
BID1, BID2, ..., BIDn inverters
BIS1, BIS2, ..., BISn inverters BCD1, BCD2, ..., BCDn non-select switch elements
BCS1, BCS2, ..., BCSn select switch elements
BVM intermediate voltage supply line
BLM1, BLM2, ..., BLMm intermediate voltage signal input lines
BIM1, BIM2, ..., BIMm inverters
BCM1, BCM2, ..., BCMm intermediate voltage select switch elements
WL1, WL2, ... WLm word lines
WVD non-select voltage supply line
WVS select voltage supply line
WLD1, WLD2, ..., WLDm non-select signal input lines
WLS1, WLS2, ..., WLSm select signal input lines
WID1, WID2, ..., WIDm inverters
WIS1, WIS2, ..., WISm inverters
WCD1, WCD2, ..., WCDm non-select switch elements
WCS1, WCS2, ..., WCSm select switch elements
WVM intermediate voltage supply line
WLM1, WLM2, ..., WLMm intermediate voltage signal input lines
WIM1, WIM2, ..., WIMm inverters
WCM1, WCM2, ..., WCMm intermediate voltage select switch elements

BEST MODE FOR CARRYING OUT THE INVENTION

Hereinafter, preferred embodiments of the present invention will be described with reference to the drawings.

Embodiment 1

A resistance variable memory apparatus of Embodiment 1 is so-called cross-point memory apparatus including nonvolatile memory elements arranged at cross points (three-dimensional cross points) of word lines and bit lines.

[Configuration of Entire Apparatus]

Figure 2:
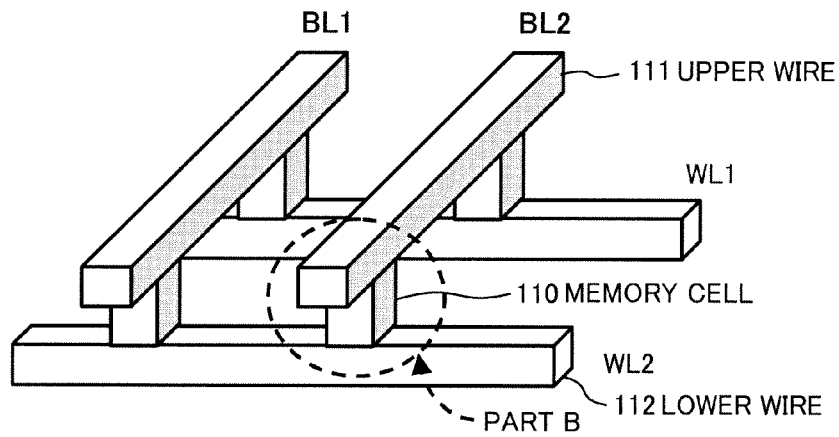
FIG. 2 is a perspective view showing a configuration (configuration of four bits) of part A of FIG. 1.

FIG. 1 is a block diagram showing an example of a schematic configuration of a resistance variable memory apparatus according to Embodiment 1 of the present invention. FIG. 2 is a perspective view showing a configuration (configuration of four bits) of part A of FIG. 1.

As shown in FIG. 1, a resistance variable memory apparatus 100 of this Embodiment includes on a substrate, a memory main section 101, an address input circuit 108 which receives an address signal input externally, a control circuit 109 which controls the operation of the memory main section 101, and the like based on a control signal input externally, a pulse generating circuit 118 which outputs a predetermined electric pulse in accordance with control of the control circuit 109, an electric power supply circuit 119 which is capable of outputting plural voltages, and a switch 120 which switches a voltage output from the electric power supply circuit 119 and supplies it to the memory main section 101.

The memory main section 101 includes a memory array 102, a row decoder/driver 103, a column decoder/driver 104, a write circuit 105 for writing (erasing and programming) data, a sense amplifier 106 which detects an amount of a current flowing in a selected bit line and determines it as data "1" or "0", and a data input/output circuit 107 which performs input/output processing of input/output data via a terminal DQ.

As shown in FIGS. 1 and 2, the memory array 102 includes on the substrate, m word lines WL1, WL2, WL3, ..., WLm (first wires) provided within a first plane parallel to the substrate so as to extend in parallel with each other, n bit lines BL1, BL2, BL3, ..., BLn (second wires) provided above the plural word lines WL1, WL2, WL3, ..., WLm so as to extend in parallel with each other within a second plane parallel to the first plane and so as to three-dimensionally cross the plural word lines WL1, WL2, WL3, ..., WLm. The word lines and the bit lines may be, for example, copper wires.

Plural memory cells MC11, MC12, MC13, MC21, MC22, MC23, MC31, MC32, MC33, ..., MCnm (hereinafter expressed as "memory cells MC11, MC12, ..., MCnm") are provided in a matrix form consisting of m rows and n columns so as to respectively correspond to the three-dimensional cross points of the plural word lines WL1, WL2, WL3, ..., WLm and the plural bit lines BL1, BL2, BL3, ..., BLn. Each of the memory cells MC11, MC12, ..., MCnm includes a nonvolatile memory element and a current suppressing element which are connected in series (as described in detail later). The memory cells MC11, MC12, ..., MCnm in FIG. 1 are designated by reference numerals 110 in FIG. 2.

The row decoder/driver 103 receives a row address signal output from the address input circuit 108 and selects one from among the plural word lines WL1, WL2, WL3, ..., WLm according to the row address signal.

The column decoder/driver 104 receives a column address signal output from the address input circuit 108 and selects one from among the plural bit lines BL1, BL2, BL3, ..., BLn according to the column address signal.

The write circuit 105 outputs to the row decoder/driver 103 and to the column decoder/driver 104 a signal indicating determination as to whether or not to apply a write (erasing or programming) voltage or a read voltage to a selected memory cell (memory cell connected to the selected word line and to the selected bit line; hereinafter referred to as a selected memory cell), based on the data input from the data input/output circuit 107. A nonvolatile memory element 129 included in the selected memory cell is called a selected nonvolatile memory element.

In a data read cycle, the sense amplifier 106 detects an amount of a current flowing in the selected bit line which is a read target and determines whether the data is "1" or "0". The result of determination is output to the data input/output circuit 107.

The data input/output circuit 107 outputs to the write circuit 105 write data Din ("1" or "0") externally input and outputs to outside read data DO ("1" or "0") output from the sense amplifier 106.

The address input circuit 108 receives an address signal from an external circuit (not shown), and outputs a row address signal and a column address signal to the row decoder/driver 103 and to the column decoder/driver 104, respectively, based on the address signal. The address signal is a signal indicating the address of a memory cell to be selected from among the plurality of memory cells MC11, MC12, ... MCnm. The row address signal is a signal indicating a row address (corresponding to a word line) in the address indicated by the address signal, and the column address signal is a signal indicating a column address (corresponding to a bit line) in the address indicated by the address signal.

The control circuit 109 selects a mode from among an erase mode, a program mode, a read mode, and a stand-by mode based on the signal input externally, and controls the switch 120, the pulse generating circuit 118, the write circuit 105, the sense amplifier 106 and the data input/output circuit 107 as desired, as will be described later.

The pulse generating circuit 118 inputs a write (erasing or programming) electric pulse (write pulse) to the row decoder/driver 103 and to the column decoder/driver 104 in accordance with the control of the control circuit 109.

The electric power supply circuit 119 includes a first electric power supply 121 (first voltage source) for outputting a first voltage V1, a second electric power supply 122 (second voltage source) for outputting a second voltage V2, a third electric power supply 123 (third voltage source) for outputting a third voltage V3, and a fourth electric power supply 124 (fourth voltage source) for outputting a fourth voltage V4.

The switch 120 includes a first switch 125 which is connected to the first electric power supply 121 and connects the first electric power supply to one of the row decoder/driver 103 and the column decoder/driver 104, a second switch 126 which is connected to the second electric power supply 122 and connects the second electric power supply to one of the row decoder/driver 103 and the column decoder/driver 104, a third switch 127 which is connected to the third electric power supply 123 and connects the third electric power supply to one of the row decoder/driver 103 and the column decoder/driver 104, and a fourth switch 128 which is connected to the fourth electric power supply 124 and connects the fourth electric power supply to one of the row decoder/driver 103 and the column decoder/driver 104.

[Configuration of Memory Cell]

Figure 3:
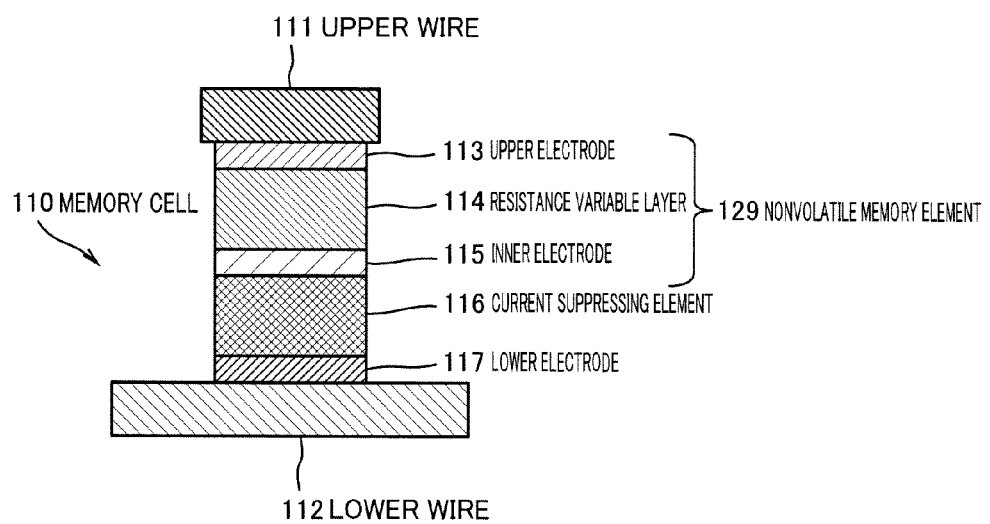
FIG. 3 is a cross-sectional view showing a configuration of a memory cell 110 included in a resistance variable memory apparatus 100 according to Embodiment 1 of the present invention.
Figure 4:
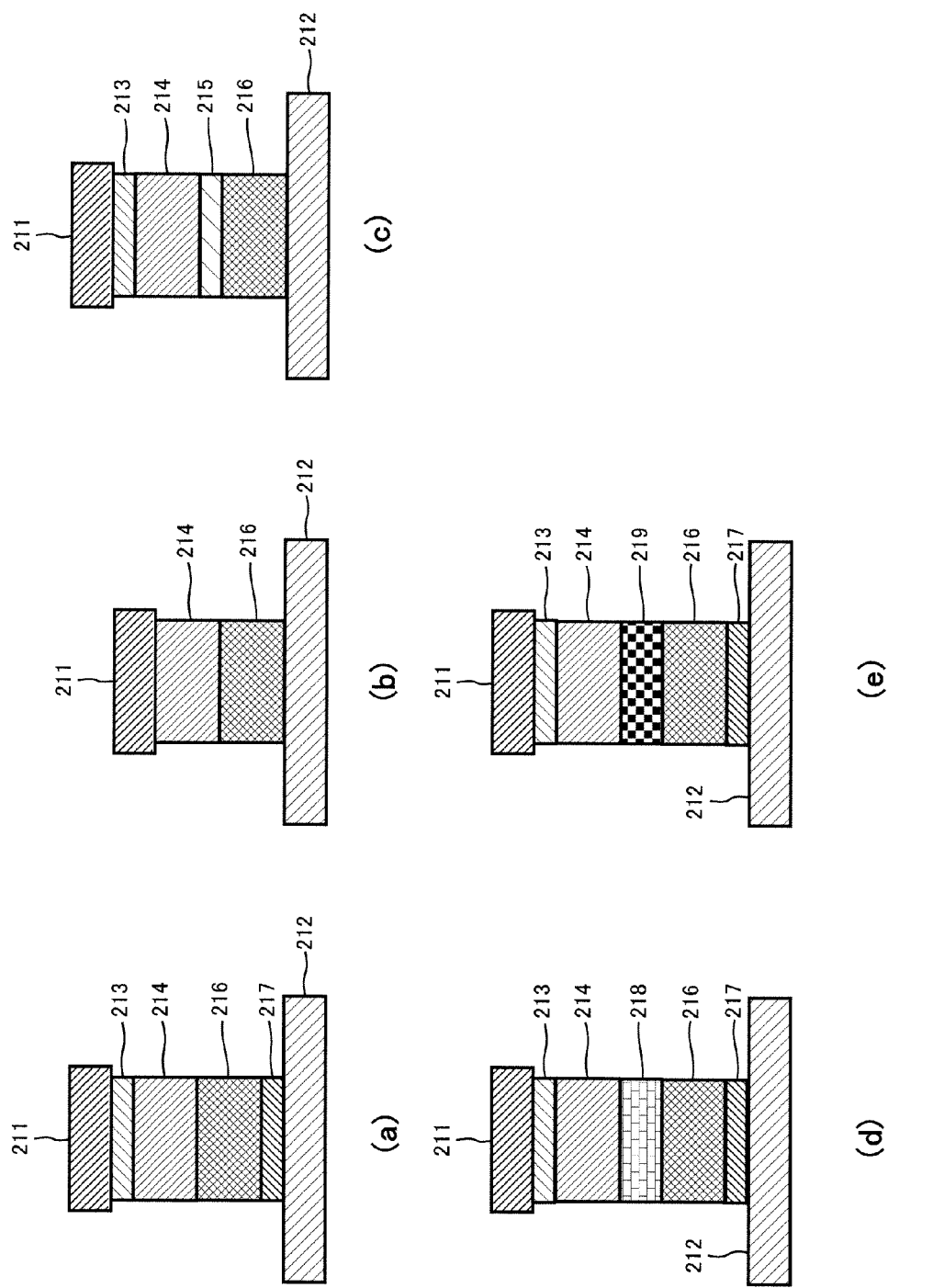
FIGS. 4(a) to 4(e) are cross-sectional views showing configuration of modifications of a memory cell included in the nonvolatile memory apparatus according to Embodiment 1 of the present invention.

FIG. 3 is a cross-sectional view showing a configuration of a memory cell 110 included in the resistance variable memory apparatus 100 according to Embodiment 1 of the present invention. FIG. 3 shows a configuration of a part B of FIG. 2.

As shown in FIG. 3, the memory cell 110 included in the resistance variable memory apparatus of this Embodiment is provided between a lower wire 112 (corresponding to word line WL2 in FIG. 2) and an upper wire 111 (corresponding to bit line BL2 in FIG. 2). The memory cell 110 has a structure in which a lower electrode 117, a current suppressing element 116, an inner electrode 115, a resistance variable layer 114, and an upper electrode 113 are laminated in this order on the lower wire 112. The upper electrode 113 is in contact with the upper wire 111.

As materials of the lower electrode 117, the inner electrode 115 and the upper electrode 113, for example, Pt (platinum), W (tungsten), Cu (copper), Al (aluminum), TiN (titanium nitride), TaN (tantalum nitride), and TiAlN (titanium aluminum nitride) may be used.

The resistance variable layer 114 is made of tantalum oxide. As defined herein, the tantalum oxide satisfies $0<x<2.5$ when the tantalum oxide is expressed as TaOx. X desirably satisfies $0.8 \leq X \leq 1.9$. In this embodiment, the nonvolatile memory element 129 is formed by the inner electrode 115, the resistance variable layer 114, and the upper electrode 113. The characteristic of the nonvolatile memory element 129 will be described later. The tantalum oxide has a very excellent characteristic (operation stability, long data retention characteristic, etc) as the resistance variable material.

The current suppressing element 116 is connected in series to the resistance variable layer 114 via the inner electrode 115. The current suppressing element 116 is an element which is typically a MIM (Metal-Insulator-Metal) diode or a MSM (Metal-Semiconductor-Metal) diode and exhibits a nonlinear current characteristic with respect to a voltage. The current suppressing element 116 has a bidirectional current characteristic with respect to a voltage and is configured to rapidly reduce a resistance value when an absolute value of the voltage applied to the both ends thereof exceeds a predetermined threshold voltage VF (e.g., +1V or larger or −V or smaller using one of the electrodes as a reference). The characteristic of the current suppressing element will be described later.

Tantalum and its oxide are materials which are generally used in a semiconductor process. Therefore, tantalum can be easily incorporated into the existing semiconductor manufacture process.

FIGS. 4(a) to 4(e) are cross-sectional views showing configurations of modifications of the memory cell included in the nonvolatile memory apparatus according to Embodiment 1 of the present invention.

FIG. 4(a) shows a configuration in which the resistance variable layer 214 is formed on the current suppressing element 216, and the inner electrode 215 is omitted, unlike the configuration of FIG. 3. In this case, it may be considered that the resistance variable layer 214 forms the nonvolatile memory element.

FIG. 4(b) shows a configuration in which the resistance variable layer 214 is formed on the current suppressing element 216, and the lower electrode 217, the inner electrode 215, and the upper electrode 213 are omitted, unlike the configuration of FIG. 3.

FIG. 4(c) shows a configuration in which the lower electrode is omitted, unlike the configuration of FIG. 3. Alternatively, a configuration in which the upper electrode is omitted may be used, although not shown.

FIG. 4(d) shows a configuration in which the inner electrode 215 is omitted, but instead, an ohmic resistance layer 218 is provided, unlike the configuration of FIG. 3.

FIG. 4(e) shows a configuration in which a second resistance variable layer 219 is provided instead of the inner electrode 215.

In the above illustrated Modifications, in the configuration in which the upper electrode 213 is omitted, the upper wire 211 serves as the upper electrode of the nonvolatile memory element, while in the configuration in which the lower electrode 217 is omitted, the lower wire 212 serves as the lower electrode of the nonvolatile memory element.

As should be understood from the above, for the nonvolatile memory element included in the nonvolatile memory apparatus according to this Embodiment, various configurations may be used.

[Manufacturing Method of Memory Cell]

Hereinafter, a manufacturing method of the memory cell 110 will be described.

On the substrate, the lower wire 112 is formed by a well-known method, and an oxide layer having a thickness of 200 nm is formed so as to cover the lower wire 112 by a thermal oxidation process. A contact hole is formed to penetrate through the oxide layer and reach the lower wire 112.

A Pt thin layer having a thickness of 100 nm is deposited as the lower electrode 117 on the bottom of the contact hole. A RF magnetron sputtering process may be used to deposit the layer. The layer deposition condition may be such that a degree of vacuum is 1.0 Pa, an RF power is 250 W, an Ar flow rate is 10 sccm, and a deposition time is 20 minutes.

On the lower electrode 117, a nitrogen-deficient-form silicon nitride thin layer is deposited as the current suppressing layer 116 by a sputtering process. The condition may be such that the degree of vacuum is 0.4 Pa, the RF power is 300 W, the Ar flow rate is 16 sccm, a nitrogen flow rate is 4 sccm, and deposition time is 2 minutes, when using, for example, a multi-crystal silicon target.

On the current suppressing element 116, a Pt thin layer having a thickness 100 nm is formed as the inner electrode 115. The layer deposition method and conditions may be identical to those of the lower wire 117.

On the inner electrode 115, a tantalum oxide layer is formed as the resistance variable layer 114. The reactive RF sputtering process using a Ta target may be used to deposit the layer. Table 1 shows an example of the layer deposition conditions for forming the resistance variable layer 114.

TABLE 1

| Target | Ta |
|---|---|
| Degree of vacuum (Pa) | 0.2-5 (Pa) |
| Substrate heating temperature (° C.) | 20-400 (° C.) |
| Sputtering gas | Ar + $O_2$ |
| $O_2$ flow rate ratio (%) | 0.1-10 (%) |
| RF-Power (W) | 150-300 (W) |
| Layer thickness (nm) | 1-300 (nm) |

On the resistance variable layer 114, a Pt thin layer having a thickness 150 nm is formed as the upper electrode 113. The layer deposition method and conditions may be identical to those of the lower wire 117.

Finally, the upper surface is flattened by CMP, and the upper wire 111 is formed thereon, thereby obtaining the memory cell 110 shown in FIG. 3. The oxide layer actually surrounds the memory cell 110, although the oxide layer is not illustrated in FIG. 3.

The resistance variable layer 114 may be formed by a sputtering process which does not use a reactive gas such as $O_2$, by using tantalum oxide as a target.

As the substrate, a silicon single crystal substrate or a semiconductor substrate may be used, but the substrate is not limited to these substrates. Since the resistance variable layer 114 can be formed at a relatively low substrate temperature, it can be formed on a material such as resin.

Figure 5:
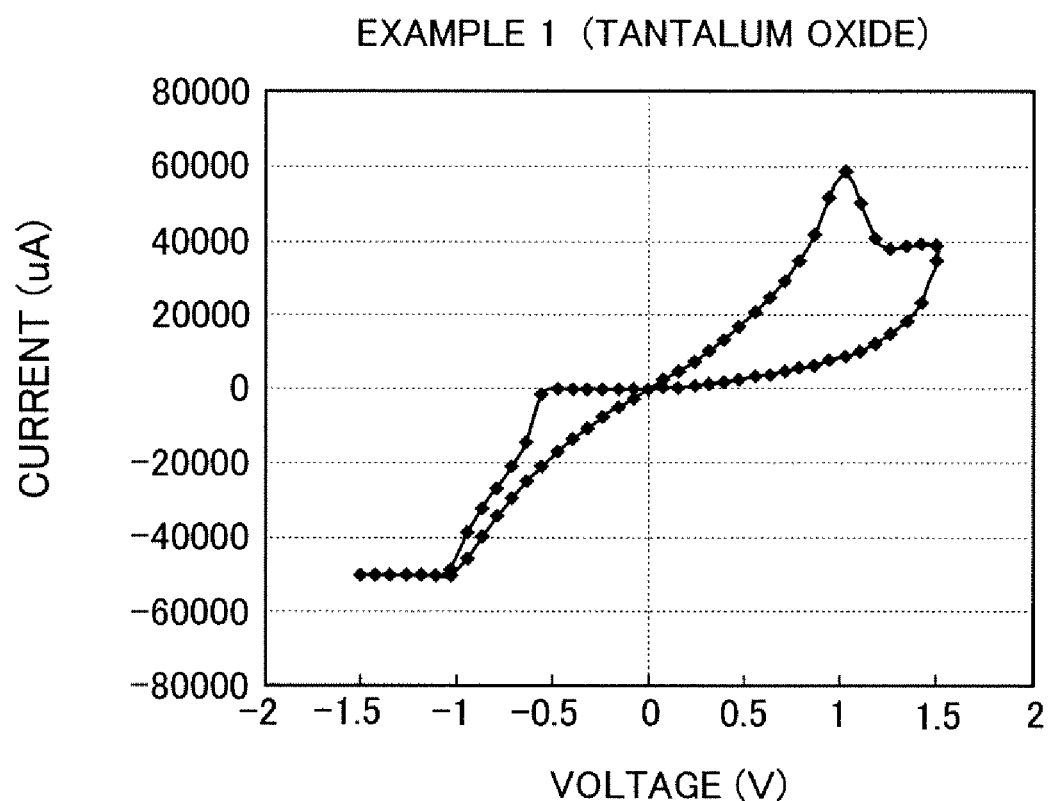
FIG. 5 is a view showing an example of a current-voltage characteristic of a nonvolatile memory element according to Embodiment 1 of the present invention.

FIG. 5 is a view showing an example of a current-voltage characteristic of the nonvolatile memory element according to Embodiment 1 of the present invention. As can be seen from FIG. 5, the nonvolatile memory element switches from a high-resistance state to a low-resistance state when a voltage between the electrodes is about −0.5V (the voltage is a voltage of the upper electrode based on the lower electrode as a reference: the same occurs hereinafter), and switches from the low-resistance state to the high-resistance state when the voltage is about +1V. That is, the absolute value of the voltage for causing the element to switch from the low-resistance state to the high-resistance state is larger than the absolute value of the voltage for causing the element to switch from the high-resistance state to the low-resistance state. The composition of the resistance variable layer in the example of FIG. 5 is a composition in which the value of x is near 1.0 when the tantalum oxide is expressed as TaOx.

[Experiment on Material of Resistance Variable Layer]

1. Relationship Between $O_2$ Flow Rate Ratio and Composition

Figure 6:
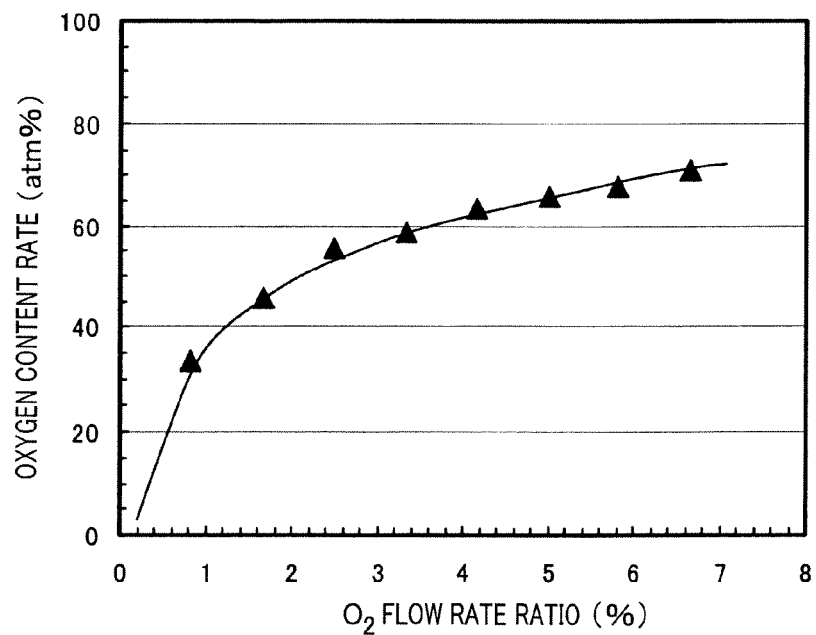
FIG. 6 is a view showing the relationship between a $O_2$ flow rate ratio (flow rate ratio of $O_2$ in a sputtering gas) of the sputtering gas in a manufacture step and an oxygen content rate (atom ratio) of a Ta oxide layer analyzed by a RBS method.

FIG. 6 is a view showing the relationship between the $O_2$ flow rate ratio (flow rate ratio of $O_2$ of the sputtering gas:flow rate is a volume flow rate) of the sputtering gas in the manufacture step and the oxygen content rate (atom ratio) of Ta oxide layer which is analyzed by the RBS (Rutherford back scattering) method. It is observed that the oxygen content rate tends to be saturated when the $O_2$ flow rate ratio is 7% or higher. Nonetheless, it can be seen that the composition of the tantalum oxide layer can be controlled continuously based on the $O_2$ flow rate ratio. That is, when the tantalum oxide layer is formed by the reactive RF sputtering process, the oxygen content rate of the tantalum oxide layer can be controlled to have a desired constant value in the thickness direction of the tantalum oxide layer by controlling the $O_2$ flow rate ratio of the sputtering gas.

2. Relationship Between $O_2$ Flow Rate Ratio and Resistivity

Figure 7:
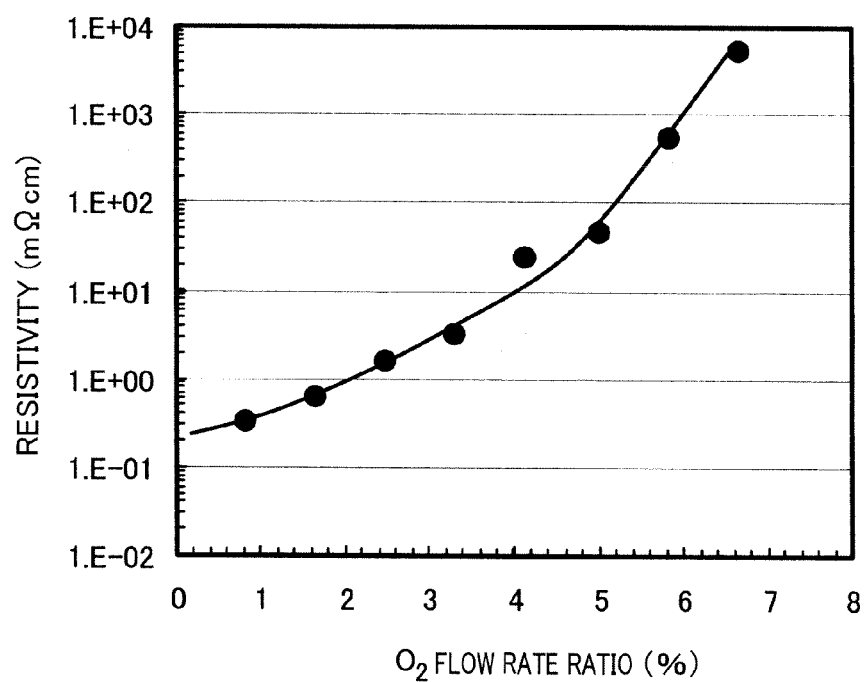
FIG. 7 is a view showing the relationship between a $O_2$ flow rate ratio of the sputtering gas in a manufacture step and a resistivity of the resistance variable layer, in a case where the resistance variable layer is made of the Ta oxide.

FIG. 7 is a view showing the relationship between the $O_2$ flow rate ratio of the sputtering gas in the manufacture step and a resistivity of the resistance variable layer, in a case where the resistance variable layer is made of Ta oxide. In FIG. 7, each plot corresponds to the associated plot in FIG. 6. In FIGS. 6 and 7, the plots whose $O_2$ flow rate ratios are equal show the results obtained from the same experiment.

Figure 8:
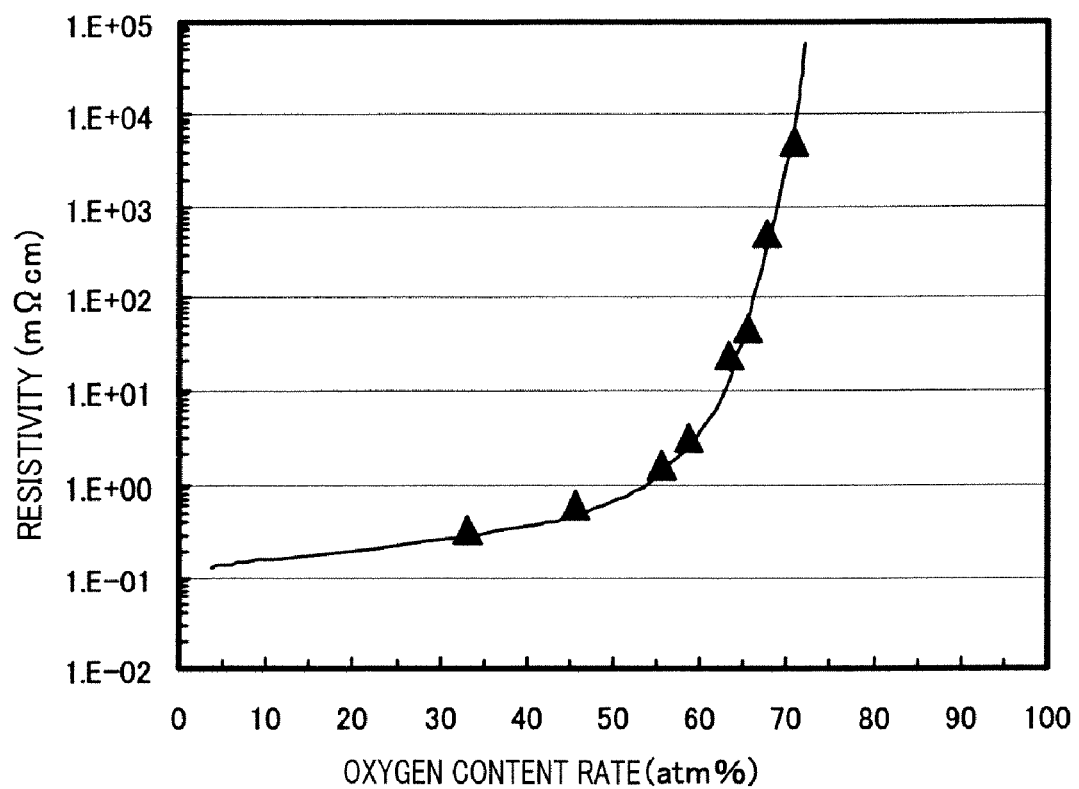
FIG. 8 is a view showing the relationship between an oxygen content rate (atom ratio) of the resistance variable layer analyzed by the RBS method and a resistivity of the resistance variable layer in a case where the resistance variable layer is made of the Ta oxide.

FIG. 8 is a view showing the relationship between an oxygen content rate (atom ratio) of the resistance variable layer analyzed by the RBS method and the resistivity of the resistance variable layer in a case where the resistance variable layer is made of Ta oxide. In FIG. 8, each plot corresponds to the associated plot in FIGS. 6 and 7. In FIGS. 6 and 8, the plots whose oxygen content rates are equal show the results obtained from the same experiment. In FIGS. 7 and 8, the plots whose resistivities are equal show the results obtained from the same experiment. The resistivity illustrated here is calculated based on measurement results of a sheet resistance value by a four-terminal method for the samples in which only the resistance variable layer is directly formed on the substrate (silicon wafer provided with a nitride layer).

As can be seen from FIG. 7, the resistivity of the resistance variable layer changes continuously according to the value of the $O_2$ flow rate ratio. In greater detail, as described above, the oxygen content rate of the tantalum oxide layer (resistance variable layer) continuously changes according to the value of the $O_2$ flow rate ratio. And, as shown in FIG. 8, the resistivity of the resistance variable layer changes continuously according to the oxygen content rate. Therefore, the resistivity of the resistance variable layer can be controlled continuously based on the oxygen content rate of the resistance variable layer. From this, it may be considered that the oxygen content rate of the resistance variable layer must fall within a proper range to obtain a desired resistance variable phenomenon in the resistance variable layer.

3. Suitable Numeric Value Range of O/Ta Ratio

The inventors measured resistivities of the samples having oxygen content rates shown in FIG. 8 and found a regression curve of measurement data of the resistivities. FIG. 8 shows the measurement data (indicated by black triangles) and a regression curve thereof. The inventors confirmed or presumably recognized that by applying the electric pulses to the samples having the oxygen content rates, the samples exhibit the resistance variable characteristic. According to the regression curve, it may be presumably recognized that the resistance variable layer is turned to serve as an electric conductor (a substance having a resistivity defined as the electric conductor) and exhibits the resistance variable phenomenon confirmed in each sample when x satisfies a range of 0<x<2.5 in the case where the resistance variable layer is expressed as TaOx.

Figure 9:
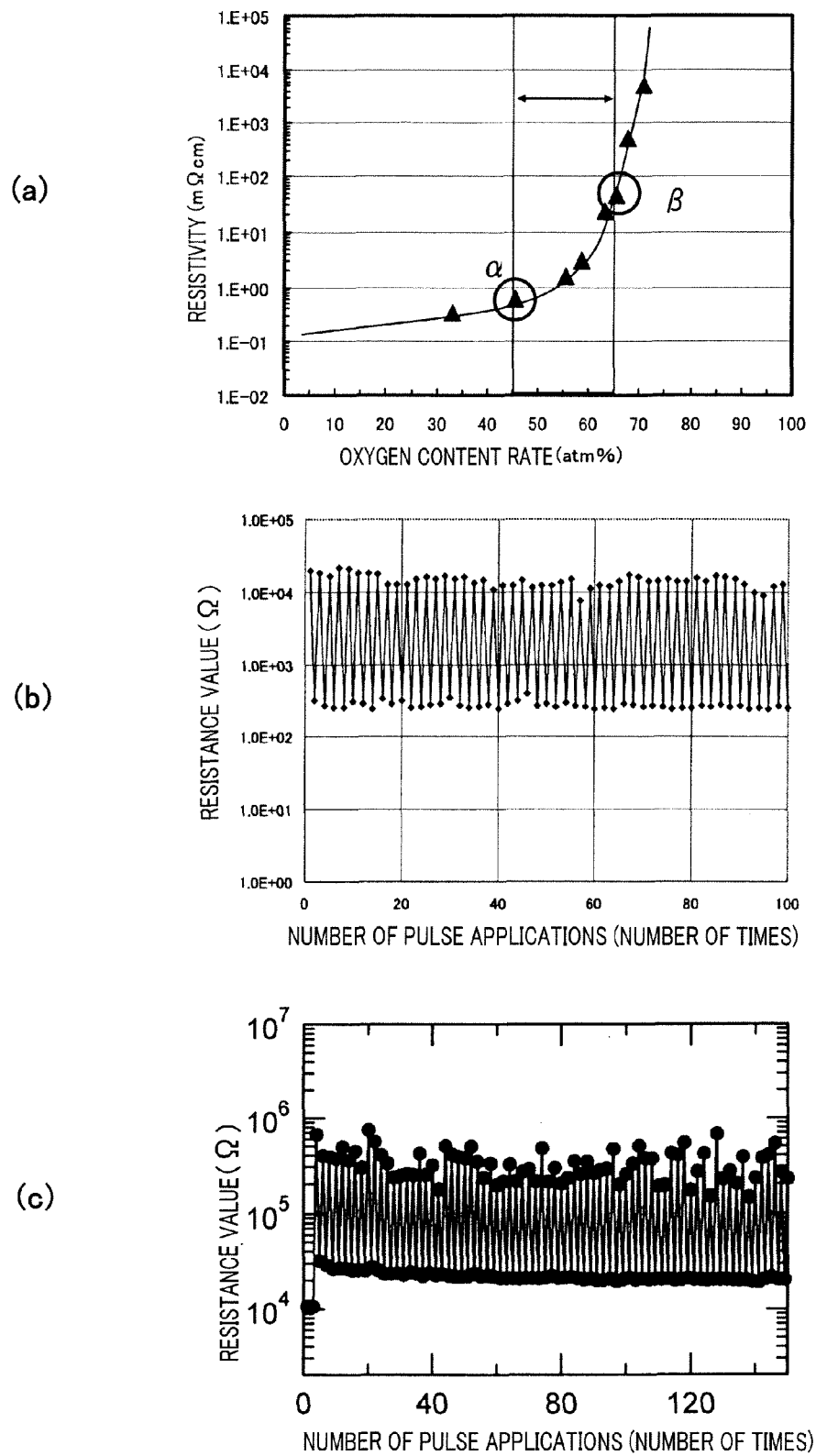

FIG. 9 is a view showing a resistance variable characteristic in a composition range in which the oxygen content rate of the resistance variable layer is 45 to 65 atm %. FIG. 9(a) is a view showing the relationship between the oxygen content rate and the resistivity. FIG. 9(b) is a view showing the relationship between the number of pulse applications and the resistance value in the case where the oxygen content rate is 45 atm %. FIG. 9(c) is a view showing the relationship between the number of pulse applications and the resistance value in the case where the oxygen content rate is 65 atm %.

According to the measurement of the resistance variable characteristic, in a range of the oxygen content rate from a point α (oxygen content rate: 45 atm %) to a point β (oxygen content rate: 65 atm %) shown in FIG. 9(a), a resistance value corresponding to a high-resistance state was favorably not less than five times as large as a resistance value corresponding to a low-resistance state. FIG. 9(b) and FIG. 9(c) show a resistance variable characteristic of the sample having the oxygen content rate at the point α (oxygen content rate: 45 atm %) with respect to the number of pulse applications and show a resistance variable characteristic of the sample having the oxygen content rate at the point β (oxygen content rate: 65 atm %) with respect to the number of pulse applications, respectively. As can be seen from FIGS. 9(b) and 9(c), in both of the oxygen content rates at the point a and the oxygen content rate at the point β, the resistance value corresponding to high-resistance state is favorably not less than five times as large as the resistance value corresponding to the low-resistance state. From this measurement result, it is presumed that a desired resistance variable phenomenon is observed in a range of $0<x\leq1.9$ in the case where the resistance variable layer is expressed as $TaO_x$. In addition, the resistance value corresponding to the high-resistance state is desirably not less than five times as large as the resistance value corresponding to the low-resistance state in the range of the oxygen content rate from the point α (oxygen content rate: 45 atm %) to the point β (oxygen content rate: 65 atm %). Therefore, the composition range from α to β may be regarded as a proper composition range which enables the memory element to stably operate. Therefore, the composition range in which the oxygen content rate is 45 to 65 atm %, i.e., the range of x, $0.8\leq x\leq1.9$ in the case where the resistance variable layer is expressed as $TaO_x$ is a more proper composition range of the resistance variable layer (oxygen content rate=45 atm % corresponds to x=0.8, and the oxygen content rate=65 atm % corresponds to x=1.9). In the composition analysis according to the RBS method, the analysis value of the oxygen content has a precision of about ±5 atm %. Therefore, the composition range of x contains a measurement error associated with this precision, and in actuality, there may be a likelihood that the composition range in which the oxygen content rate is 40 to 70 atm % is this proper composition range. Even in the resistance variable layer outside this composition range, the resistance variable phenomenon is confirmed or presumably recognized. However, as compared to the resistance variable phenomenon of the resistance variable layer within this composition range, the resistivity is smaller or larger, and therefore the resistance value corresponding to the high-resistance state is considered to be less than five times as large as the resistance value corresponding to the low-resistance state. It seems that the resistance variable layer outside the composition range is less favorable to the stable operation of the memory element.

[Experiment of Configuration of Current Suppressing Element]

The current suppressing element 116 is formed by depositing on a main surface of the lower electrode 117 a SiNx layer as the current suppressing layer. In the layer deposition, for example, a process (so-called reactive sputtering process) in which a multi-crystal silicon target is subjected to sputtering under a mixture gas atmosphere of Ar and nitrogen. In a typical layer deposition condition, the degree of vacuum is set to 0.3 to 2 Pa, the substrate temperature is set to 20 to 300 degrees centigrade, the nitrogen gas flow rate ratio (ratio of the flow rate of nitrogen to a total flow rate of Ar and nitrogen) is set to 0 to 40%, and the DC power is set to 100 to 300 W, and under this condition, the layer deposition time is adjusted so that the thickness of the SiNx layer is 5 to 20 nm.

Then, on the main surface of the current suppressing layer, the inner electrode 115 is deposited by the sputtering process. The layer deposition condition of the electrode is varied according to an electrode material used, etc. For example, when platinum (Pt) is used as the material of the inner electrode 115, the DC magnetron sputtering process is used, the degree of vacuum is set to 0.5 Pa, the DC power is set to 200 W, the flow rate of argon (Ar) is set to 6 sccm, in deposition of the layer, and the layer deposition time is adjusted so that the layer thickness is 20 to 100 nm, similar to the deposition of the lower electrode 117.

In this embodiment, the value of x of the SiNx layer can be changed suitably by changing the sputtering condition (e.g., gas flow rate ratio between Ar and nitrogen).

Figure 10:
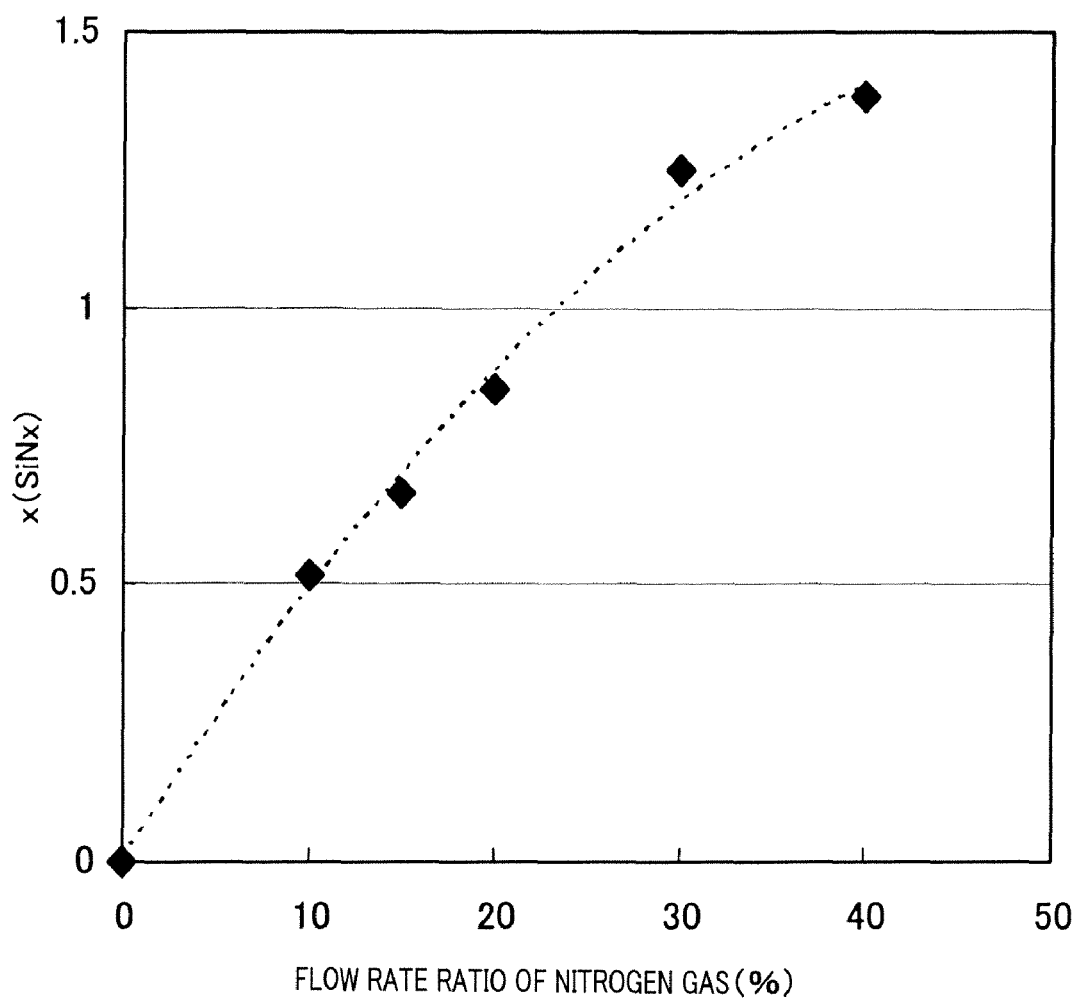
FIG. 10 is a correlation graph showing Rutherford back scattering spectrometry measurement result of the values of x of six kinds of SiNx layers formed by changing the flow rate ratio of a nitrogen gas.

FIG. 10 is a correlation graph showing Rutherford back scattering spectrometry measurement result of values of x of six kinds of SiNx layers formed by changing the flow rate ratio of the nitrogen gas. FIG. 10 shows measurement result in a case where the degree of vacuum is set to 0.4 Pa, the substrate temperature is set to 20 degrees centigrade, and the DC power is set to 300 W. In FIG. 10, a horizontal axis indicates the nitrogen gas flow rate ratio (ratio of the flow rate of nitrogen to a total flow rate of Ar and nitrogen: flow rate is volume flow rate) and a vertical axis indicates the value of x of the SiNx layer.

As shown in FIG. 10, by continuously changing the flow rate ratio of the nitrogen gas from 0% to 40%, the value of x of the SiNx layer can be changed continuously. In this way, by changing a nitrogen content in the SiNx layer based on the flow rate ratio of the nitrogen gas, the forbidden bandwidth can be changed continuously. This makes it possible to properly control the level of the electric potential barrier formed between the lower electrode 117 and the current suppressing layer (current suppressing element 116) adjacent to the electrode and between the inner electrode 115 and the current suppressing layer adjacent to the electrode. Thus, it is possible to make a current density of the current capable of being flowed in the current suppressing element 116 in a conductive state sufficiently larger while allowing the current suppressing element 116 to exhibit an electric resistance characteristic similar to that of the MSM diode.

Hereinafter, consideration of the proper value of x of SiNx will be described.

Figure 11:
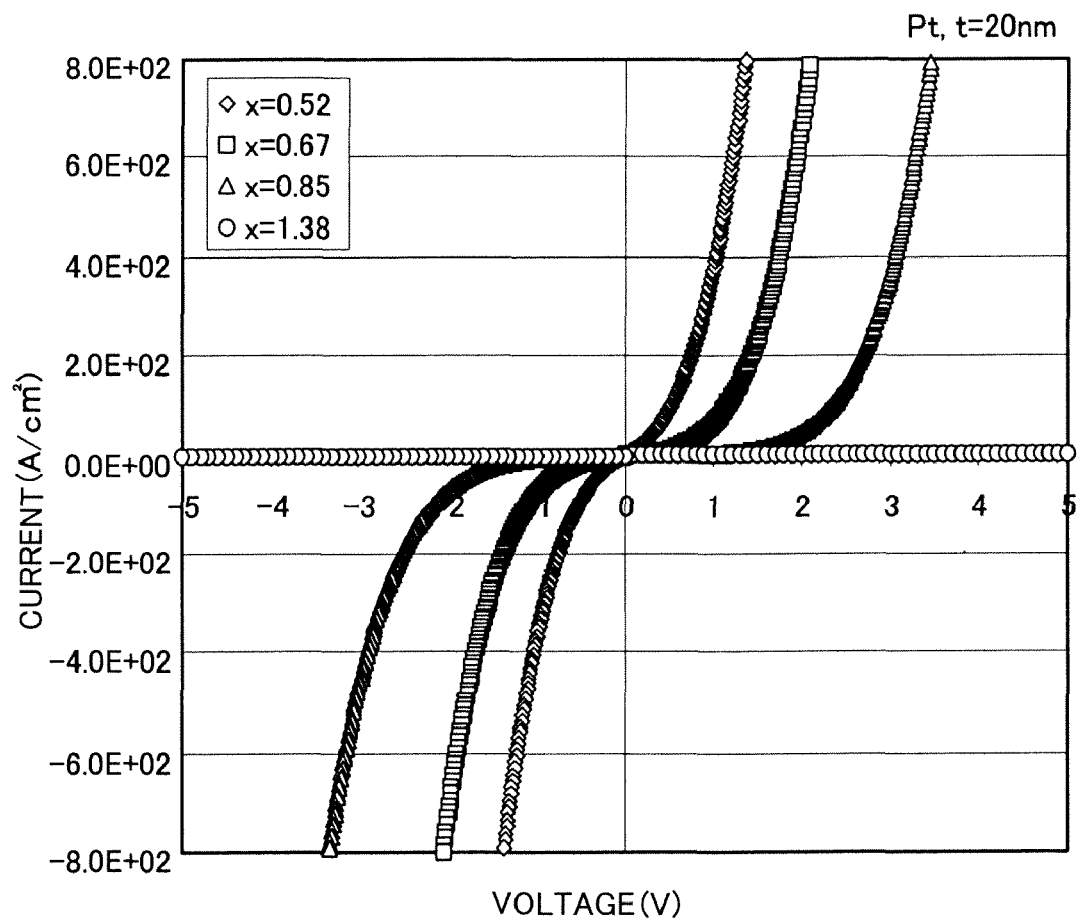
FIG. 11 is a characteristic graph showing a result of measurement of a current-voltage characteristic of a current suppressing element including a current suppressing layer made of SiNx and having a layer thickness of 20 nm and a pair of electrodes made of platinum (Pt).

FIG. 11 is a characteristic graph showing result of measurement of a current-voltage characteristic of the current suppressing element including a current suppressing layer made of SiNx and having a layer thickness of 20 nm and a pair of electrodes made of platinum (Pt). In FIG. 11, a horizontal axis indicates a voltage applied to the current suppressing element, and a vertical axis indicates a value of a current flowing in the current suppressing element.

In this experiment, Pt thin layer and SiNx thin layer were deposited over the main surface of the substrate in this order by the sputtering process. Then, using a metal mask having circular holes of a diameter of 100 μm, Pt thin layer was deposited by sputtering process, producing the current suppressing element. The SiNx thin layer was deposited in such a manner that a multi-crystal silicon target is subjected to sputtering under a mixture gas atmosphere containing argon and nitrogen. The value of x of the SiNx thin layer was changed by changing the sputtering condition (gas flow rate ratio of argon and nitrogen, etc). The value of x of the SiNx thin layer was found by Rutherford back scattering spectrometry. As shown in FIG. 11, in this experiment, four kinds of SiNx thin layers having different values of x were produced by changing the sputtering condition. The values of x were 0.52, 0.67, 0.85 and 1.38.

As shown in FIG. 11, it was found out that the current suppressing element including the electrodes made of Pt and the current suppressing layer made of SiNx becomes an element exhibiting a non-linear electric resistance characteristic and a current-voltage characteristic which is substantially symmetric with respect to the polarity of the applied voltage. It was found out that when the SiNx is applied to the current suppressing layer, the electric potential barrier formed between each of the electrodes and the current suppressing layer adjacent to these electrodes increases in level as the value of x increases, and according to this, the voltage with which the current suppressing element is placed into a conductive state increases. Furthermore, it was presumed from FIG. 11, that when the value of x is 0.85 or smaller, the current density is much higher than 500 A/cm$^2$ even when the voltage applied between the electrodes is smaller than 4V, and a higher current density is attained by further applying the voltage. However, it was found out that when the value of x is 1.38, the current suppressing element is not placed into a conductive state although the applied voltage is 5V, and the current suppressing element is destroyed before it is placed into a conductive state, by applying a higher voltage thereto. This implies that the forbidden bandwidth of the current suppressing layer increases significantly by increasing the value of x, and as a result, the current suppressing layer became an insulator. Therefore, it was found out that the value of x is desirably larger than 0 and not larger than 0.85 when SiNx is applied to the current suppressing layer. With such a structure, the current suppressing layer serves as a semiconductor and the current suppressing element serves as a MSM diode.

Figure 12:
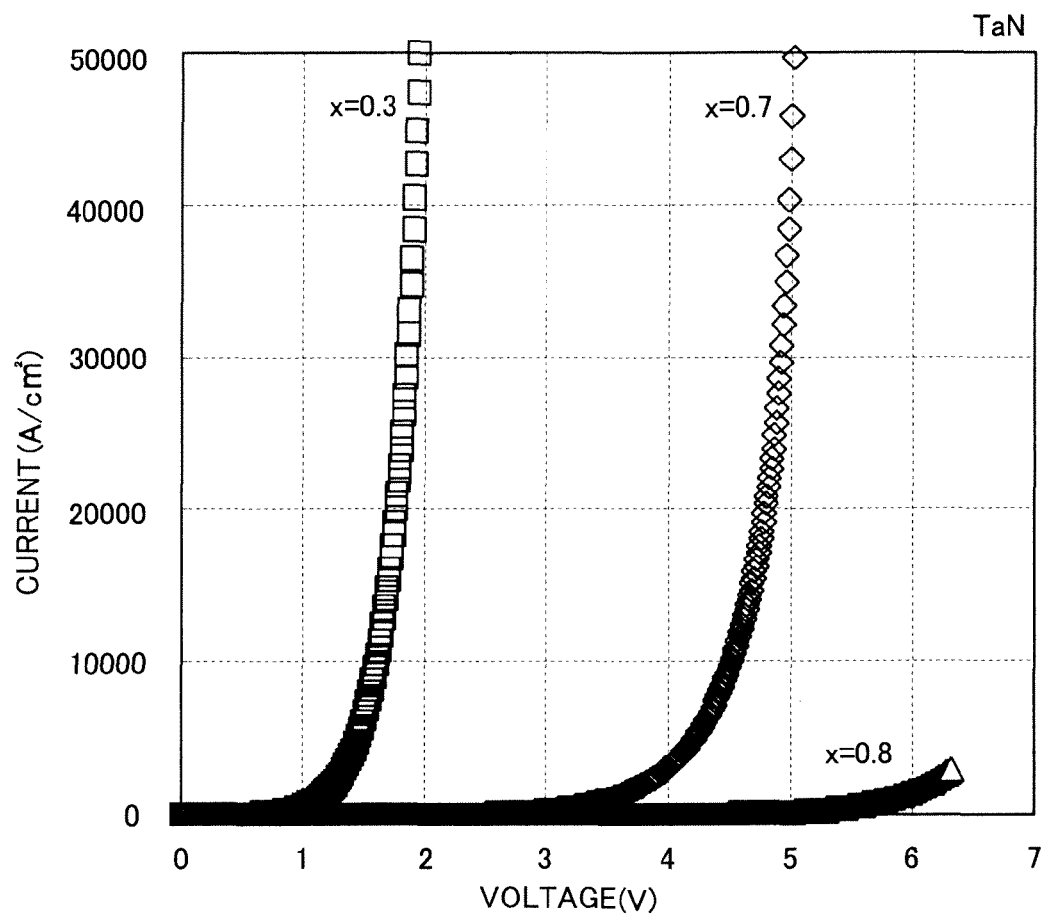
FIG. 12 is a characteristic graph showing result of measurement of a current-voltage characteristic of a current suppressing element including a current suppressing layer made of SiNx and having a layer thickness of 10 nm and a pair of electrodes made of tantalum nitride (TaN).

FIG. 12 is a characteristic graph showing result of measurement of a current-voltage characteristic of a current suppressing element including a current suppressing layer made of SiNx and having a layer thickness of 10 nm and a pair of electrodes made of tantalum nitride (TaN). FIG. 12 shows the current-voltage characteristic in the case where the values of x of SiNx are 0.3, 0.7, and 0.8. In FIG. 12, the current-voltage characteristic in the case where the polarity of the applied voltage is negative, is not illustrated, for the sake of convenience.

In this experiment, TaN, SiNx, and TaN are deposited and laminated in this order over the main surface of the substrate by the sputtering process. Then, using normal lithography and dry etching, the current suppressing element 2 having an electrode area of one square micron meter was produced and measurement was conducted.

As can be seen from FIG. 12, it was found out that by changing the value of x of SiNx from 0.3 to 0.7, the voltage with which the current suppressing element, exhibiting the electric resistance characteristic similar to that of the MSM diode, is placed into a conductive state is about 3V larger, and the current density higher than 30000 A/cm$^2$ is attained in both cases. On the other hand, as can be seen from FIG. 12, it was found out that when the value of x of SiNx is set to 0.8, it is possible to flow a current with a current density which is as high as about 3000 A/cm$^2$ in the case where the applied voltage is about 6.3V, whereas the current suppressing element is destroyed (short-circuited) when the applied voltage is further increased. It may be considered that this phenomenon occurs due to the fact that SiNx which is basically an insulator in a stoichiometric composition, exhibits an insulator-like property. This implies that the value of x is desirably set smaller than 0.8 when it is necessary to flow a current with a higher current density. Therefore, to achieve a current density which is higher than, for example, 30000 A/cm$^2$ in the current suppressing element including a pair of electrodes made of tantalum nitride (TaN), the value of x is desirably set to 0.7 or smaller.

Figure 13:
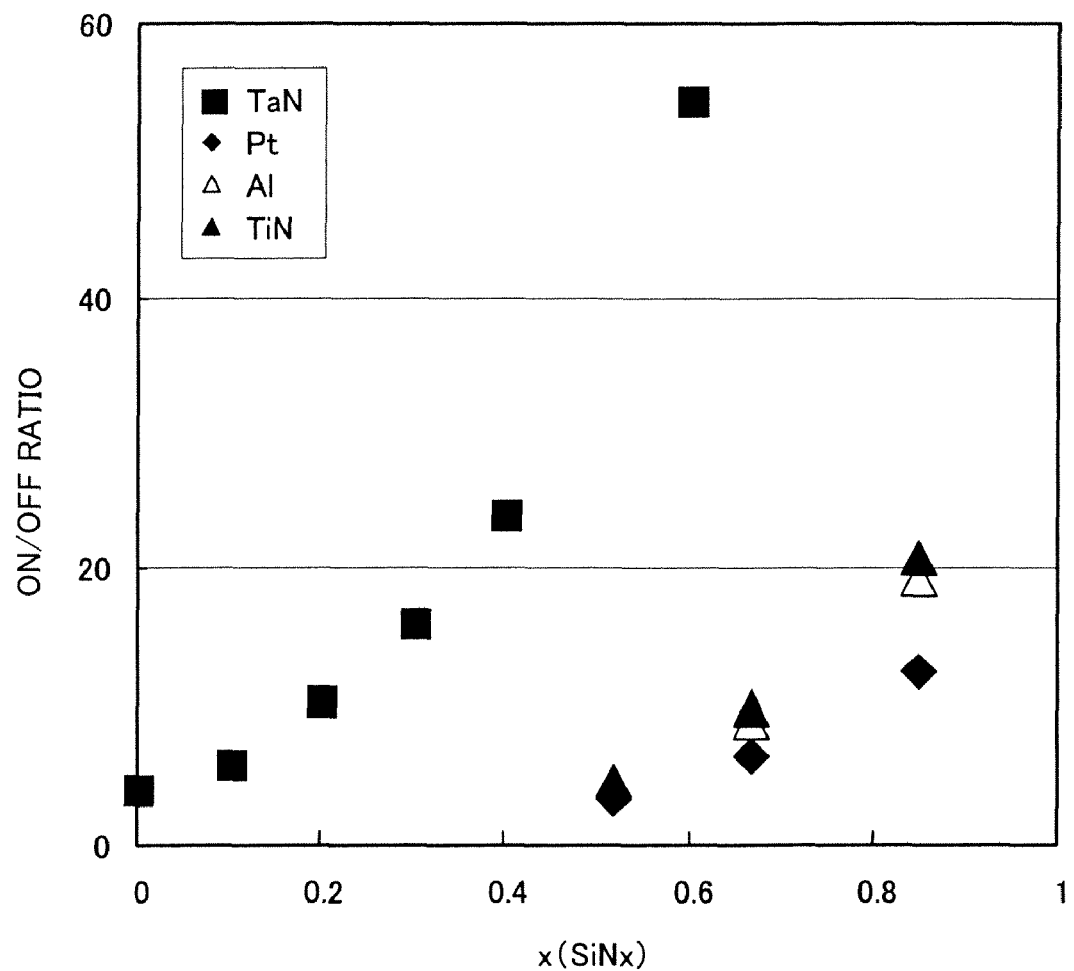
FIG. 13 is a correlation graph showing result which is found from an experiment regarding the relationship between the value of X and ON/OFF ratio in a case where the current suppressing layer of the current suppressing element is made of SiNx.

FIG. 13 is a correlation graph showing result of measurement which is found from an experiment regarding the relationship between the value of x and ON/OFF ratio in a case where the current suppressing layer of the current suppressing element is made of SiNx. FIG. 13 shows experimental results in a case where the layer thickness of the current suppressing layer 33 is set to 10 nm, and tantalum nitride (TaN), platinum (Pt), aluminum (Al), and titanium nitride (TiN) are used as the first and second electrodes 31 and 32. In FIG. 13, a horizontal axis indicates the value of x of SiNx and a vertical axis indicates ON/OFF ratio.

In this experiment, when TaN is used as the electrodes, TaN, SiNx, and TaN were deposited and laminated in this order over the main surface of the substrate by the sputtering process, and then using normal lithography and dry etching, the current suppressing element having an electrode area of one square micron meter was produced, as in the production method of the current suppressing element used to obtain the measurement result shown in FIG. 12. In this experiment, the values of x of SiNx were set to 0, 0.1, 0.2, 0.3, 0.4, and 0.6. When Pt, Al or TiN is used as the electrodes, the current suppressing element was produced in such a manner that the electrode material and the SiNx thin layer (the value of x in this experiment is 0.52, 0.67, or 0.85 (the value of x is 0.52 or 0.67 when the electrode material is TaN)) were sequentially deposited over the main surface of the substrate by the sputtering process, and then the electrode material was deposited by the sputtering process using a metal mask having circular holes of a diameter of 100 μm, producing the current suppressing element.

As used in this embodiment, the term "ON/OFF ratio" is defined as a value calculated in such a manner that an applied voltage (ON-voltage) in a case where the current density is 500 A/cm$^2$ is found from the measurement result of the current-voltage characteristic of the current suppressing element, a current density (OFF-current) flowing in the current suppressing element in a case where the applied voltage is as half as the ON-voltage is found, and 500 A/cm$^2$ which is a current in a state of the ON-voltage is divided by an OFF-current. The ON/OFF ratio indicates a ratio between a current flowing in a selected element (memory element to which data is written) and a current flowing in a non-selected element (memory element to which data is not written), in a data write operation. To enable the memory apparatus to operate suitably, the value of the ON/OFF ratio is desirably larger.

The reason why the current density of 500 A/cm$^2$ is used as a reference is that when the size of the electrode forming the current suppressing element is defined by the metal mask having circular holes having a diameter of 100 μm, the current required to actually flow a current with about 30000 A/cm$^2$ is about several A, which arises a need for a special measuring system for measuring the current.

As shown in FIG. 13, it can be seen from the experimental result in the case where the electrode material is TaN, that the ON/OFF ratio is a single-digit number and does not substantially change when the value of x is 0.1 or smaller, while the ON/OFF ratio is 10 or larger when the value of x is 0.2 or larger, and drastically increases as the value of x increases. It may be considered that the phenomenon that the ON/OFF ratio is a single-digit number and does not substantially change when the value of x is 0.1 or smaller occurs due to the fact that the electrodes and the current suppressing layer in the current suppressing element substantially form an ohmic contact when the value of x is 0.1 or smaller. Therefore, it may be considered that the ON/OFF ratio does not depend on the value of x, and is a small number, when the value of x is 0.1 and smaller. From the experimental result, it may be considered that the value of x is most desirably 0.2 or larger to enable the electric potential barrier formed between the electrodes and the current suppressing layer in the current suppressing element to exhibit a rectification property.

[Voltage-Current Characteristics of Nonvolatile Memory Element, Current Suppressing Element and Memory Cell]

Figure 14:
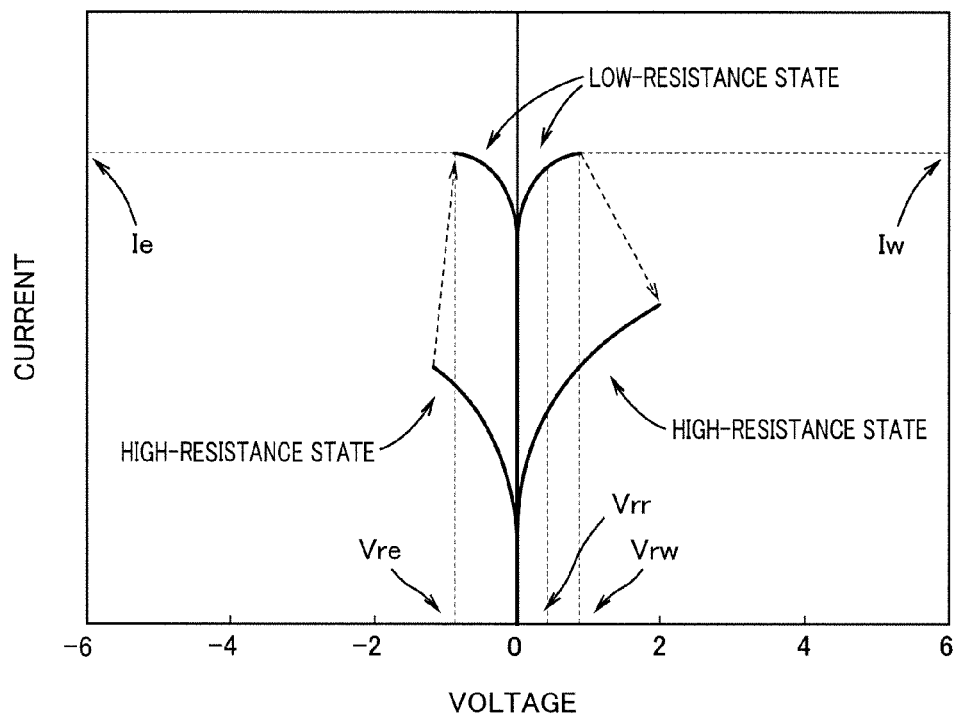
FIG. 14 is a view showing an example of a voltage-current characteristic of a nonvolatile memory element 129 according to Embodiment 1 of the present invention.

FIG. 14 is a view showing an example of a voltage-current characteristic of a nonvolatile memory element 129 according to Embodiment 1 of the present invention. In FIG. 14, the electric potential of the upper electrode 113 with respect to the inner electrode 115 is defined as a "voltage" applied to the nonvolatile memory element 129, and a current flowing between the two electrodes is defined as a "current" flowing in the nonvolatile memory element 129. In FIG. 14, a voltage is indicated by a linear axis and the absolute value of the current is indicated by a logarithmic axis. As shown in FIG. 14, the nonvolatile memory element 129 is a bipolar type resistance variable memory element. When a positive voltage is applied to the nonvolatile memory element 129 in the low-resistance state (e.g., about 100Ω), the nonvolatile memory element 129 switches to the high-resistance state (e.g., about 1 kΩ) at a time point (about 1V in FIG. 14). Thereafter, the resistance state will not change in response to the positive voltage applied. When a negative voltage is applied to the nonvolatile memory element 129 in the high-resistance state, the nonvolatile memory element 129 switches to the low-resistance state at a time point (about −1.2V in FIG. 14). Thereafter, the resistance state will not change in response to the negative voltage applied. The voltage and current immediately before the element switches from the low-resistance state to the high-resistance state are expressed as Vrw and Iw, respectively. The voltage and current immediately after the element has switched from the high-resistance state to the low-resistance state are expressed as −Vre and −Ie, respectively.

Figure 15:
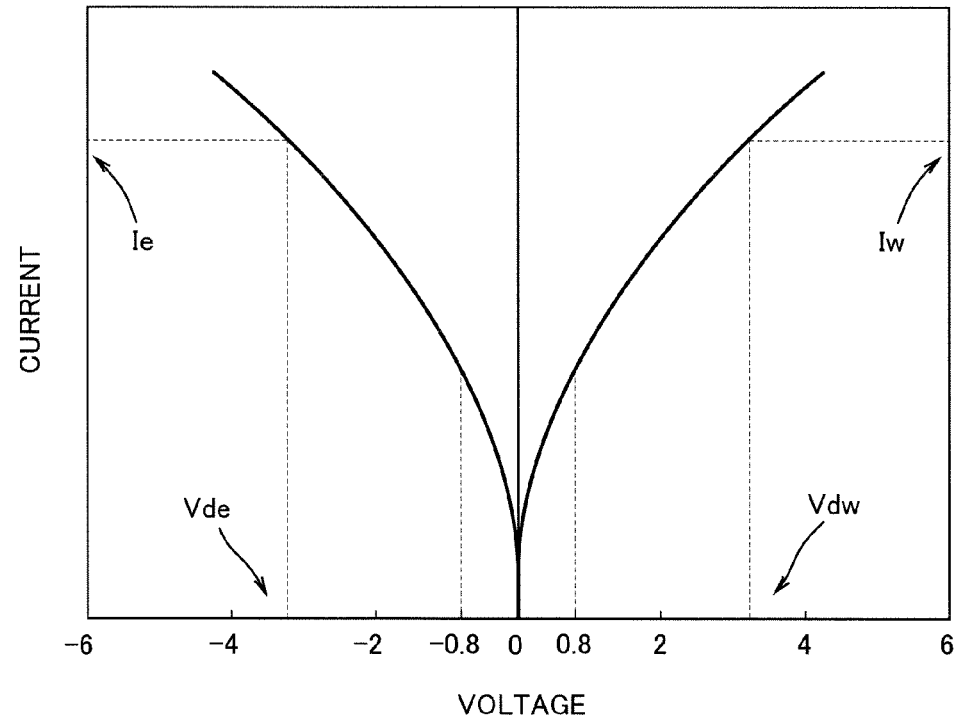
FIG. 15 is a view showing an example of a voltage-current characteristic of a current suppressing element 116 according to Embodiment 1 of the present invention.

FIG. 15 is a view showing an example of a voltage-current characteristic of the current suppressing element 116 according to Embodiment 1 of the present invention. In FIG. 15, the electric potential of the inner electrode 115 with respect to the lower electrode 117 is defined as the "voltage" applied to the current suppressing element 116 and a current flowing between the two electrodes is defined as a "current" flowing in the current suppressing element 116. In FIG. 15, a voltage is indicated by a linear axis and the absolute value of the current is indicated by a logarithmic axis. In this embodiment, it is supposed that the current suppressing element 116 has a property according to a formula (1) which is an approximation formula of a Schottky diode model illustrated below:

[Formula 1]

$$J = A^* T^2 \exp\left[-\frac{q}{\kappa_B T}\left(\phi_B - \sqrt{\frac{qV}{4\pi\varepsilon d}}\right)\right] \quad (1)$$

In formula (1), A* is Richardson constant, T is an absolute temperature, q is an electric charge amount, KB is a Boltzmann constant, $\Phi_B$ is a Schottky barrier, and $\in$ is a dielectric constant.

As shown in FIG. 15, the voltage-current characteristic of the current suppressing element 116 is non-linear. As shown, the resistance is high and a current does not substantially flow when the absolute value of the voltage is smaller than a predetermined threshold VF (threshold voltage is 0.8V in FIG. 15), but the resistance value drastically decreases and a large current flows when the absolute value exceeds VF (herein the voltage in the case where a current of 1 μA flows is the threshold VF). A normal diode conducts a current only unidirectionally, while the current suppressing element of this Embodiment has a feature that it conducts a current bidirectionally. That is, the current suppressing element has a characteristic in which the resistance value drastically decreases and the element conducts a large current, when the absolute value of the voltage applied to the both ends exceeds a predetermined threshold. The voltages applied to the current suppressing element 116 in the case where the currents are Iw and Ie are expressed as Vdw and −Vde, respectively. Whereas the magnitude of the current corresponding to the positive voltage and the magnitude of the current corresponding to the negative voltage are illustrated to be symmetric with respect to an axis of 0V in FIG. 15, they are not necessarily symmetric.

Figure 16:
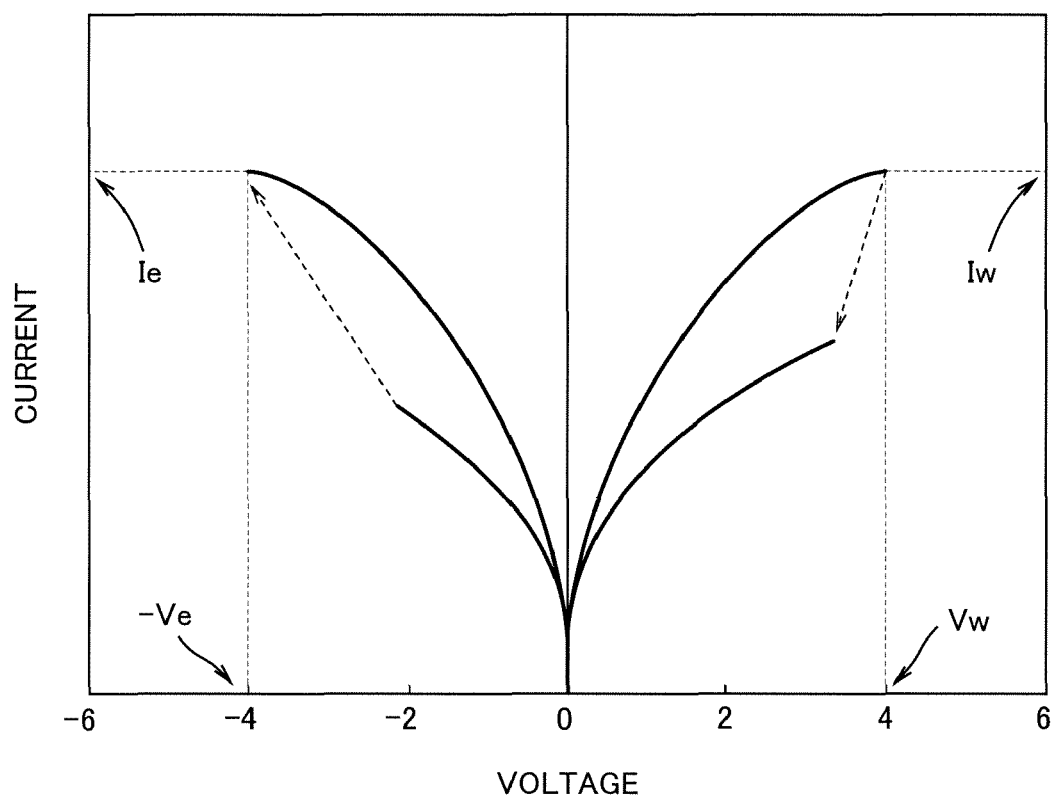
FIG. 16 is a view showing an example of a voltage-current characteristic of a memory cell 110 according to Embodiment 1 of the present invention.

FIG. 16 is a view showing an example of a voltage-current characteristic of the memory cell 110 according to Embodiment 1 of the present invention. In FIG. 16, the electric potential of the upper electrode 113 with respect to the lower electrode 117 is defined as a "voltage" applied to the memory cell 110 and a current flowing between the two electrodes is defined as a "current" flowing in the memory cell 110. In FIG. 16, a voltage is indicated by a linear axis and the absolute value of the current is indicated by a logarithmic axis. The voltage-current characteristic of the memory cell 110 is a composite of the voltage-current characteristic of the nonvolatile memory element 129 and the voltage-current characteristic of the current suppressing element 116. When the voltages applied to the memory cell 110 in the case where the currents are Iw and −Ie are Vw and −Ve, respectively, the following formulae are satisfied:

$$Vw = Vrw + Vdw \quad (2)$$

$$Ve = Vre + Vde \quad (3)$$

In FIG. 16, Iw and Ie are drawn as being substantially equal, but Iw and Ie do not necessary coincide with each other.

In this Embodiment, a predetermined voltage whose absolute value is larger than those of Vw and Ve is expressed as VP, and the voltage VP and the voltage −VP are applied to cause the nonvolatile memory element 129 included in the memory cell 110 to switch the resistance state. In this Embodiment, by causing "1" to correspond to the low-resistance state and "0" to correspond to the high-resistance state, data is stored. By applying the positive voltage VP, a predetermined voltage (high-resistance state attaining voltage) is applied to the both ends of the resistance variable layer 114, causing the nonvolatile memory element 129 in the low-resistance state to switch to the high-resistance state. Thus, "0" is written to the nonvolatile memory element 129. By applying the negative voltage −VP, a predetermined voltage (low-resistance state attaining voltage: different in polarity from the high-resistance state attaining voltage) is applied to the both ends of the resistance variable layer 114, causing the nonvolatile memory element 129 in the high-resistance state to switch to the low-resistance state. Thus, "1" is written to the nonvolatile memory element 129. The correspondence between the resistance states and the values may be reversed.

In this Embodiment, a predetermined voltage whose absolute value is smaller than those of Vw and Ve is expressed as Vrr, and by applying the voltage Vrr (or −Vrr), the resistance state is read from the nonvolatile memory element 129 included in the memory cell 110.

In the above, all of the reference symbols (Vw, Ie, etc) are described as having positive values. Of course, the absolute values and signs of the values of the variables may be suitably changed without departing from the essence of the invention.

[Configuration of Row Decoder/Driver]

Figure 17:
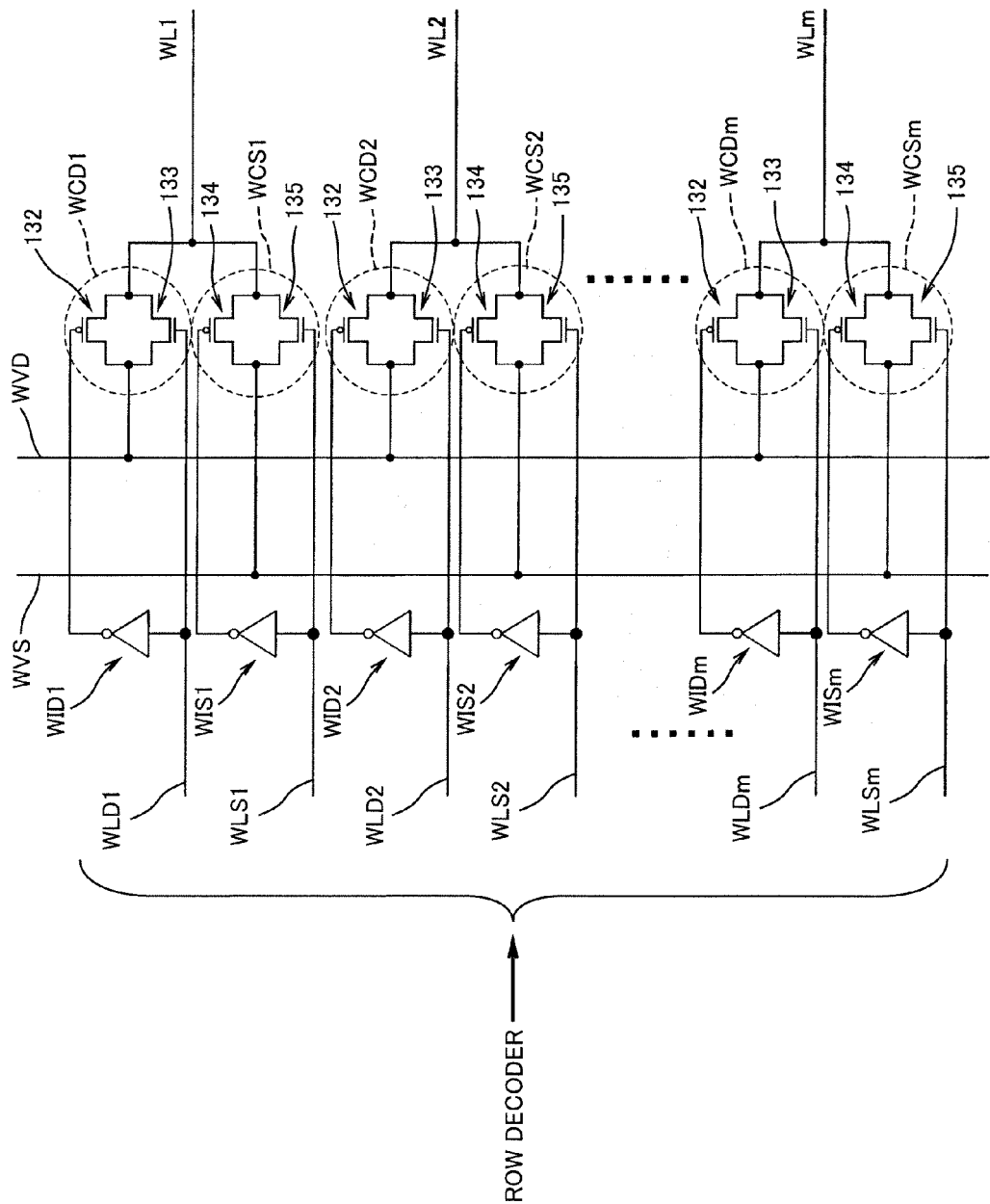
FIG. 17 is a circuit diagram showing an example of a circuit configuration of a driver portion of a row decoder/driver 103 according to Embodiment 1 of the present invention.

FIG. 17 is a circuit diagram showing an example of a circuit configuration of a driver portion of the row decoder/driver 103 according to Embodiment 1 of the present invention. As shown in FIG. 17, the driver portion of the row decoder/driver 103 includes non-select signal input lines WLD1, WLD2, ..., WLDm to which a non-select signal from the row decoder (not shown) is input, inverters WID1, WID2, ..., WIDm respectively connected to the non-select signal input lines WLD1, WLD2, ..., WLDm, a non-select voltage supply line WVD, non-select switch elements WCD1, WCD2, ..., WCDm (first non-select switch elements) which input the voltage applied to the non-select voltage supply line WVD to the word lines WL1, WL2, ..., WLm, respectively, select signal input lines WLS1, WLS2, ..., WLSm to which a select signal from the row decoder is input, inverters WIS1, WIS2, ..., WISm connected to the select signal input lines WLS1, WLS2, ..., WLSm, respectively, a select voltage supply line WVS, select switch elements WCS1, WCS2, ..., WCSm (first select switch elements) which input the voltage applied to the select voltage supply line WVS to the word lines WL1, WL2, ..., WLm, respectively.

The non-select voltage (V3 or V4) is supplied from the electric power supply circuit 119 and input to the non-select voltage supply line WVD via the switch 120. The select voltage (V1 or V2) is supplied from the electric power supply circuit 119 and input to the select voltage supply line WVS via the switch 120.

The non-select switch elements WCD1, WCD2, WCDm are CMOS switch elements. Each of the non-select switch elements WCD1, WCD2, ..., WCDm includes a P-channel transistor 132 and a N-channel transistor 133. The gates of the P-channel transistors 132 are connected to the non-select signal input lines WLD1, WLD2, ..., WLDm via the inverters WID1, WID2, ..., WIDm, respectively. The gates of the N-channel transistors 133 are directly connected to the non-select signal input lines WLD1, WLD2, ..., WLDm, respectively. One main terminals (drains or sources) of the P-channel transistors 132 and the N-channel transistors 133 are connected to the non-select voltage supply line WVD, while the other main terminals (sources or drains) are connected to the word lines WL1, WL2, ..., WLm, respectively.

The select switch elements WCS1, WCS2, ..., WCSm are CMOS switch elements. Each of the select switch elements WCS1, WCS2, ..., WCSm includes a P-channel transistor 134 and a N-channel transistor 135. The gates of the P-channel transistors 134 are connected to the select signal input lines WLS1, WLS2, ..., WLSm via the inverters WIS1, WIS2, ..., WISm, respectively. The gates of the N-channel transistors 135 are directly connected to the select signal input lines WLS1, WLS2, ..., WLSm, respectively. One main terminals (drains or sources) of the P-channel transistors 134 and the N-channel transistors 135 are connected to the non-select voltage supply line WVS, while the other main terminals (sources or drains) are connected to the word lines WL1, WL2, ..., WLm, respectively.

The row decoder controls the electric potential supplied to the select signal input line WLS and the electric potential supplied to the non-select signal input line WLD based on a row address signal received from the address input circuit 108 and an electric pulse received from the pulse generating circuit 118, and in accordance with the control of the write circuit 105.

Hereinafter, regarding the time period when the resistance variable memory apparatus 100 operates, the period (hereinafter referred to as pulse period) during which the pulse generating circuit 118 is outputting an electric pulse and the timing (non-pulse period) other than the pulse period will be respectively described. In the non-pulse period, the voltage supplied to the select signal input line WLS is placed at "L" and the voltage supplied to the non-select signal input line WLD is placed at "H." In the pulse period, the voltage supplied to the select signal input line WLS associated with the selected word line is placed at "H" and the voltage supplied to the non-select signal input line WLD associated with the selected word line is placed at "L." The voltage supplied to the select signal input line WLS associated with the non-selected word line is maintained at "L," and the voltage supplied to the non-select signal input line WLD associated with the non-selected word line is maintained at "H."

In the non-pulse period, the select switch element WCS is turned OFF and the non-select switch element WCD is turned ON, for each of the word lines. As a consequence, the non-select voltage (V3 or V4) is applied to each of the word lines.

In the pulse period, the select switch element WCS associated with the selected word line is turned ON and the associated non-select switch element WCD is turned OFF. As a result, the select voltage (V1 or V2) is applied to the selected word line via the select switch element WCS. The select switch element WCS associated with the non-selected word line is maintained in an OFF-state and the associated non-select switch element WCD is maintained in an ON-state. As a result, the non-select voltage (V3 or V4) continues to be applied to the non-selected word line via the non-select switch element WCD.

The reason why the CMOS is used is that the select voltage and the non-select voltage are output as they are without an electric potential drop in the transistor. By properly controlling the select voltage and the non-select voltage, transistors other than the CMOS may be used.

[Configuration of Column Decoder/Driver]

Figure 18:
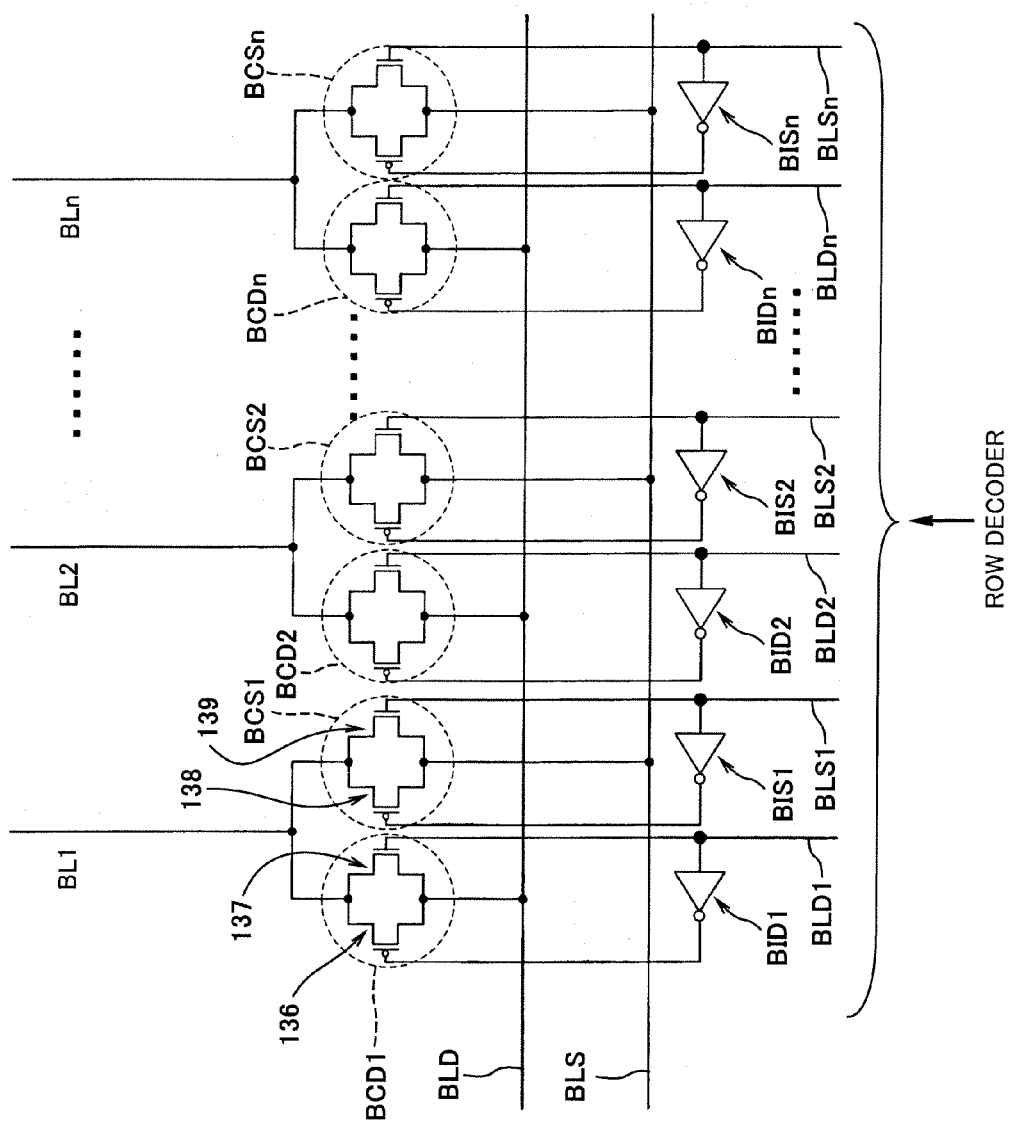
FIG. 18 is a circuit diagram showing an example of a circuit configuration of a driver portion of a column decoder/driver 104 according to Embodiment 1 of the present invention.

FIG. 18 is a circuit diagram showing an example of a circuit configuration of the driver portion of the column decoder/driver 104 according to Embodiment 1 of the present invention. As shown in FIG. 18, the driver portion of the column decoder/driver 104 includes non-select signal input lines BLD1, BLD2, ..., BLDn to which the non-select signal from the column decoder (not shown) is input, inverters BID1, BID2, ..., BIDn which are connected to the non-select signal input lines BLD1, BLD2, ..., BLDn, respectively, a non-select voltage supply line BVD, non-select switch elements BCD1, BCD2, ..., BCDn (second non-select switch elements) which input the voltage applied to the non-select voltage supply line BVD to the bit lines BL1, BL2, ..., BLn, respectively, select signal input lines BLS1, BLS2, ..., BLSn to which the select signal from the column decoder is input, inverters BIS1, BIS2, ..., BISn which are connected to the select signal input lines BLS1, BLS2, ..., BLSn, respectively, a select voltage supply line BVS, and select switch elements BCS1, BCS2, ..., BCSn (second select switch elements) which input the voltage applied to the select voltage supply line BVS to the bit lines BL1, BL2, ..., BLn, respectively.

The non-select voltage (V3 or V4) is supplied from the electric power supply circuit 119 and input to the non-select voltage supply line BVD via the switch 120. The select voltage (V1 or V2) is supplied from the electric power supply circuit 119 and input to the select voltage supply line BVS via the switch 120.

The non-select switch elements BCD1, BCD2, ..., BCDn are CMOS switch elements. Each of the non-select switch elements BCD1, BCD2, ..., BCDn includes a P-channel transistor 136 and a N-channel transistor 137. The gates of the P-channel transistors 136 are connected to the non-select signal input lines BLD1, BLD2, ..., BLDn via the inverters BID1, BID2, ..., BIDn, respectively. The gates of the N-channel transistors 137 are directly connected to the non-select signal input lines BLD1, BLD2, ..., BLDn, respectively. One main terminals (drains or sources) of the P-channel transistors 136 and the N-channel transistors 137 are connected to the non-select voltage supply line BVD, and the other main terminals (sources or drains) are connected to the bit lines BL1, BL2, ..., BLn, respectively.

The select switch elements BCS1, BCS2, ..., BCSn are CMOS switch elements. Each of the select switch elements BCS1, BCS2, ..., BCSn includes a P-channel transistor 138 and a N-channel transistor 139. The gates of the P-channel transistors 138 are connected to the select signal input lines BLS1, BLS2, ..., BLSn via the inverters BIS1, BIS2, ..., BISn, respectively. The gates of the N-channel transistors 139 are directly connected to the select signal input lines BLS1, BLS2, ..., BLSn, respectively. One main terminals (drains or sources) of the P-channel transistors 138 and the N-channel transistors 139 are connected to the non-select voltage supply line BVS, and the other main terminals (sources or drains) are connected to the bit lines BL1, BL2, ..., BLn, respectively.

The column decoder controls the electric potential supplied to the select signal input line BLS and the electric potential supplied to the non-select signal input line BLD based on a column address signal received from the address input circuit 108 and an electric pulse received from the pulse generating circuit 118, and in accordance with the control of the write circuit 105.

In the non-pulse period, the voltage supplied to the select signal input line BLS is placed at "L" and the voltage supplied to the non-select signal input line BLD is placed at "H." In the pulse period, the voltage supplied to the select signal input line BLS associated with the selected bit line is placed at "H" and the voltage supplied to the non-select signal input line BLD associated with the selected bit line is placed at "L." The voltage supplied to the select signal input line BLS associated with the non-selected bit line is maintained at "L," and the voltage supplied to the non-select signal input line BLD associated with the non-selected bit line is maintained at "H."

In the non-pulse period, the select switch element BCS is turned OFF and the non-select switch element BCD is turned ON, for each of the word lines. As a consequence, the non-select voltage (V3 or V4) is applied to each of the word lines.

In the pulse period, the select switch element BCS associated with the selected bit line is turned ON and the associated non-select switch element BCD is turned OFF. As a result, the select voltage (V1 or V2) is applied to the selected bit line via the select switch element BCS. The select switch element BCS associated with the non-selected bit line is maintained in an OFF-state and the associated non-select switch element BCD is maintained in an ON-state. As a result, the non-select voltage (V3 or V4) continues to be applied to the non-selected bit line via the non-select switch element BCD.

The reason why the CMOS is used is that the select voltage and the non-select voltage are output as they are without an electric potential drop in the transistor. By properly controlling the select voltage and the non-select voltage, transistors other than the CMOS may be used.

[Configuration of Electric Power Supply Circuit]

Figure 19:
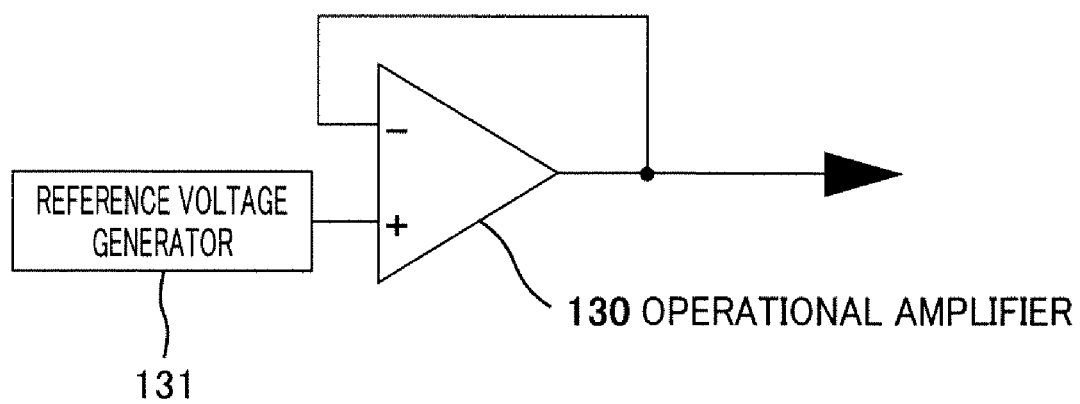
FIG. 19 is a circuit diagram showing an example of a circuit configuration of a first electric power supply 121.

FIG. 19 is a circuit diagram showing an example of a circuit configuration of the first electric power supply 121. As shown in FIG. 19, the first electric power supply 121 includes an operational amplifier 130 and a reference voltage generator 131. The reference voltage generator 131 is configured to output a first voltage V1 as a reference voltage by a well-known method. The output of the reference voltage generator 131 is connected to one of the inputs of the operational amplifier 130, and the output of the operational amplifier 130 is input (fed-back) to the other input terminal of the operational amplifier 130, attaining an electric power supply (constant voltage electric power supply) whose voltage is equal to the reference voltage output from the reference voltage generator 131.

The second electric power supply 122, the third electric power supply 123, and the fourth electric power supply 124 can have a similar configuration by properly controlling the voltages output from reference voltage generators.

In the first electric power supply 121, the second electric power supply 122, the third electric power supply 123, and the fourth electric power supply 124, the voltages V1, V2, V3, and V4 output from their respective reference voltage generators are different in magnitude from each other. In addition, the value of each of V1 to V4 is different according to the operation mode (as described later). For example, plural values may be set for V1, and a specified value may be selected from among the plural values according to the operation mode using a switching element and the like in accordance with the control of the control circuit 109. As a setting method of the voltage, well-known methods such as a method using a voltage control circuit for mask-controlling the voltage or a voltage control circuit for fuse-controlling the voltage may be employed. In general, the illustrated voltage control circuit is built into the reference voltage generator 131. The first electric power supply 121, the second electric power supply 122, the third electric power supply 123, and the fourth electric power supply 124 may be configured to switch their output voltages. Each of the first electric power supply 121, the second electric power supply 122, the third electric power supply 123, and the fourth electric power supply 124 may include plural voltage generators.

[Operation]

Figure 20:
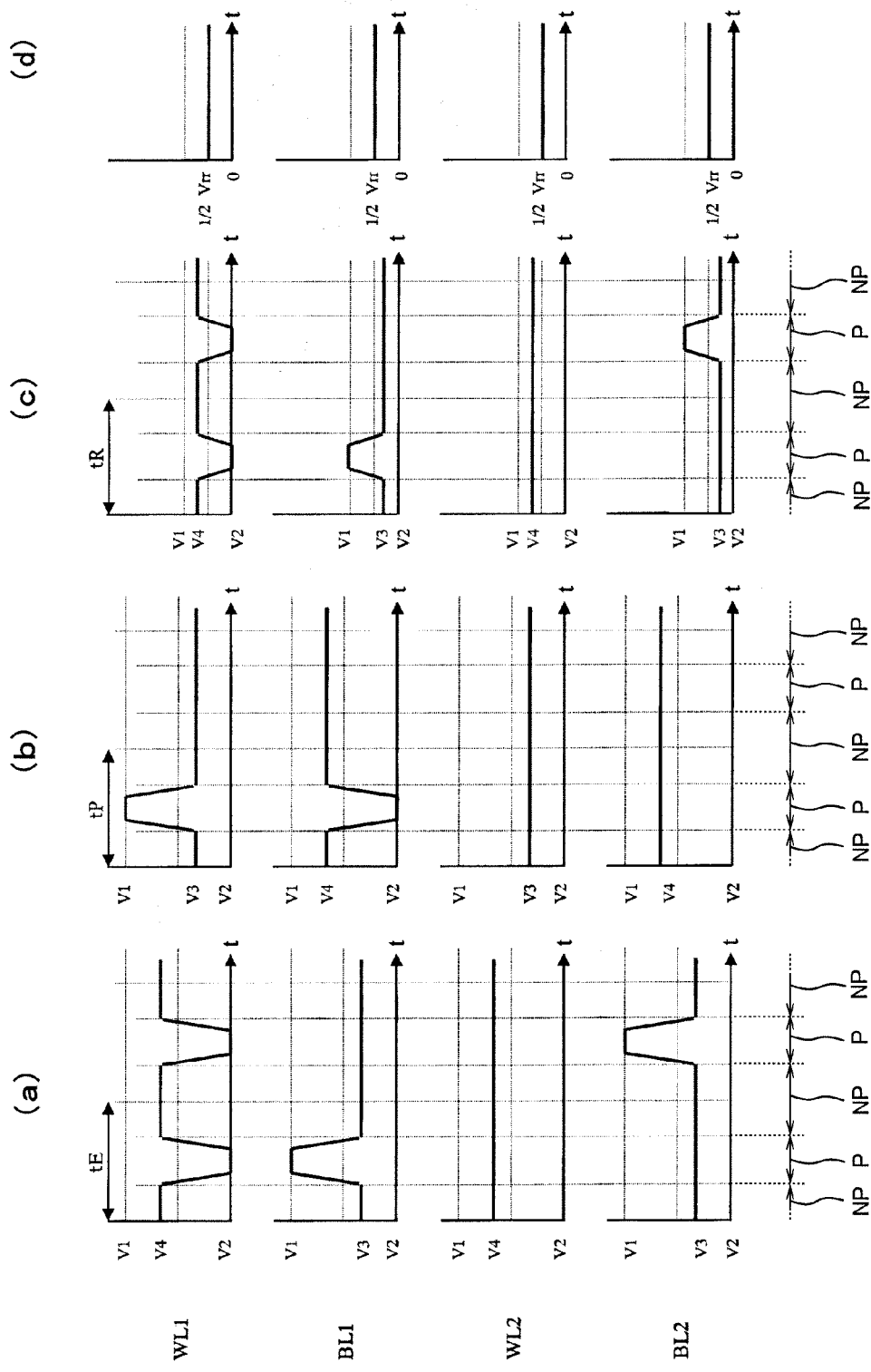
FIG. 20 is a timing chart showing an example of voltages applied to word lines and to bit lines in Embodiment 1 of the present invention.

FIG. 20 is a timing chart showing an example of the voltages applied to the word lines and the bit lines in Embodiment 1 of the present invention, and 20(*a*) to 20(*d*) show operation modes in which FIG. 20(*a*) shows an erase mode, FIG. 20(*b*) shows a program mode, FIG. 20(*c*) shows a read mode, and FIG. 20(*d*) shows a stand-by mode.

Hereinafter, the operation of the resistance variable memory apparatus 100 of this Embodiment will be described with reference to the drawings.

1. Data Write Operation

Data write operation will be described hereinafter. In this Embodiment, the data write operation is carried out by sequentially executing writing in two operation modes, i.e., writing in the erase mode and writing in the program mode. In the erase mode, the resistance states of the memory cells to which data is to be written are reset to the high-resistance state ("0"). Thereafter, in the program mode, the electric pulse is applied only to memory cells to which the low-resistance state ("1") is to be written, causing these memory cells to switch their resistance states to the low-resistance state. Thus, writing of data is completed.

In this Embodiment, V1 to V4 satisfy the following formulae in the data write operation. In the formulae, variables indicate voltages and are values of 0 or larger.

$$V1 > V2 \quad (4)$$

$$V1 - V2 = VP \quad (5)$$

$$VP > Vw \quad (6)$$

$$VP > Ve \quad (7)$$

$$V4 > V3 \quad (8)$$

$$V4 - V2 = (2/3) \times VP \quad (9)$$

$$V3 - V2 = (1/3) \times VP \quad (10)$$

In the data write operation, V1 to V4 are set in accordance with the control of the control circuit 109 to satisfy the above formula. Formula (5) defines VP. VP is defined as the difference between V1 and V2 in the erase mode and in the program mode. As can be seen from formula (6) and formula (7), the absolute value of VP is set to the voltage which is sufficiently larger than those of Vw and Ve, to enable the nonvolatile memory element 129 to surely switch its resistance state.

(1) Erase Mode

In the data write operation, initially, a signal indicating entry into the erase mode is input from an external controller to the control circuit 109. The control circuit 109 controls the first electric power supply 121, the second electric power supply 122, the third electric power supply 123, and the fourth electric power supply 124 so that V1 to V4 satisfy the above identified conditions, and then controls the switch 120. The first electric power supply 121 is connected to the select voltage supply line BVS of the column decoder/driver 104. The second electric power supply 122 is connected to the select voltage supply line WVS of the row decoder/driver 103. The third electric power supply 123 is connected to the non-select voltage supply line BVD of the column decoder/driver 104. The fourth electric power supply 124 is connected to the non-select voltage supply line WVD of the row decoder/driver 103. The set state of the switch 120 is maintained to be constant throughout the erase mode.

When switching of the switch 120 completes, the addresses of the memory cells to which data is to be written are sequentially input from the external controller to the address input circuit 108. In synchronization with the inputting of the addresses, the control circuit 109 controls the pulse generating circuit 118 to input a write pulse to the row decoder/driver 103 and to the column decoder/driver 104. The cycle time of the write pulse in the erase mode is tE.

The address input circuit 108 inputs row address data and column address data to the row decoder/driver 103 and to the column decoder/driver 104, respectively, based on the addresses input.

In the erase mode, the write circuit 105 is controlled by the control circuit 109 to always input a signal for causing application of a write voltage to the row decoder/driver 103 and to the column decoder/driver 104.

In the non-pulse period, the row decoder of the row decoder/driver 103 turns ON the non-select switch elements WCD1, WCD2, . . . , WCDn and turns OFF the select switch elements WCS1, WCS2, . . . , WCSn, for all of the word lines. With such an operation, in the non-pulse period, all of the word lines are connected to the fourth electric power supply 124 via the non-select voltage supply line WVD. As a result, the voltage V4 is supplied to all of the word lines.

In the pulse period, the row decoder of the row decoder/driver 103 turns OFF the non-select switch element WCD associated with only the selected word line (word line associated with the row address received from the address input circuit 108) and turns ON the associated select switch element WCS. With such an operation, in the pulse period, the selected word line is connected to the second electric power supply 122 via the select voltage supply line WVS. As a result, the second voltage V2 is supplied only to the selected word line.

In the non-pulse period, the column decoder of the column decoder/driver 104 turns ON the non-select switch elements BCD1, BCD2, . . . , BCDn and turns OFF the select switch elements BCS1, BCS2, . . . , BCSn, for all of the bit lines. With such an operation, in the non-pulse period, all of the bit lines are connected to the third electric power supply 123 via the non-select voltage supply line BVD. As a result, the third voltage V3 is supplied to all of the bit lines.

In the pulse period, the column decoder of the column decoder/driver 104 turns OFF the non-select switch element BCD associated with only the selected bit line (bit line associated with the column address received from the address input circuit 108) and turns ON the associated select switch element BCS. With such an operation, in the pulse period, the selected bit line is connected to the first electric power supply 121 via the select voltage supply line WVS. As a result, the first voltage V1 is supplied only to the selected bit line.

With the above operation, in the erase mode, for all of the memory cells 110 to which data is to be written, V2 is supplied to the associated word lines, and at the same time, V1 is supplied to the associated bit lines, sequentially. As a result, the positive voltage VP is applied to the memory cells 110, causing the nonvolatile memory elements 129 to switch from the low-resistance state to the high-resistance state ("0" is written). When all of the memory cells to which data is to be written completes switching to the high-resistance state, the erase mode terminates.

FIG. 20(a) shows a case where written data is sequentially erased from ("0" is written to) the memory cell MC11 and the memory cell MC21. As shown in FIG. 20(a), in the non-pulse period, V4 is applied to the word line WL and V3 is applied to the bit line BL. In the pulse period, V2 is applied to the selected word line (WL1 associated with MC11 and MC21) and V1 is applied to the selected bit lines (BL1 associated with MC11 and BL2 associated with MC21). In the pulse period, the voltage applied to the non-selected word line (WL2 associated with MC11 and MC21) and the voltage applied to the non-selected bit lines (BL2 associated with MC11 and BL1 associated with MC21) are maintained at V4 and V3, respectively, and do not change. With such an operation, the voltage VP is applied to the memory cell MC11 and to the memory cell MC21, sequentially, causing the memory cells to switch to the low-resistance state.

In this Embodiment, the nonvolatile memory element 129 is so-called overwritable. That is, if the positive voltage VP is applied to the nonvolatile memory element 129 in the high-resistance state, its resistance value does not change. When the negative voltage −VP is applied to the nonvolatile memory element 129 after the positive voltage VP is applied continuously, the memory element 129 surely switches to the low-resistance state. Because of such a characteristic, reading in advance is unnecessary. Overwriting cannot be sometimes performed depending on the characteristic of the nonvolatile memory element 129. In this case, it is sufficient that a predetermined electric pulse is applied only in the case where it is necessary to read data in advance and to switch the resistance state. In either case, the present invention is effective.

(2) Program Mode

When the erase mode terminates, a signal indicating entry into the program mode is input from the external controller to the control circuit 109. The control circuit 109 controls the switch 120. The first electric power supply 121 is connected to the select voltage supply line WVS of the row decoder/driver 103. The second electric power supply 122 is connected to the select voltage supply line BVS of the column decoder/driver 104. The third electric power supply 123 is connected to the non-select voltage supply line WVD of the row decoder/driver 103. The fourth electric power supply 124 is connected to the non-select voltage supply line BVD of the column decoder/driver 104. The set state of the switch 120 is maintained to be constant throughout the program mode. The output voltages (V1 to V4) of the electric power supply circuit 109 are identical to those in the erase mode.

When switching of the switch 120 completes, the addresses of the memory cells to which data is to be written are sequentially input from the external controller to the address input circuit 108. In synchronization with inputting of the addresses, the control circuit 109 controls the pulse generating circuit 118 to input a write pulse to the row decoder/driver 103 and to the column decoder/driver 104. The cycle time of the write pulse in the program mode is tP. tP is not necessarily equal to tE.

The address input circuit 108 inputs row address data and column address data to the row decoder/driver 103 and to the column decoder/driver 104, respectively, based on the addresses input.

In the program mode, the write circuit 105 receives write data from the external controller via the data input/output circuit 107. The write circuit 105 outputs a signal for causing application of a write voltage to the row decoder/driver 103 and to the column decoder/driver 104 only when the write data is "1" (only when the resistance state of the nonvolatile memory element included in the selected memory cell is to be switched to the low-resistance state).

In the non-pulse period, for all of the word lines, the row decoder of the row decoder/driver 103 turns ON the non-select switch elements WCD1, WCD2, ... , WCDn and tunes OFF the select switch elements WCS1, WCS2, ... , WCSn. With such an operation, in the non-pulse period, all of the word lines are connected to the third electric power supply 123 via the non-select voltage supply line WVD. As a result, the third voltage V3 is supplied to all of the word lines.

In the pulse period, the row decoder of the row decoder/driver 103 turns OFF the non-select switch element WCD associated with only the selected word line and turns ON the associated select switch element WCS, when the signal for causing application of the write voltage is received from the write circuit 105. With such an operation, only when "1" is to be written to the associated memory cell (only when the resistance state of the associated nonvolatile memory element is to be switched), the selected word line is connected to the first electric power supply 121 via the select voltage supply line WVS and the first voltage V1 is supplied to the selected word line.

In the non-pulse period, the column decoder of the column decoder/driver 104 turns ON the non-select switch elements BCD1, BCD2, ... , BCDn and turns OFF the select switch elements BCS1, BCS2, ..., BCSn, for all of the bit lines. With such an operation, in the non-pulse period, all of the bit lines are connected to the fourth electric power supply 124 via the non-select voltage supply line BVD. As a result, the fourth voltage V4 is supplied to all of the bit lines.

In the pulse period, the column decoder of the column decoder/driver 104 turns OFF the non-select switch element BCD associated with only the selected bit line and turns ON the associated select switch element BCS, when a signal for causing application of the write voltage is received from the write circuit 105. With such an operation, the selected bit line is connected to the second electric power supply 122 via the select voltage supply line WVS, and the second voltage V2 is supplied to the selected bit line, only when "1" is to be written to the associated memory cell.

With the above operation, in the program mode, V1 is supplied sequentially to the word lines associated with only the memory cells 110 to which "1" is to be written and at the same time, V2 is supplied sequentially to the associated bit lines. As a result, the negative voltage −VP is applied to the memory cells 110, causing the nonvolatile memory elements 129 to switch from the high-resistance state to the low-resistance state ("1" is written). When all of the memory cells to which "1" is to be written completes switching to the low-resistance state, the program mode terminates, and the write operation completes.

FIG. 20(b) shows a case where "1" is written to the memory cell MC11 and "0" is written to the memory cell MC21. As shown in FIG. 20(b), in the non-pulse period, V3 is applied to the word line WL and V4 is applied to the bit line BL. Initially, the memory cell MC11 will be examined. In the pulse period, V1 is applied to the selected word line (WL1) and V2 is applied to the selected bit line (BL1). In the pulse period, the voltage applied to the non-selected word line (WL2) and the voltage applied to the non-selected bit line (BL2) are maintained at V3 and V4, respectively, and do not change. With such an operation, the voltage VP is applied to the memory cell MC11, causing the memory cell MC11 to switch to the high-resistance state.

The memory cell MC12 will be examined. At a timing when data is written to the memory cell MC12, "0" is input to as write data. When "0" is input, a signal for causing application of a write voltage is not input to the row decoder/driver 103 and to the column decoder/driver 104, from the write circuit 105. The row decoder of the row decoder/driver 103 and the column decoder of the column decoder/driver 104 respectively do not turn ON the select switch elements WCS and BCS even when the write pulse is received from the pulse generating circuit 118. With such an operation, the voltage VP is not applied to the memory cell MC21 and the memory cell MC11 maintains the low-resistance state and does not change.

"1" may be written to all of the memory cells to which data is to be written in the erase mode, and "0" may be written to all of the memory cells to which "0" is to be written in the program mode.

2. Data Read Operation

The data read operation (read mode) will be described. In this Embodiment, V1 to V4 satisfy the following formulae in the data read operation. In the formulae, variables indicate voltages and are values of 0 or larger.

$$V1 > V2 \tag{11}$$

$$V1 - V2 = Vrr \tag{12}$$

$$Vrr < Vw \tag{13}$$

$$Vrr < Ve \tag{14}$$

$$V4 > V3 \tag{15}$$

$$V4 - V2 = (2/3) \times Vrr \tag{16}$$

$$V3 - V2 = (1/3) \times Vrr \tag{17}$$

In the data read operation, V1 to V4 are set in accordance with the control of the control circuit 109 to satisfy the above formulae. Formula (12) defines Vrr. Vrr is defined as the difference between V1 and V2 in the read mode. Vrr is the voltage applied to the memory cell 110 in reading. As can be seen from formula (13) and formula (14), the absolute value of Vrr is set to the voltage which is sufficiently smaller than those of Vw and Ve so that resistance state of the nonvolatile memory element 129 will not switch.

In the data read operation, initially, a signal indicating entry into the data read mode is input from the external controller to the control circuit 109. The control circuit 109 controls the first electric power supply 121, the second electric power supply 122, the third electric power supply 123, and the fourth electric power supply 124 so that V1 to V4 satisfy the above identified conditions, and then controls the switch 120. The first electric power supply 121 is connected to the select voltage supply line BVS of the column decoder/driver 104. The second electric power supply 122 is connected to the select voltage supply line WVS of the row decoder/driver 103. The third electric power supply 123 is connected to the non-select voltage supply line BVD of the column decoder/driver 104. The fourth electric power supply 124 is connected to the non-select voltage supply line WVD of the row decoder/driver 103. The set state of the switch 120 is maintained to be constant throughout the data read mode.

When switching of the switch 120 completes, the addresses of the memory cells from which data is to be read are sequentially input from the external controller to the address input circuit 108. In synchronization with inputting of the addresses, the control circuit 109 controls the pulse generating circuit 118 to output a read pulse to the row decoder/driver 103 and to the column decoder/driver 104. The cycle time of the read electric pulse (read pulse) in the read mode is tR. tR is not necessarily equal to tE or tP. In this Embodiment, the read pulse is input externally.

The address input circuit 108 outputs row address data and column address data to the row decoder/driver 103 and to the column decoder/driver 104, respectively, based on the addresses input.

In the read mode, the write circuit 105 is controlled by the control circuit 109 to always input a signal for causing application of a read voltage to the row decoder/driver 103 and to the column decoder/driver 104.

In the non-pulse period, the row decoder of the row decoder/driver 103 turns ON the non-select switch elements WCD1, WCD2, . . . , WCDn and turns OFF the select switch elements WCS1, WCS2, . . . , WCSn, for all of the word lines. With such an operation, in the non-pulse period, all of the word lines are connected to the fourth electric power supply 124 via the non-select voltage supply line WVD. As a result, the fourth voltage V4 is supplied to all of the word lines.

In the pulse period, the row decoder of the row decoder/driver 103 turns OFF the non-select switch element WCD associated with only the selected word line and turns ON the associated select switch element WCS. With such an operation, in the pulse period, the selected word line is connected to the second electric power supply 122 via the select voltage supply line WVS. As a result, the second voltage V2 is supplied only to the selected word line.

In the non-pulse period, the column decoder of the column decoder/driver 104 turns ON the non-select switch elements BCD1, BCD2, . . . , BCDn and turns OFF the select switch elements BCS1, BCS2, . . . , BCSn, for all of the bit lines. With such an operation, in the non-pulse period, all of the bit lines are connected to the third electric power supply 123 via the non-select voltage supply line BVD. As a result, the third voltage V3 is supplied to all of the bit lines.

In the pulse period, the column decoder of the column decoder/driver 104 turns OFF the non-select switch element BCD associated with only the selected bit line and turns ON the associated select switch element BCS. With such an operation, in the pulse period, the selected bit line is connected to the first electric power supply 121 via the select voltage supply line WVS. As a result, the first voltage V1 is supplied only to the selected bit line.

With such an operation, in the read mode, V2 is supplied sequentially to the word lines associated with all of the memory cells 110 from which data is to be read, and at the same time, V1 is supplied sequentially to the associated bit lines. As a result, the positive voltage Vrr is applied to the memory cells 110, and a predetermined current flows in the selected bit lines according to the resistance states of the nonvolatile memory elements 129. The sense amplifier 106 determines whether the values written in the selected memory cells 110 are "1" or "0" based on the current. The determination result is output to outside via the data input/output circuit 107. When the data reading for all of the memory cells from which data is to be read, completes, the read mode terminates.

FIG. 20(c) shows a case where data is read sequentially from the memory cells MC11 and MC21. As shown in FIG. 20(c), in the non-pulse period, V4 is applied to the word line WL and V3 is applied to the bit line BL. In the pulse period, V2 is applied to the selected word line (WL1 associated with MC11 and MC21) and V1 is applied to the selected bit lines (BL1 associated with MC11, BL2 associated with MC21). In the pulse period, the voltage applied to the non-selected word line (WL2 associated with MC11 and MC21) and the voltage applied to the non-selected bit lines (BL2 associated with MC11 and BL1 associated with MC21) are maintained at V4 and V3, respectively, and do not change. With such an operation, the voltage Vrr is applied to the memory cell MC11 and to the memory cell MC21, sequentially, and the sense amplifier 106 reads data.

3. Stand-By Operation

The stand-by operation will be descried hereinafter. In this Embodiment, V1 to V4 satisfy the following formulae in the stand-by operation. In the formulae, variables indicate voltages and are values of 0 or larger.

$$V1 = (\tfrac{1}{2}) \times Vrr \tag{18}$$

$$V2 = (\tfrac{1}{2}) \times Vrr \tag{19}$$

$$V3 = (\tfrac{1}{2}) \times Vrr \tag{20}$$

$$V4 = (\tfrac{1}{2}) \times Vrr \tag{21}$$

In the stand-by operation, V1 to V4 are set to satisfy the above formulae under control of the control circuit 109. Vrr may be set to the value equal to the value of Vrr in the read mode.

When data writing and data reading are unnecessary, a signal indicating entry into the stand-by mode is input from the external controller to the control circuit 109. The control circuit 109 sets the output voltage of the electric power supply circuit 119 to the values satisfying the above conditions.

In the stand-by mode, inputting of the addresses and data is not performed. The electric potentials of all of the word lines and all of the bit lines are maintained at ($\tfrac{1}{2}$)×Vrr.

FIG. 20(d) indicates the electric potentials of the word lines WL1 and WL2 and the bit lines BL1 and BL2 in the stand-by mode. As shown in FIG. 20(d), in the stand-by mode, the electric potentials of all of the word lines and all of the bit lines are ($\tfrac{1}{2}$)×Vrr and are constant.

[Advantage]

Figure 21:
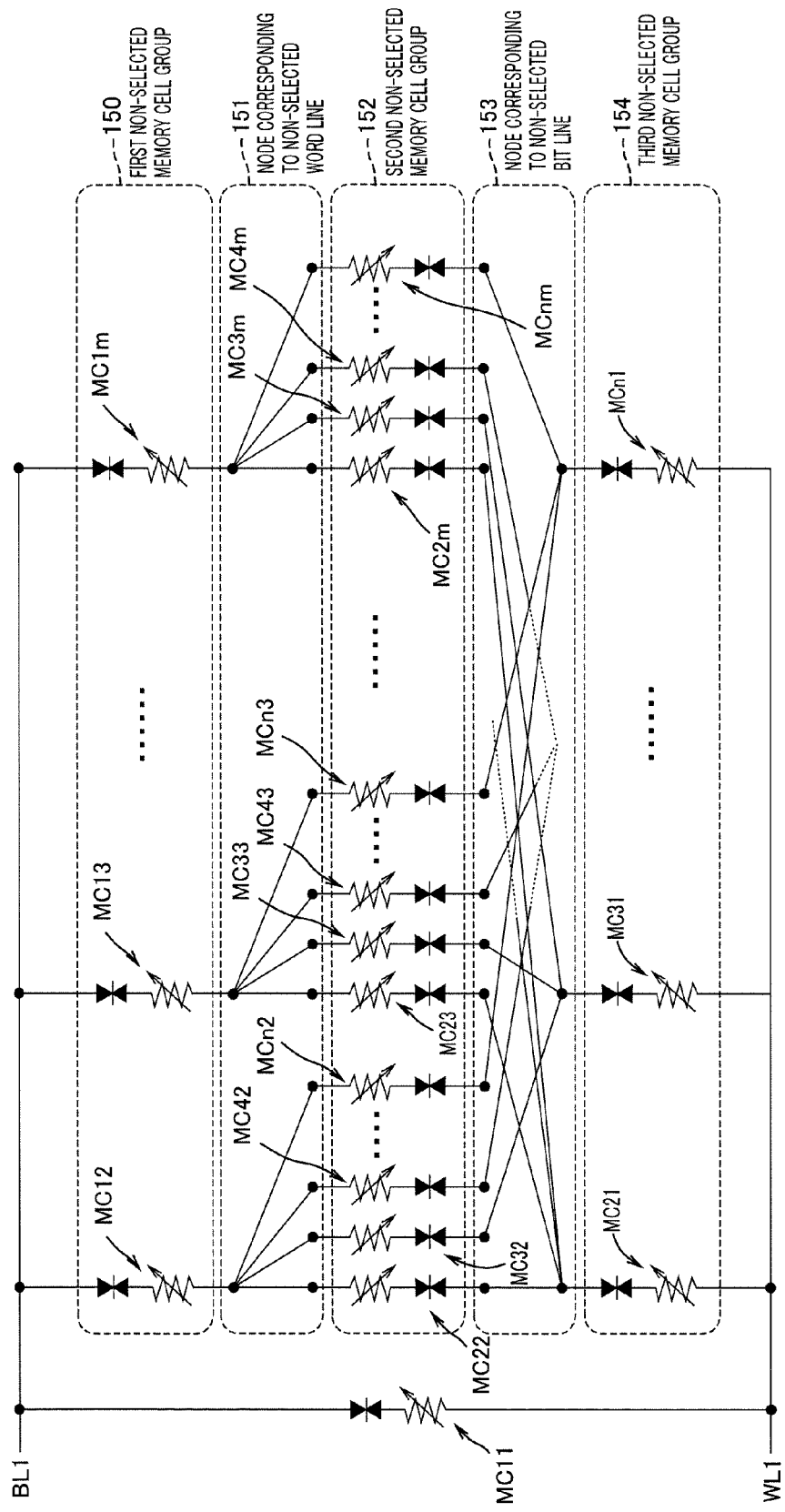
FIG. 21 is an equivalent circuit diagram of a memory array 102 in a case where a memory cell MC11 connected to a bit line BL1 and to a word line WL1 is selected in Embodiment 1 of the present invention.

FIG. 21 is an equivalent circuit diagram of a memory array 102 in a case where the memory cell MC11 connected to the bit line BL1 and to the word line WL1 is selected in Embodiment 1 of the present invention. Hereinafter, the advantages achieved by the configuration in this Embodiment will be described with reference to the drawings.

As shown in FIG. 21, the selected memory cell MC11 connects the bit line BL1 to the word line WL1. However, there are many paths connecting the bit line BL1 to the word line WL1, other than a path (hereinafter referred to as a main path) extending by way of only one memory cell MC11. Hereinafter, the paths other than the main path will be described.

The memory cells connected to the bit line BL1 are memory cells MC12, MC13, . . . , MC1m corresponding to cross points between the bit line BL1 and the word line WLi (i=2 to m), in addition to the memory cell MC11. These memory cells are hereinafter referred to as a first non-selected memory cell group 150. The number of memory cells belonging to the first non-selected memory cell group 150 is (m−1).

The memory cells connected to the word line WL1 are memory cells MC21, MC31, . . . , MCn1 corresponding to cross points between the word line WL1 and the bit line WLj (j=2 to n), in addition to the memory cell MC11. These memory cells are hereinafter referred to as a third non-selected memory cell group 154. The number of the memory cells belonging to the third non-selected memory cell group 154 is (n−1).

When a memory cell extracted from the first non-selected memory cell group 150 is expressed as MC1i and a memory cell extracted from the third non-selected memory cell group 154 is expressed as a memory cell MCj1, a memory cell MCji is specified so as to correspond to the cross point between the word line WLi to which the memory cell MC1i is connected and the bit line BLj to which the memory cell j 1 is connected. The memory cells MCji are hereinafter referred to as a second non-selected memory cell group 152. The number of memory cells belonging to the second non-selected memory cell group 152 is (m−1)×(n−1).

The paths (hereinafter referred to as sub-paths) connecting the bit line BL1 to the word line WL1 and extending by way of three memory cells are provided such that one path corresponds to one memory cell of the second non-selected memory cell group 152. The sub-path connects the bit line BL1, the memory cell MC1i, the word line WLi (node 151 corresponding to the non-selected word line), the memory cell MCji, the bit line BLj (node 153 corresponding to the non-selected bit line), the memory cell MCj1, and the word line WL1 in this order. The number of sub-paths is (m−1)×(n−1).

This will be described more specifically below. It is supposed that the memory cell MC12 is extracted from the first non-selected memory cell group 150. Also, it is supposed that the memory cell MC31 is extracted from the third non-selected memory cell group 154. The memory cell MC12 is connected to the word line WL2. The memory cell 31 is connected to the bit line BL3. The memory cell MC32 belonging to the second non-selected memory cell group 152 is specified to correspond to the word line WL2 and the bit line BL3. There is a path connecting the bit line BL1 to the word line WL1 for one set of the three memory cells MC12, MC32, and MC31. That is, there is a path connecting the bit line BL1, the memory cell MC12, the word line WL2, the memory cell MC32, the bit line BL3, the memory cell MC31, and the word line WL1 in this order.

Consider the resistance value of each path and a current flowing in each path. It is supposed that wire resistance and electrode resistance are negligible. The resistance value of each path is equal to a total of the resistance value of the nonvolatile memory element 129 and the resistance value of current suppressing element 116 included in the memory cell. As shown in FIG. 15, the resistance value of the current suppressing element 116 included in each memory cell is different according to the voltage applied to the current suppressing element 116. The voltage applied to the current suppressing element 116 is different depending on the resistance state of the nonvolatile memory element 129, and is therefore difficult to specify specifically. However, it should be noted that the resistance value of the current suppressing element 116 is not infinite even if the voltage applied to the current suppressing element 116 is low, and a minute current flows in the current suppressing element 116, as shown in FIG. 15.

Typically, the resistance value of the main path is the smallest among the resistance values of the respective paths. However, in a case where the nonvolatile memory element 129 of the memory cell MC11 included in the main path is in the high-resistance state and the nonvolatile memory elements 129 included in the sub-paths are all in the low-resistance state, the resistance value of the sub-paths may not be relatively high as compared to the resistance value of the main path. The voltage applied to the current suppressing elements 116 included in the sub-paths is smaller than that of the current suppressing element 116 included in the main path, and the resistance values of the current suppressing elements 16 included in the sub-paths are higher. As a result, the resistance values of the sub-paths are relatively high. However, since such an effect is incomplete as described above, a current flows in the sub-paths to some extent. The number of the sub-paths is (m−1)×(n−1). As the memory array 102 increases in scale, the sub-paths increases in number, so that the current flowing in the sub-paths is not negligible.

There may be paths each extending by way of five or more memory cells. The resistance values of these paths are higher and the currents flowing therein are smaller than those of the paths each extending by way of three memory cells. Hereinafter, the path extending by way of five or more memory cells will not be taken into account.

Hereinafter, the write operation and the read operation for the memory cell MC11 will be described, by way of example.

When data is written to the memory cell MC11, it is necessary to apply a predetermined voltage to the memory cell MC11 and to flow a current therein. The current flowing between the word line WL1 and the bit line BL1 is a sum of the current flowing in the main path and the currents flowing in the sub-paths. If there are many sub-paths, the currents flowing in the sub-paths are not negligible. If the currents flowing in the sub-paths are not negligible, then the capacities of the select electric power supplies (first electric power supply 121 and second electric power supply 122) for writing data, response speeds and the like, are insufficient, leading to a situation where a sufficient voltage cannot be applied to the memory cell MC11. This arises a problem that reliability of the write operation is reduced.

When written data is read from the memory cell MC11, it is necessary to apply a predetermined voltage to the memory cell MC11 and to detect a current flowing in the memory cell MC11 (or main path). The current flowing between the word line WL1 and the bit line BL1 is a sum of the current flowing in the main path and the currents flowing in the sub-paths. If there are many sub-paths, the currents flowing in the sub-paths are not negligible. As a result, the current flowing in the main path cannot be detected accurately, causing a problem that reliability of the read operation is reduced, for example.

Consider a case where the voltage applied to the selected bit line is expressed as VB, the voltage applied to the selected word line is expressed as VW, and a voltage (VB+VW)/2 (hereinafter referred to as an intermediate voltage) which is just an average of VB and VW is applied to the non-selected bit line and to the non-selected word line.

Figure 22:
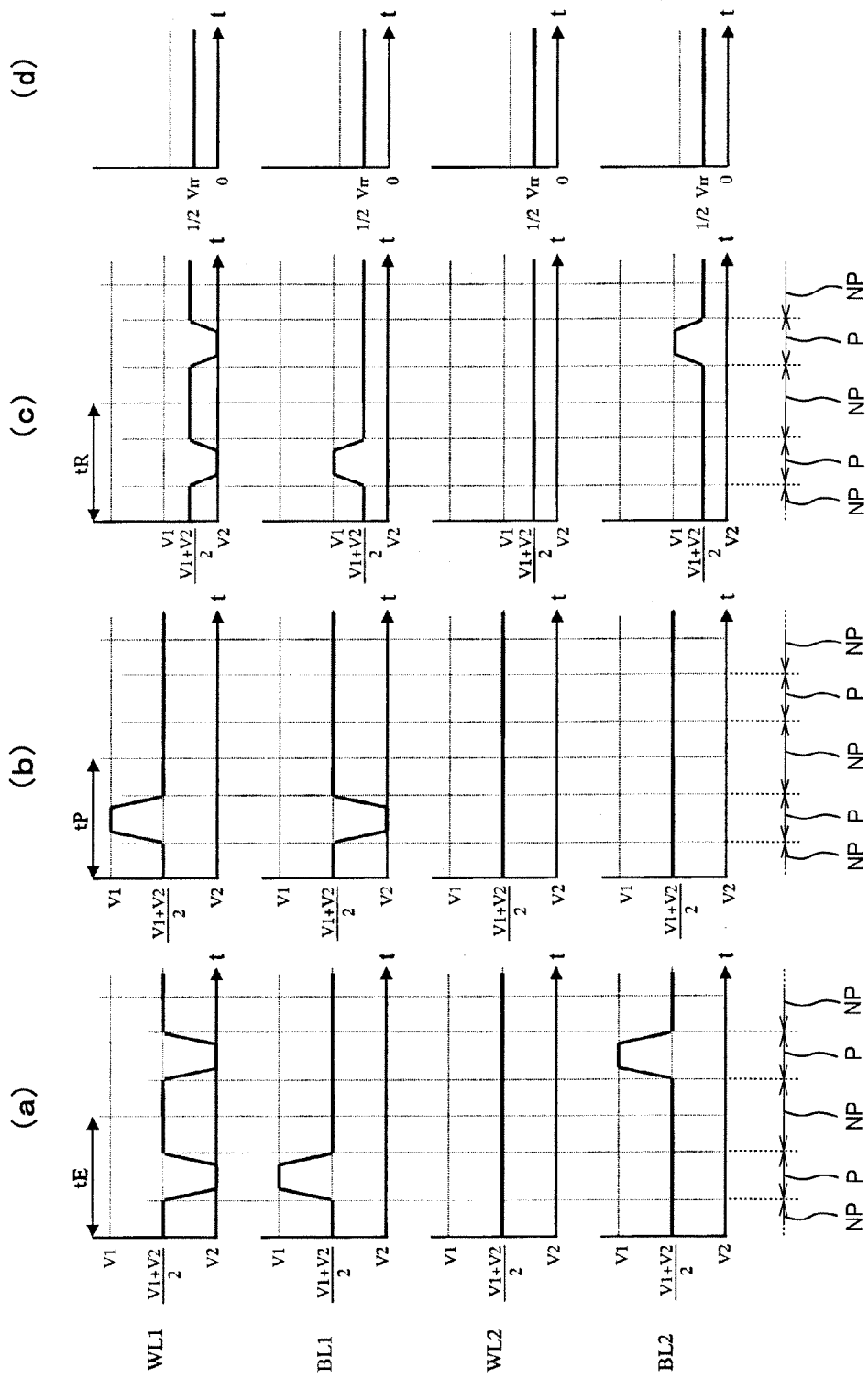

FIG. 22 is a timing chart showing an example of the voltages applied to the word lines and to the bit lines in a case where the intermediate voltage is applied to the non-selected bit line and the non-selected word line in the configuration of FIGS. 1, and 22(a) to 22(d) show operation modes, in which FIG. 22(a) shows an erase mode, FIG. 22(b) shows a program mode, FIG. 22(c) shows a read mode, and FIG. 22(d) shows a stand-by mode. In the erase mode, the positive voltage VP is sequentially applied to the memory cells to which data is to be written, while the positive voltage VP/2 is applied to the memory cells belonging to the first non-selected cell group and to the third non-selected cell group. In the program mode, the negative voltage −VP is sequentially applied to the memory cells to which "1" is to be written, while the negative voltage −VP/2 is applied to the memory cells belonging to the first non-selected cell group and to the third non-selected cell group. In the read mode, the positive voltage Vrr is sequentially applied to the memory cells from which data is to be read, while the positive voltage Vrr/2 is applied to the memory cells belonging to the first non-selected cell group and to the third non-selected cell group. In the case where the intermediate voltage is applied to the non-selected bit line and to the non-selected word line as described above, the voltage whose absolute value is the half of the absolute value of the voltage applied to the selected memory cell is applied to the memory cells belonging to the first non-selected cell group and to the third non-selected cell group.

Table 2 shows an example of the voltages applied to the bit lines and to the word lines and the voltages applied to the memory cells in the pulse period in FIG. 22(a). As can be seen from the Table 2, in the case where the intermediate voltage is applied to the non-selected bit line and to the non-selected word line, the voltage applied to the non-selected memory cells which are neither connected to the selected bit line nor to the selected word line is 0, while the voltage applied to the non-selected memory cells which are connected to one of the selected bit line and to the selected word line is VP/2.

TABLE 2

|  | | BL1<br>VM | BL2<br>VM | BL3<br>V1 | BL4<br>VM | BL5<br>VM |
|---|---|---|---|---|---|---|
| WL1 | VM | 0 | 0 | VP/2 | 0 | 0 |
| WL2 | V2 | VP/2 | VP/2 | VP | VP/2 | VP/2 |
| WL3 | VM | 0 | 0 | VP/2 | 0 | 0 |
| WL4 | VM | 0 | 0 | VP/2 | 0 | 0 |
| WL5 | VM | 0 | 0 | VP/2 | 0 | 0 |

In this Embodiment, the voltage which is closer to VW rather than VM is applied to the non-selected bit line, while the voltage which is closer to VB rather than VM is applied to the non-selected word line. As shown in FIG. 20, in this Embodiment, the voltage applied to the memory cells belonging to the first non-selected cell group and to the third non-selected cell group is lower (absolute value is smaller) than the positive voltage VP/2 in the erase mode, higher (absolute value is smaller) than the negative voltage −VP/2 in the program mode, and lower (absolute value is smaller) than the positive voltage Vrr/2 in the read mode.

Table 3 shows an example of the voltages applied to the bit lines and to the word lines and the voltages applied to the memory cells in the pulse period in FIG. 20(a). As can be seen from Table 3, in this Embodiment, the voltages applied to the respective non-selected memory cells are VP/3.

TABLE 3

|  | | BL1<br>V3 | BL2<br>V3 | BL3<br>V1 | BL4<br>V3 | BL5<br>V3 |
|---|---|---|---|---|---|---|
| WL1 | V4 | VP/3 | VP/3 | VP/3 | VP/3 | VP/3 |
| WL2 | V2 | VP/3 | VP/3 | VP | VP/3 | VP/3 |
| WL3 | V4 | VP/3 | VP/3 | VP/3 | VP/3 | VP/3 |

TABLE 3-continued

|  | | BL1<br>V3 | BL2<br>V3 | BL3<br>V1 | BL4<br>V3 | BL5<br>V3 |
|---|---|---|---|---|---|---|
| WL4 | V4 | VP/3 | VP/3 | VP/3 | VP/3 | VP/3 |
| WL5 | V4 | VP/3 | VP/3 | VP/3 | VP/3 | VP/3 |

In the case where the memory array is large in scale and in the case where the intermediate voltage is applied to the non-selected bit line and to the non-selected word line (FIG. 22 and Table 2), a problem that the currents flowing in the sub-paths are not negligible and reliability of the write operation and the read operation is reduced arises, for example. In the case where the voltages applied to the non-selected bit line and to the non-selected word line are controlled as illustrated in this Embodiment (FIG. 20 and Table 3), the currents flowing in the sub-paths can be made smaller and reliability of the write operation and the read operation can be improved as compared to the case where the intermediate voltages is applied to the non-selected bit line and to the non-selected word line.

Figure 23:
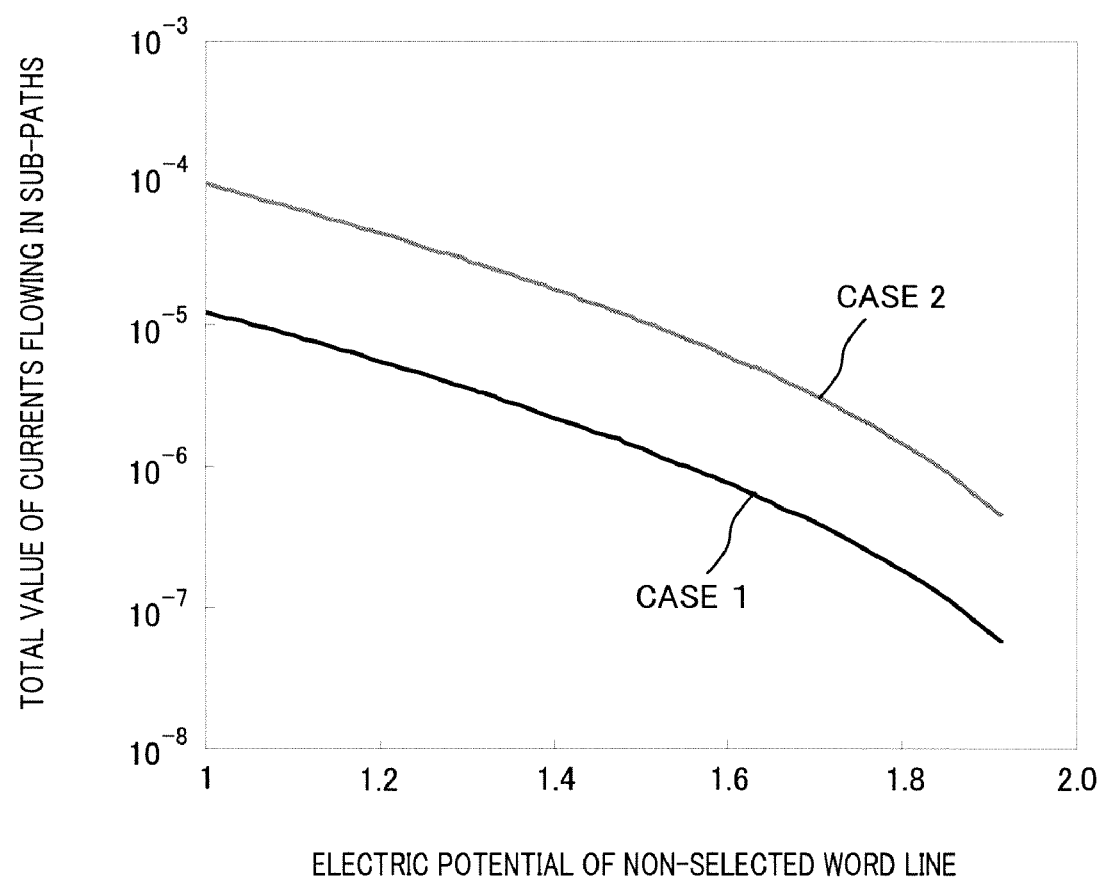
FIG. 23 is a view showing the relationship between an electric potential of the non-selected word line and a total value of currents flowing in sub-paths in a case where 2V and 0V are applied to a selected bit line and to a selected word line, respectively, in the resistance variable memory apparatus according to Embodiment 1 of the present invention.

FIG. 23 is a view showing the relationship between the electric potential of non-selected word line and a total value of currents flowing in the sub-paths in a case where 2V is and 0V are applied to the selected bit line and to the selected word line, respectively, in the resistance variable memory apparatus according to Embodiment 1 of the present invention. FIG. 23 shows a case (case 1) where 32 memory cells are connected to one bit line and a case (case 2) where 256 memory cells are connected to one bit line. As shown in FIG. 23, the current flowing in the sub-paths decreases as the electric potential of the non-selected word line is closer to 2V. In case 2 where the memory array is larger in scale, the current flowing in the sub-paths is larger than in case 1 where the memory array is smaller in scale. In this case, also, by making the voltage applied to the non-selected word line closer to the electric potential (2V) of the selected bit line, the current flowing in the sub-paths can be reduced, and reliability of the write operation and the read operation can be improved.

When V1=+2V and V2=0V in the example of FIG. 23, V3=+4/3V=+1.33V, V4=+2/3V=+0.66V and V3−V2=0.66V. So, V3−V2<VF (VF=+0.8V) is satisfied.

As the electric potential of the non-selected word line is made closer to 2V, the current flowing between the non-selected word line and the non-selected bit line increases, and the load imposed on the non-select electric power supply (third electric power supply 123 and fourth electric power supply 124) increases. That is, by reducing the load imposed on the select electric power supply at the sacrifice of increasing the load imposed on the non-selected electric power supply, reliability of the write operation and the read operation can be improved.

[Modification]

In the erase mode and the program mode, the voltages output from the first electric power supply 121, the second electric power supply 122, the third electric power supply 123 and the fourth electric power supply 124 may be different. It is sufficient that V4 is larger than (V1+V2)/2 and V3 is smaller than (V1+V2)/2. When the threshold (threshold voltage) of the current suppressing element 116 is VF, it is desired that V1−V4<VF or V3−V2<VF be satisfied. It is more desired that V1−V4<VF and V3−V2<VF be satisfied.

When the voltage of V4 is closer to the voltage of V1, the currents flowing in the sub-paths connecting the wire to which V1 is applied to the wire to which V4 is applied decreases. Likewise, when the voltage of V3 is closer to the voltage of V2, the currents flowing in the sub-paths connecting the wire to which V2 is applied to the wire to which V3 is applied decreases.

When determining a desired extent to which the amount of currents flowing in the sub-paths is reduced, the relationship between the current flowing in the selected cell and the array scale is important. Certain references need to be set for the element characteristic and array design, for example, the amount (or necessity) of the current flowing in the selected cell, or the degree with which the scale of the array may be increased. In this Embodiment, by making use of the threshold VF of the current suppressing element, it is possible to consider the design of the memory cell characteristic. By configuring setting to satisfy (V1−V4)<VF and (V3−V2)<VF, the amount of the currents flowing in the sub-paths can be minimized (substantially zero) because of the effect of the current suppressing elements. By making use of VF, an optimal array design (array scale and its configuration considering reading and writing) is easily attainable. The design of the memory cells, the scale and configuration of the array, etc, can be made accurate and efficient. As a result, a resistance variable memory apparatus having high-performance and small area is attainable.

In particular, since influence of the current (leak current) flowing in the sub-paths can be suppressed effectively, the write operation and the read operation can be carried out stably in a large-capacity memory. In addition, electric power consumption can be reduced.

The threshold of the current suppressing element 116 may be determined as follows. It is desired that the current flowing in the non-selected cell be much smaller than the current flowing in the selected cell. It is desired that a maximum application voltage of the current suppressing element in the case where the current of the non-selected cell is not larger than $1/10$ of the current of the selected cell, that is, is different in digit from the current of the selected cell, be set to VF. For example, in the case where the current of the non-selected cell is made not larger than $1/10$ of the current of the selected cell, VF may be defined as the voltage between terminals in the case where the current of the non-selected cell is equal to $1/10$ of the current of the selected cell. In the case where the current of the non-selected cell is made not larger than $1/100$ of the current of the selected cell, VF may be defined as the voltage between the terminals in the case where the current of the non-selected cell is $1/100$ of the current of the selected cell.

Table 4 shows another example of the conditions to be satisfied by the voltages output from the first electric power supply 121, the second electric power supply 122, the third electric power supply 123, and the fourth electric power supply 124 in the respective modes.

TABLE 4

|  | Erase mode | Program mode | Read mode | Stand-by mode |
| --- | --- | --- | --- | --- |
| First electric power supply | >Ve | >Vw | Vrr | ½ × Vrr |
| Second electric power supply | 0 | 0 | 0 | ½ × Vrr |
| Third electric power supply | ⅓ × Ve | ⅓ × Vw | ⅓ × Vrr | ½ × Vrr |
| Fourth electric power supply | ⅔ × Ve | ⅔ × Vw | ⅔ × Vrr | ½ × Vrr |

In the Table, Ve and Vw are values determined by the characteristic of the nonvolatile memory element 129. Vrr is a value which is much smaller than Vw and is controlled at a voltage with which writing of data (switching of resistance state) will not occur inadvertently. Since relative values (voltage difference) are important in the respective voltages, a specified voltage may be added to each voltage. For example, the second voltage V2 supplied by the second electric power supply is not necessarily zero. When V2 is not zero, it is sufficient that for example, V1 in the erase mode is larger than the value of (V2+Ve).

The memory arrays in the resistance variable memory apparatus of this Embodiment shown in FIGS. 1 and 2 may be stacked in a three-dimensional manner to form a resistance variable memory apparatus having a multi-layer structure.

Figure 24:
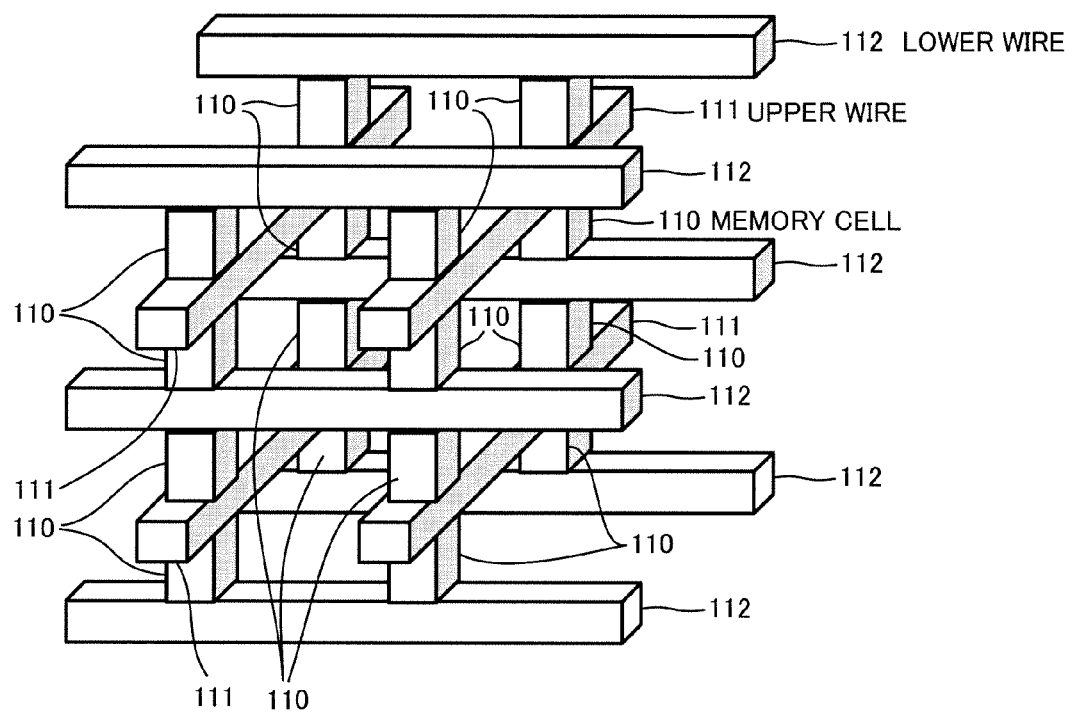
FIG. 24 is a perspective view showing a configuration of a memory array included in a resistance variable memory apparatus having a multi-layer structure, in modification of Embodiment 1 of the present invention.

FIG. 24 is a perspective view showing a configuration of the memory arrays, included in the resistance variable memory apparatus having the multi-layer structure, in modification of Embodiment 1 of the present invention. As shown in FIG. 24, the resistance variable memory apparatus includes a multi-layer memory array including plural layers of memory arrays which are stacked, the memory arrays each including plural lower wires 112 provided on a substrate (not shown) to extend in parallel with each other, plural upper wires 111 provided above the plural lower wires 112 so as to extend in parallel with each other within a plane parallel to the main surface of the substrate and so as to three-dimensionally cross the plural lower wires 112, and plural memory cells 110 arranged in matrix so as to respectively correspond to three-dimensional cross points between the plural lower wires 112 and the plural upper wires 110.

Whereas in the example shown in FIG. 24, five wire layers are provided and four layers of nonvolatile memory elements are arranged at the three-dimensional cross points of the wire layers, the number of layers may be increased or reduced as necessary.

By using the multi-layer memory array configured as described above, a super-large capacity nonvolatile memory is attainable.

In the case where the resistance variable layer is made of the material containing tantalum oxide, the resistance variable layer can be deposited at a low temperature (20 to 400 degrees centigrade). Therefore, the multi-layer memory array is easily attainable without substantially affecting the transistor and the wire material such as the silicide formed in a lower layer step, even when the layer is formed in the above described step.

When providing the multi-layer memory array, one of the third voltage source and the fourth voltage source is connected to the word lines and to the bit lines in the memory arrays including no selected memory cells.

Figure 25:
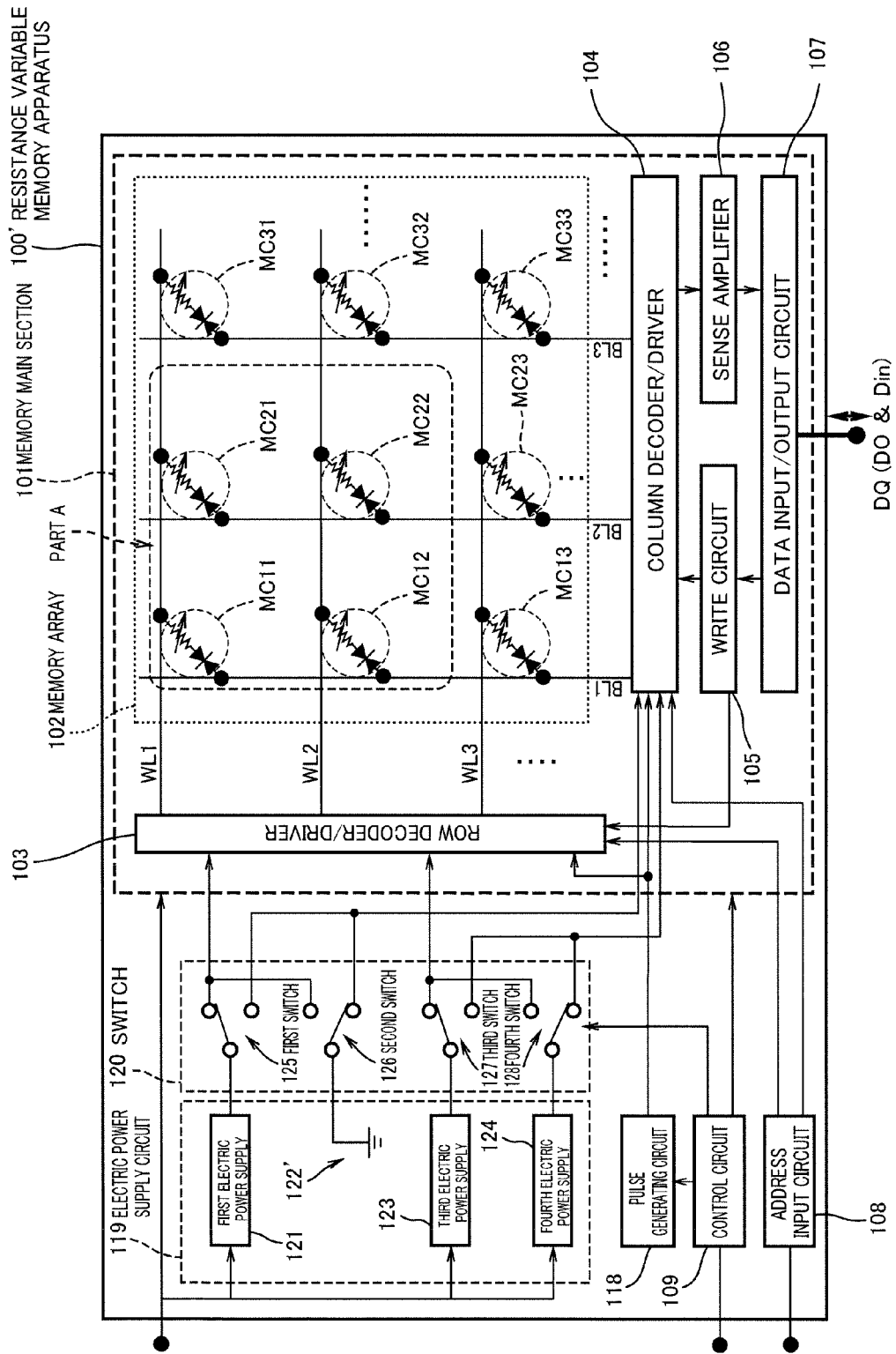
FIG. 25 is a block diagram showing a configuration of a resistance variable memory apparatus 100' according to modification of the present invention.

The second electric power supply 122 may be an electrically-grounded voltage source. FIG. 25 is a block diagram showing a configuration of a resistance variable memory apparatus 100' according to modification of the present invention. As shown in FIG. 25, the second electric power supply 122 is replaced by a voltage source 122' (voltage source outputting a voltage of 0V). In such a configuration, V2=0V, V1=VP, V3=(⅔)×VP=(⅔)×V1, V4=(1/3)×VP=(⅓)×V1. In this modification, the same advantage as that of the configuration of FIG. 1 can be achieved and a circuit configuration can be simplified.

Whereas in this Embodiment, the material of the resistance variable layer 114 is desirably Ta oxide, other material may be used.

The directions, signs, absolute values and the like of the voltage and current are merely exemplary and may be changed in various ways as a matter of course.

Embodiment 2

A resistance variable memory apparatus of Embodiment 2 is different from the resistance variable memory apparatus of Embodiment 1 in that the voltage applied to the bit lines and to the word lines in the non-pulse period is set to the intermediate voltage.

Figure 26:
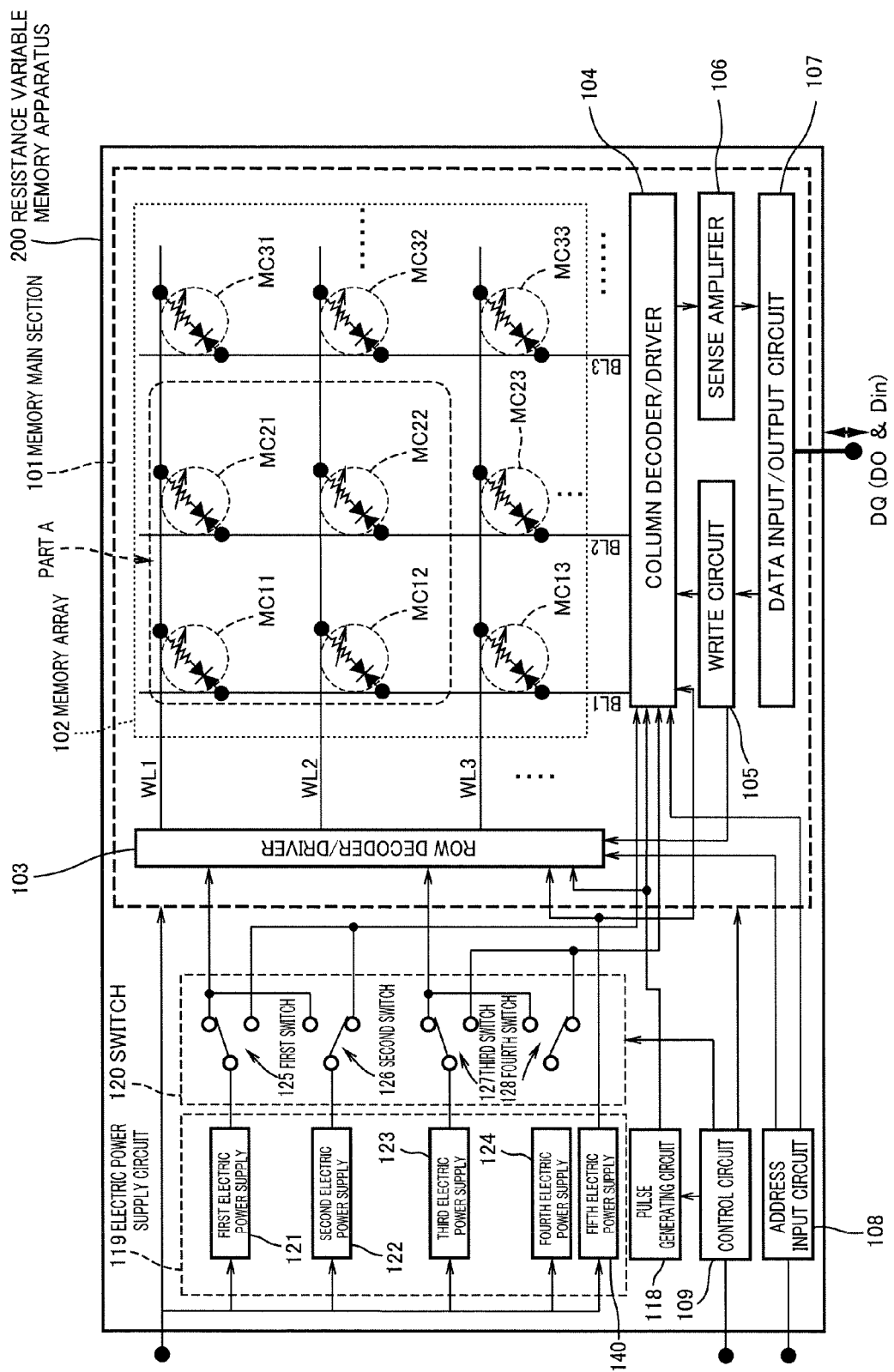
FIG. 26 is a block diagram showing an example of a schematic configuration of a resistance variable memory apparatus according to Embodiment 2 of the present invention.

FIG. 26 is a block diagram showing an example of a schematic configuration of a resistance variable memory apparatus according to Embodiment 2 of the present invention. As shown in FIG. 26, a resistance variable memory apparatus 200 of this embodiment includes a fifth electric power supply 140 for outputting a fifth voltage V5 which is incorporated into the electric power supply circuit 119 of the resistance variable memory apparatus 100 of Embodiment 1. In addition, in the resistance variable memory apparatus 200, the row decoder/driver 103 and the column decoder/driver 104 of Embodiment 1 are replaced by a row decoder/driver 141 and a column decoder/driver 142. Since the other components are identical to those of Embodiment 1, the common components in FIG. 1 and FIG. 26 are identified by the same reference numerals and names and will not be described repetitively.

The fifth electric power supply 140 supplies the fifth voltage V5 to the row decoder/driver 141 and to the column decoder driver 142. In this Embodiment, V5 is an intermediate voltage (V1+V2)/2. The configuration of the fifth electric power supply 140 will not be described in detail, because it is attained by properly controlling the voltage output from the reference voltage generator in the configuration similar to that of the first electric power supply 121 of Embodiment 1. As a setting method of the voltage, well-known methods such as a method using a voltage control circuit for mask-controlling the voltage or a voltage control circuit for fuse-controlling the voltage may be employed.

Figure 27:
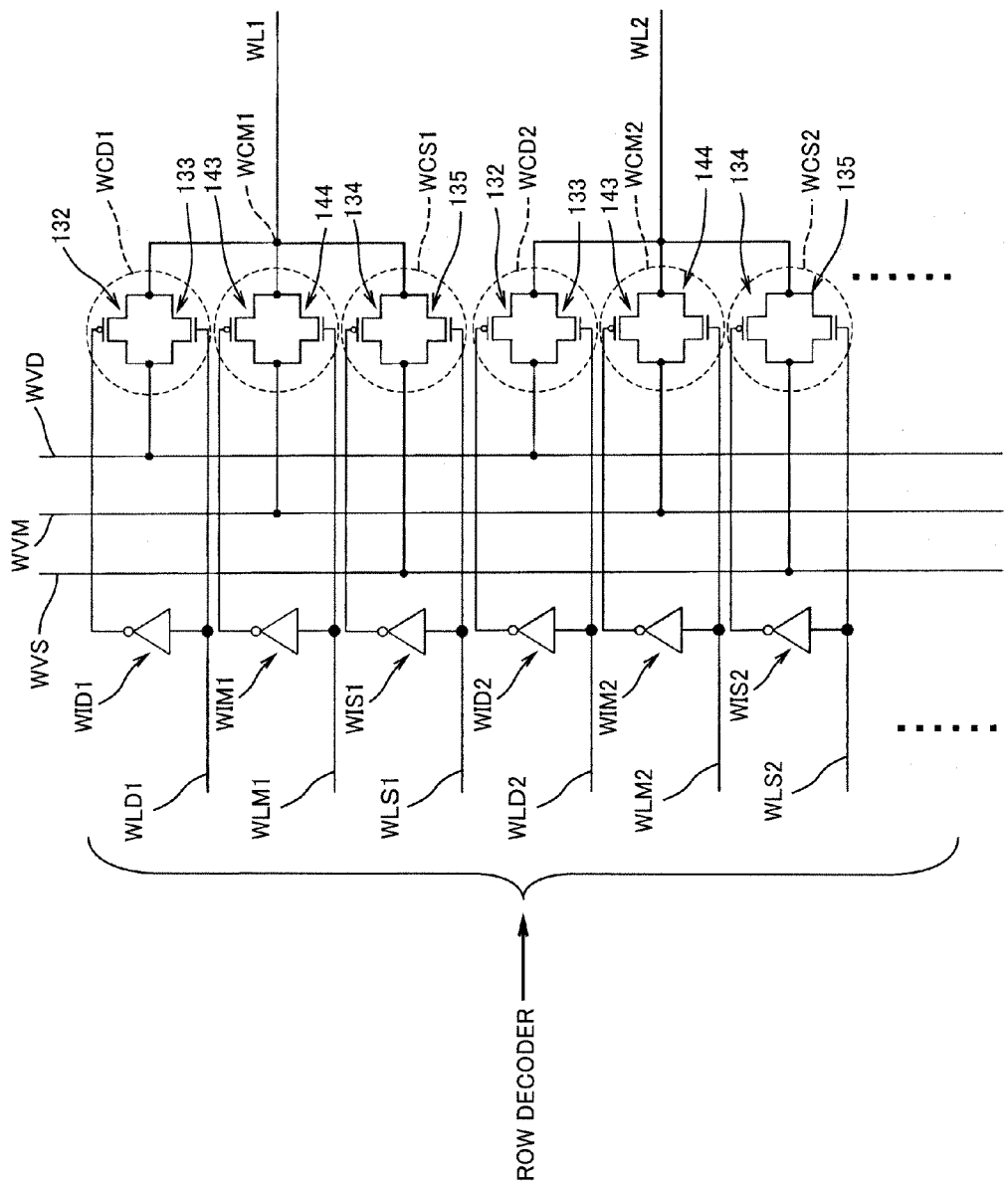
FIG. 27 is a circuit diagram showing an example of a circuit configuration of a driver portion of a row decoder/driver 141 according to Embodiment 2 of the present invention.

FIG. 27 is a circuit diagram showing an example of a circuit configuration of a driver portion of the row decoder/driver 141 according to Embodiment 2 of the present invention. As shown in FIG. 27, the driver portion of the row decoder/driver 141 has a configuration in which intermediate voltage signal input lines WLM1, WLM2, . . . , WLMm, to which an intermediate voltage select signal from the row decoder (not shown) is input, inverters WIM1, WIM2, . . . , WIMm connected to the intermediate voltage signal input lines WLM1, WLM2, . . . , WLMm, respectively, an intermediate voltage supply line WVM, and intermediate voltage select switch elements WCM1, WCM2, . . . , WCMm which input the voltage applied to the intermediate voltage supply line WVM to the word lines WL1, WL2, . . . , WLm, are incorporated into the driver portion of the row decoder/driver 103. Since the other components are identical to those of Embodiment 1, the common components in FIG. 27 and FIG. 17 are identified by the same reference numerals and names and will not be described repetitively.

The intermediate voltage (V5) is supplied from the electric power supply circuit and input to the intermediate voltage supply line WVM.

The intermediate voltage select switch elements WCM1, WCM2, . . . , WCMm are CMOS switch elements. Each of the intermediate voltage select switch elements WCM1, WCM2, . . . , WCMm includes a P-channel transistor 143 and a N-channel transistor 144. The gates of the P-channel transistors 143 are connected to the intermediate voltage signal input lines WLM1, WLM2, . . . , WLMm via the inverters WIM1, WIM2, . . . , WIMm, respectively. The gates of the N-channel transistors 144 are directly connected to the intermediate voltage signal input lines WLM1, WLM2, . . . , WLMm, respectively. One main terminals (drains or sources) of the P-channel transistors 143 and the N-channel transistors 144 are connected to the intermediate voltage supply line WVM, while the other main terminals (sources or drains) are connected to the word lines WL1, WL2, . . . , WLm, respectively.

The row decoder controls the electric potential supplied to the select signal input line WLS, the electric potential supplied to the non-select signal input line WLD, and the electric potential supplied to the intermediate voltage signal input line WLM based on a row address signal received from the address input circuit 108 and a pulse received from the pulse generating circuit 118, and in accordance with the control of the write circuit 105. To be specific, in the non-pulse period, the voltage supplied to the select signal input line WLS and the voltage supplied to the non-select signal input line WLD are placed at "L" and the voltage supplied to the intermediate voltage signal input line WLM is placed at "H." In the pulse period, the voltage supplied to the select signal input line WLS associated with the selected word line is placed at "H," the voltage supplied to the non-select signal input line WLD associated with the selected word line is maintained at "L," and the voltage supplied to the intermediate voltage signal input line WLM associated with the selected word line is placed at "L." The voltage supplied to the select signal input line WLS associated with the non-selected word line is maintained at "L," the voltage supplied to the non-select signal input line WLD associated with the non-selected word line is placed at "H" and the voltage supplied to the intermediate voltage signal input line WLM associated with the non-selected word line is placed at "L."

With such a configuration, in the non-pulse period, the intermediate voltage select switch WCM is turned ON and the select switch element WCS and the non-select switch element WCD are turned OFF. As a result, the fifth electric power supply 140 is connected to all of the word lines and applies the intermediate voltage thereto. In the pulse period, the select switch element WCS associated with the selected word line is tuned ON, and the associated non-selected switch element WCD and the associated intermediate voltage select switch WCM are turned OFF. As a result, the select voltage (V1 or V2) is applied to the selected word line via the select switch element WCS. In the pulse period, the select switch element WCS and the intermediate voltage select switch WCM associated with the non-selected word line are turned OFF and the associated non-select switch element WCD is turned ON. As a result, the non-select voltage (V3 or V4) is applied to the non-selected word line via the non-select switch element WCD.

Figure 28:
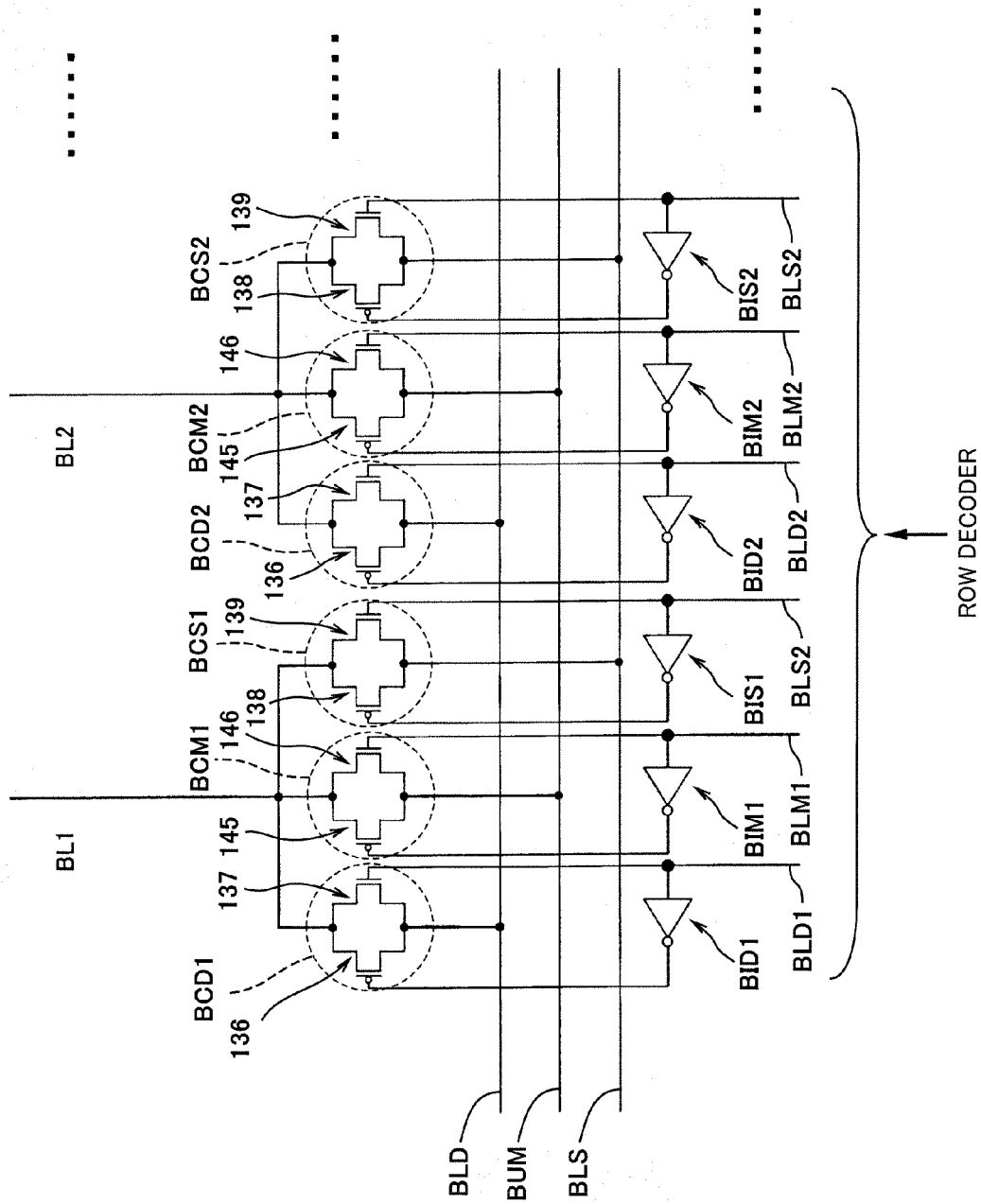
FIG. 28 is a circuit diagram showing an example of a circuit configuration of a driver portion of a column decoder/driver 142 according to Embodiment 2 of the present invention.

FIG. 28 is a circuit diagram showing an example of a circuit configuration of a driver portion of the column decoder/driver 142 according to Embodiment 2 of the present invention. As shown in FIG. 28, the driver portion of the column decoder/driver 142 has a configuration in which intermediate voltage signal input lines BLM1, BLM2, . . . , BLMm to which an intermediate voltage select signal from the column decoder (not shown) is input, inverters BIM1, BIM2, . . . , BIMm connected to the intermediate voltage signal input lines BLM1, BLM2, . . . , BLMm, respectively, an intermediate voltage supply line BVM, and intermediate voltage select switch elements BCM1, BCM2, . . . , BCMm which input the voltage applied to the intermediate voltage supply line BVM to the bit lines BL1, BL2, . . . , BLm, are incorporated into the driver portion of the column decoder/driver 104. Since the other components are identical to those of Embodiment 1, the common components in FIG. 28 and FIG. 18 are identified by the same reference numerals and names and will not be described repetitively.

The intermediate voltage (V5) is supplied from the electric power supply circuit and input to the intermediate voltage supply line BVM.

The intermediate voltage select switch elements BCM1, BCM2, . . . , BCMm are CMOS switch elements. Each of the intermediate voltage select switch elements BCM1, BCM2, . . . , BCMm includes a P-channel transistor 145 and a N-channel transistor 146. The gates of the P-channel transistors 145 are connected to the intermediate voltage signal input lines BLM1, BLM2, . . . , BLMm via the inverters BIM1, BIM2, . . . , BIMm, respectively. The gates of the N-channel transistors 146 are directly connected to the intermediate voltage signal input lines BLM1, BLM2, . . . , BLMm, respectively. One main terminals (drains or sources) of the P-channel transistors 145 and the N-channel transistors 146 are connected to the intermediate voltage supply line BVM, and the other main terminals (sources or drains) are connected to the bit lines BL1, BL2, . . . , BLm, respectively.

The column decoder controls the electric potential supplied to the select signal input line BLS, the electric potential supplied to the non-select signal input line BLD, and the electric potential supplied to the intermediate voltage signal input line BLM based on a column address signal received from the address input circuit 108 and a pulse received from the pulse generating circuit 118, and in accordance with the control of the write circuit 105. To be specific, in the non-pulse period, the voltage supplied to the select signal input line BLS and the voltage supplied to the non-select signal input line BLD are placed at "L," and the voltage supplied to the intermediate voltage signal input line BLM is placed at "H." In the pulse period, the voltage supplied to the select signal input line BLS associated with the selected bit line is placed at "H," the voltage supplied to the non-select signal input line BLD associated with the selected bit line is maintained at "L," and the voltage supplied to the intermediate voltage signal input line BLM associated with the selected bit line is placed at "L." The voltage supplied to the select signal input line BLS associated with the non-selected bit line is maintained at "L," the voltage supplied to the non-select signal input line BLD associated with the non-selected bit line is placed at "H" and the voltage supplied to the intermediate voltage signal input line BLM associated with the non-selected bit line is placed at "L."

With such a configuration, in the non-pulse period, the intermediate voltage select switch BCM is turned ON and the select switch element BCS and the non-select switch element BCD are turned OFF. As a result, the fifth electric power supply 150 is connected to all of the bit lines and applies the intermediate voltage thereto. In the pulse period, the select switch element BCS associated with the selected bit line is tuned ON, and the associated non-select switch element BCD and the associated intermediate voltage select switch WCM are turned OFF. As a result, the select voltage (V1 or V2) is applied to the selected bit line via the select switch element BCS. In the pulse period, the select switch element BCS and the intermediate voltage select switch element BCM associated with the non-selected bit line are turned OFF and the associated non-select switch element BCD is turned ON. As a result, the non-select voltage (V3 or V4) is applied to the non-selected bit line via the non-select switch element BCD.

When V1 is applied to the selected word line in the pulse period (erase mode and read mode), V2 is applied to the selected bit line in the pulse period, the intermediate voltage is applied to all of the word lines in the non-pulse period and to all of the bit lines in the non-pulse period, V3 is applied to the non-selected word lines in the pulse period and V4 is applied to the non-selected bit line in the pulse period.

When V2 is applied to the selected word line in the pulse period (program mode), V1 is applied to the selected bit line in the pulse period, the intermediate voltage is applied to all of the word lines in the non-pulse period and to all of the bit lines in the non-pulse period, V4 is applied to the non-selected word lines in the pulse period and V3 is applied to the non-selected bit lines in the pulse period.

Figure 29:
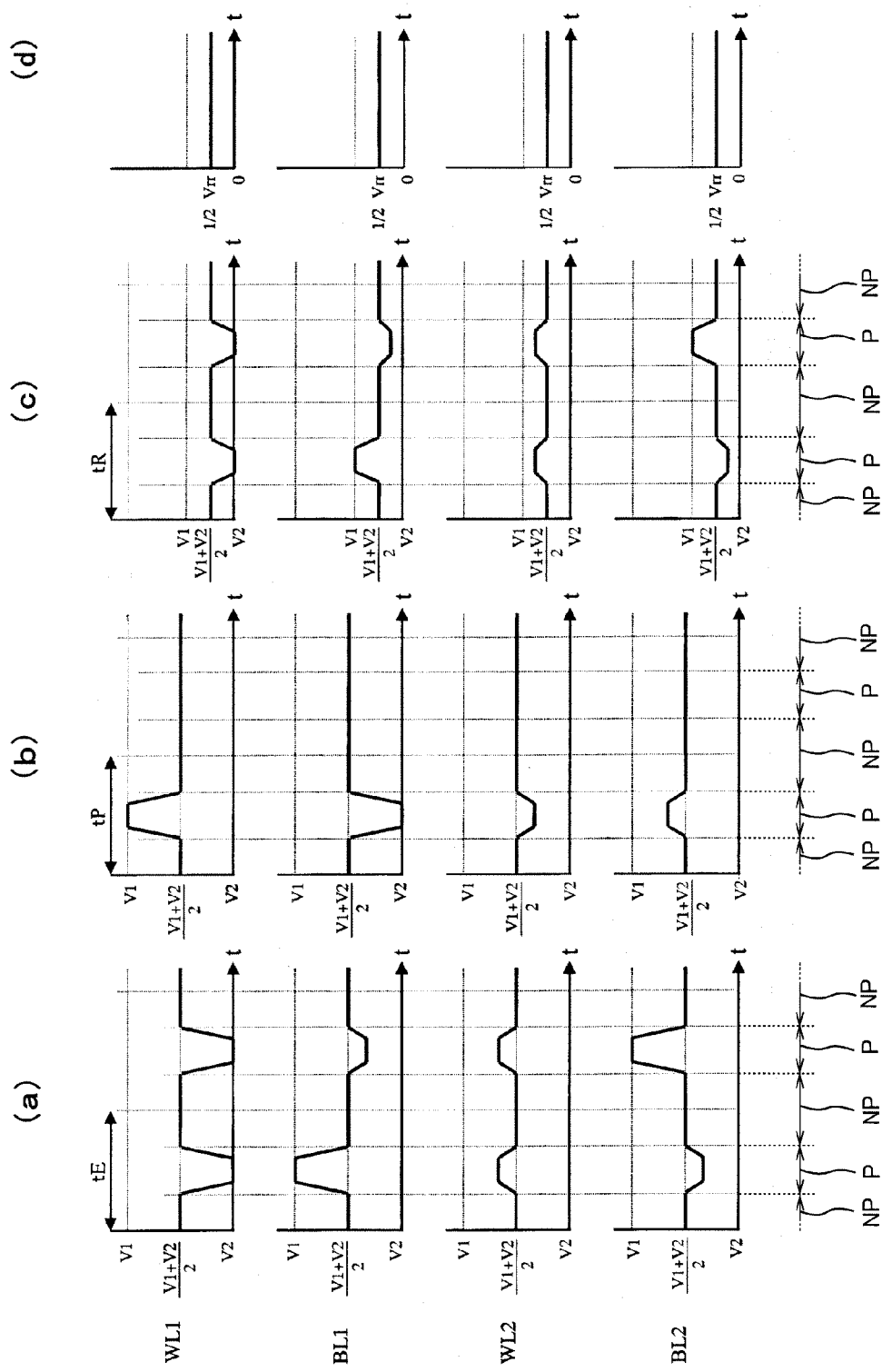

FIG. 29 is a timing chart showing an example of the voltages applied to the word lines and to the bit lines according to Embodiment 2 of the present invention, and 29(*a*) to 29(*d*) show operation modes in which FIG. 29(*a*) shows an erase mode, FIG. 29(*b*) shows a program mode, FIG. 29(*c*) shows a read mode, and FIG. 29(*d*) shows a stand-by mode.

As shown in FIG. 29, in the resistance variable memory apparatus 200 of this Embodiment, in the erase mode, the program mode, and the read mode, in the pulse period, the voltage of ±VP or Vrr is applied to the selected memory cell, while the voltage whose absolute value is smaller than that of VP/2 or Vrr/2 is applied to the non-selected memory cell, and reliability of the write operation and the read operation can be improved, as in Embodiment 1. In addition, in this Embodiment, in the non-pulse period, the electric potentials of all of the bit lines and all of the word lines are maintained at the intermediate voltages. As a result, the current flowing in the memory cells in the non-pulse period can be suppressed, and electric power consumption can be reduced.

Embodiment 3

A resistance variable memory apparatus of Embodiment 3 is different from the resistance variable memory apparatus of Embodiment 1 in that the non-select switch elements connected to the non-selected bit line and to the non-selected word line are subjected to high-impedance control in the pulse period. Since the configuration of the apparatus is similar to those shown in FIGS. 1 to 19, the common components are identified by the same reference numerals and names and will not be described repetitively.

The row decoder controls the electric potential supplied to the select signal input line WLS and the electric potential supplied to the non-select signal input line WLD, based on a row address signal received from the address input circuit 108 and a pulse received from the pulse generating circuit 118, and in accordance with the control of the write circuit 105. To be specific, in the non-pulse period, the voltage supplied to the select signal input line WLS is placed at "L," and the voltage supplied to the non-select signal input line WLD is placed at "H." In the pulse period, the voltage supplied to the select signal input line WLS associated with the selected word line is placed at "H" and the voltage supplied to the non-select signal input line WLD associated with the selected word line is placed at "L." The voltage supplied to the select signal input line WLS associated with the non-selected word line is maintained at "L," and the voltage supplied to the non-select signal input line WLD associated with the non-selected word line is controlled at a value with which the non-select switch element WCD is placed in a high-impedance state (voltage lower than "H" for placing the switch element WCD into a fully conductive state).

With such a configuration, in the non-pulse period, the non-select switch element WCD is turned ON and the select switch element WCS is turned OFF. As a result, the non-select voltage (V3 or V4) is applied to all of the word lines. In the pulse period, the select switch element WCS associated with the selected word line is turned ON and the associated non-select switch element WCD is turned OFF. As a result, the select voltage (V1 or V2) is applied to the selected word line via the select switch element WCS. In the pulse period, the select switch element WCS associated with the non-selected word line is maintained in an OFF state, while the associated non-select switch element WCD is placed in a high-impedance state. As a result, the non-select voltage (V3 or V4) is applied to the non-selected word line via the non-select switch element WCD, but a current does not substantially flow therein.

The column decoder controls the electric potential supplied to the select signal input line BLS and the electric potential supplied to the non-select signal input line BLD based on a column address signal received from the address input circuit 108, and a pulse received from the pulse generating circuit 118, and in accordance with the control of the write circuit 105. To be specific, in the non-pulse period, the voltage supplied to the select signal input line BLS is placed at "L," and the voltage supplied to the non-select signal input line BLD is placed at "H." In the pulse period, the voltage supplied to the select signal input line BLS associated with the selected bit line is placed at "H" and the voltage supplied to the non-select signal input line BLD associated with the selected bit line is maintained at "L." The voltage supplied to the select signal input line BLS associated with the non-selected bit line is maintained at "L," and the voltage supplied to the non-select signal input line BLD associated with the non-selected bit line is controlled at a value with which the non-select switch element WCD is placed in a high-impedance state (voltage lower than "H" for placing the switch element WCD into a fully conductive state).

With such a configuration, in the non-pulse period, the non-select switch element BCD is turned ON and the select switch element BCS is turned OFF. As a result, the non-select voltage (V3 or V4) is applied to all of the bit lines. In the pulse period, the select switch element BCS associated with the selected bit line is turned ON and the associated non-select switch element BCD is turned OFF. As a result, the select voltage (V1 or V2) is applied to the selected bit line via the associated select switch element BCS. In the pulse period, the select switch element BCS associated with the non-selected bit line is maintained in an OFF-state, while the associated non-select switch element BCD is placed in a high-impedance state. As a result, the non-select voltage (V3 or V4) is applied to the non-selected bit line via the non-select switch element BCD, but a current does not substantially flow therein.

When V1 is applied to the selected word line in the pulse period (erase mode and read mode), V2 is applied to the selected bit line in the pulse period, V3 is applied to all of the word lines in the non-pulse period and to the non-selected word lines in the pulse period, and V4 is applied to all of the bit lines in the non-pulse period and to the non-selected bit line in the pulse period.

When V2 is applied to the selected word line in the pulse period (program mode), V1 is applied to the selected bit line in the pulse period, V4 is applied to all of the word lines in the non-pulse period and to the non-selected word lines in the pulse period, and V3 is applied to all of the bit lines in the non-pulse period and to the non-selected bit line in the pulse period.

Figure 30:
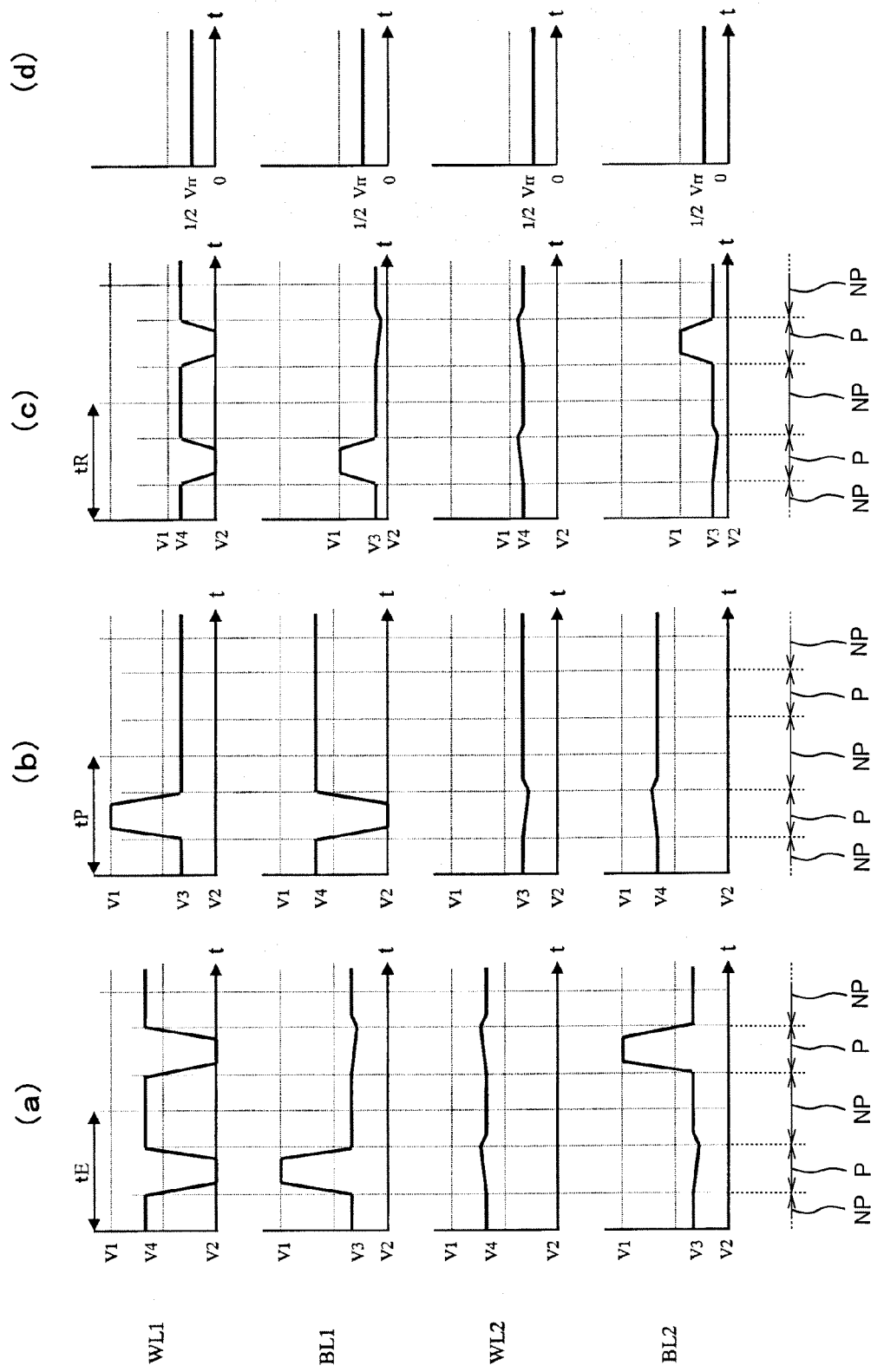

FIG. 30 is a timing chart showing an example of the voltages applied to the word lines and to the bit lines according to Embodiment 3 of the present invention, and 30(a) to 30(d) show operation modes in which FIG. 30(a) shows an erase mode, FIG. 30(b) shows a program mode, FIG. 30(c) shows a read mode, and FIG. 30(d) shows a stand-by mode.

As shown in FIG. 30, in the resistance variable memory apparatus of this Embodiment, in the erase mode, the program mode, and the read mode, in the pulse period, the voltage of ±VP or Vrr is applied to the selected memory cell, while the voltage whose absolute value is smaller than that of VP/2 or Vrr/2 is applied to the non-selected memory cell, and reliability of the write operation and the read operation can be improved, as in Embodiment 1. In this Embodiment, furthermore, in the pulse period, the select switch elements associated with the non-selected bit line and the non-selected word line are turned OFF and the non-select switch elements are subjected to the high-impedance control. As a result, the currents flowing in the non-selected memory cells in the pulse period can be suppressed, and electric power consumption is reduced.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable memory apparatus of the present invention is useful as a resistance variable memory apparatus which is capable of improving reliability of a write operation and a read operation.

The invention claimed is:

1. A resistance variable memory apparatus including:
a memory array including plural first wires provided to extend in parallel with each other within a first plane, plural second wires provided to extend in parallel with each other within a second plane parallel to the first plane and to three-dimensionally cross the plural first wires, and nonvolatile memory elements which are provided to respectively correspond to three-dimensional cross points between the plural first wires and the plural second wires and have resistance variable layers, a resistance value of each of the resistance variable layers being switchable reversibly in response to an electric signal applied between an associated first wire and an associated second wire, and current suppressing elements which are provided to respectively correspond to the three-dimensional cross points and are connected in series with the resistance variable layers, respectively;
a first voltage source for applying a first voltage;
a second voltage source for applying a second voltage;
a third voltage source for applying a third voltage;
a fourth voltage source for applying a fourth voltage;
a switch;
a first decoder/driver;
a second decoder/driver;
an address input circuit; and
a control circuit; wherein
each of the resistance variable layers has a characteristic in which the resistance variable layer switches from a high-resistance state to a low-resistance state in response to a low-resistance state attaining voltage which is a predetermined voltage applied to both ends thereof, when the resistance variable layer is in the high-resistance state, while the resistance variable layer switches from the low-resistance state to the high-resistance state in response to a high-resistance state attaining voltage which is a predetermined voltage applied to both ends thereof, the high-resistance state attaining voltage having a polarity different from a polarity of the low-resistance state attaining voltage, when the resistance variable layer is in the low-resistance state;

each of the current suppressing elements has a non-linear and bidirectional current characteristic in which a resistance value thereof rapidly decreases when an absolute value of the voltage applied to both ends thereof exceeds a threshold VF and a current flows therein bidirectionally according to a polarity of the applied voltage;

the switch is configured to output the voltage of one of the first and second voltage sources as a select voltage to the first decoder/driver and output the voltage of the other of the first and second voltage sources as a select voltage to the second decoder/driver, under control by the control circuit, and configured to output the voltage of one of the third and fourth voltage sources as a non-select voltage to the first decoder/driver and output the voltage of the other of the third and fourth voltage sources as a non-select voltage to the second decoder/driver, under control of the control circuit;

the address input circuit is configured to output a first address signal to the first decoder/driver and output a second address signal to the second decoder/driver, based on an address signal externally input;

the first decoder/driver is configured to output the select voltage input from the switch to a selected first wire and output the non-select voltage input from the switch to a non-selected (unselected) first wire, based on the first address signal input from the address input circuit;

the second decoder/driver is configured to output the select voltage input from the switch to a selected second wire and output the non-select voltage input from the switch to a non-selected (unselected) second wire, based on the second address signal input from the address input circuit;

the control circuit is configured to control the switch to switch the select voltage and the non-select voltage output to the first decoder/driver and to the second decoder/driver, based on a signal externally input; and when the first to fourth voltages are expressed as V1 to V4 and V5=(V1+V2)/2 is a fifth voltage, $V2 \leqq V3 < V5 < V4 \leqq V1$ is satisfied and $(V1-V4)<VF$ or $(V3-V2)<VF$ is satisfied.

2. The resistance variable memory apparatus according to claim 1, wherein the first decoder/driver includes:

plural first select switch elements each including a first P-channel MOS transistor and a first N-channel MOS transistor which are connected in parallel;

plural first non-select switch elements each including a second P-channel MOS transistor and a second N-channel MOS transistor which are connected in parallel;

a first select voltage supply line connected to each of the plural first wires via associated one of the first select switch elements;

a first non-select voltage supply line connected to each of the plural first wires via associated one of the first non-select switch elements;

plural first select signal input lines connected via inverters to control terminals of first P-channel MOS transistors of associated ones of the first select switch elements, respectively, and connected to control terminals of first N-channel MOS transistors of associated ones of the first select switch elements, respectively, each of the first select signal input lines being placed at "H" in a case where the first address signal output from the address input circuit is a signal for selecting the first wire connected with the each first select signal input line and being placed at "L" in a case where the first address signal output from the address input circuit is a signal for non-selecting the first wire connected with the each first select signal input line;

plural first non-select signal input lines connected via inverters to control terminals of second P-channel MOS transistors of associated ones of the first non-select switch elements, respectively, and connected to control terminals of second N-channel MOS transistors of associated ones of the first non-select switch elements, respectively, each of the first non-select signal input lines being placed at "H" in a case where the first address signal output from the address input circuit is a signal for non-selecting the first wire connected with the each first non-select signal input line and being placed at "L" in a case where the first address signal output from the address input circuit is a signal for selecting the first wire connected with the each first non-select signal input line;

wherein the second decoder/driver includes:

plural second select switch elements each including a third P-channel MOS transistor and a third N-channel MOS transistor which are connected in parallel; and plural second non-select switch elements each including a fourth P-channel MOS transistor and a fourth N-channel MOS transistor which are connected in parallel;

a second select voltage supply line connected to each of the plural second wires via associated one of the second select switch elements;

a second non-select voltage supply line connected to each of the plural second wires via associated one of the second non-select switch elements;

plural second select signal input lines connected via inverters to control terminals of third P-channel MOS transistors of associated ones of the second select switch elements, respectively, and connected to control terminals of third N-channel MOS transistors of associated ones of the second select switch elements, respectively, each of the second select signal input lines being placed at "H" in a case where the second address signal output from the address input circuit is a signal for selecting the second wire connected with the each second select signal input line and being placed at "L" in a case where the second address signal output from the address input circuit is a signal for non-selecting the second wire connected with the each second select signal input line;

plural second non-select signal input lines connected via inverters to control terminals of fourth P-channel MOS transistors of associated ones of the second non-select switch elements, respectively, and connected to control terminals of fourth N-channel MOS transistors of associated ones of the second non-select switch elements, respectively, each of the second non-select signal input lines being placed at "H" in a case where the second address signal output from the address input circuit is a signal for non-selecting the second wire connected with the each second non-select signal input line and being placed at "L" in a case where the second address signal output from the address input circuit is a signal for selecting the second wire connected with the each second non-select signal input line; and wherein the switch is configured to output the voltage of one of the first and second voltage sources as the select voltage to the first select voltage supply line and output the voltage of the other of the first and second voltage sources as the select voltage to the second voltage supply line, under control by the control circuit and configured to output the voltage of one of the third and fourth voltage sources as the non-select voltage to the first non-select voltage supply line and output the voltage of the other of the third and fourth voltage sources as the non-select voltage to the second non-select voltage supply line.

3. The resistance variable memory apparatus according to claim 1,
wherein each of the first to fourth voltage sources includes a reference voltage generator and an operational amplifier;
the reference voltage generator is connected to one of input terminals of the operational amplifier; and
an output terminal of the operational amplifier is connected to the other input terminal of the operational amplifier.

4. The resistance variable memory apparatus according to claim 2,
wherein each of the first to fourth voltage sources includes a reference voltage generator and an operational amplifier;
the reference voltage generator is connected to one of input terminals of the operational amplifier; and
an output terminal of the operational amplifier is connected to the other input terminal of the operational amplifier.

* * * * *